United States Patent
Iwai et al.

(10) Patent No.: US 12,513,899 B2
(45) Date of Patent: Dec. 30, 2025

(54) THREE-DIMENSIONAL MEMORY DEVICE CONTAINING SOURCE RAILS AND METHOD OF MAKING THE SAME

(71) Applicant: SANDISK TECHNOLOGIES LLC, Addison, TX (US)

(72) Inventors: Takaaki Iwai, Yokkaichi (JP); Tomohiro Kubo, Yokkaichi (JP); Kento Iseri, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 798 days.

(21) Appl. No.: 17/715,549

(22) Filed: Apr. 7, 2022

(65) Prior Publication Data

US 2023/0328976 A1  Oct. 12, 2023

(51) Int. Cl.
*H10B 41/35* (2023.01)
*H01L 23/522* (2006.01)
(Continued)

(52) U.S. Cl.
CPC ......... *H10B 41/35* (2023.02); *H01L 23/5226* (2013.01); *H01L 23/5283* (2013.01); *H10B 41/10* (2023.02); *H10B 41/27* (2023.02); *H10B 43/10* (2023.02); *H10B 43/27* (2023.02); *H10B 43/35* (2023.02)

(58) Field of Classification Search
None
See application file for complete search history.

(56) References Cited

U.S. PATENT DOCUMENTS

| 9,799,670 B2 | 10/2017 | Nishikawa et al. |
| 9,831,266 B2 | 11/2017 | Kai et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Jessica S Manno
*Assistant Examiner* — Christopher A. Schodde
(74) *Attorney, Agent, or Firm* — THE MARBURY LAW GROUP PLLC

(57) ABSTRACT

A three-dimensional memory device includes a source-level structure located over a substrate, an alternating stack of insulating layers and electrically conductive layers located over the source-level structure, memory openings vertically extending through the alternating stack, and memory opening fill structures located in the memory openings. The source-level structure includes a lower source-level semiconductor layer including elongated grooves in an upper portion thereof, doped semiconductor source rails located within the elongated grooves, and an upper source-level semiconductor layer. The doped semiconductor source rails are laterally spaced apart from each other along a first horizontal direction and laterally extend along a second horizontal direction. Each of the memory opening fill structures includes a respective vertical stack of memory elements and a respective vertical semiconductor channel that contacts a respective one of the doped semiconductor source rails.

11 Claims, 56 Drawing Sheets

(51) Int. Cl.
*H01L 23/528* (2006.01)
*H10B 41/10* (2023.01)
*H10B 41/27* (2023.01)
*H10B 43/10* (2023.01)
*H10B 43/27* (2023.01)
*H10B 43/35* (2023.01)

(56) References Cited

U.S. PATENT DOCUMENTS

| | | |
|---|---|---|
| 9,876,031 B1 | 1/2018 | Shimizu et al. |
| 9,917,100 B2 | 3/2018 | Zhang et al. |
| 9,985,098 B2 | 5/2018 | Matsumoto et al. |
| 10,008,570 B2 | 6/2018 | Yu et al. |
| 10,020,363 B2 | 7/2018 | Ogawa et al. |
| 10,115,681 B1 | 10/2018 | Ariyoshi |
| 10,199,359 B1 | 2/2019 | Sakakibara et al. |
| 10,224,340 B2 | 3/2019 | Hada et al. |
| 10,224,373 B2 | 3/2019 | Sel et al. |
| 10,290,645 B2 | 5/2019 | Nakatsuji et al. |
| 10,290,650 B1 | 5/2019 | Iwai |
| 10,347,654 B1 | 7/2019 | Iwai et al. |
| 10,354,956 B1 | 7/2019 | Yu et al. |
| 10,381,373 B2 | 8/2019 | Okizumi et al. |
| 10,438,964 B2 | 10/2019 | Makala et al. |
| 10,559,582 B2 | 2/2020 | Nishikawa et al. |
| 10,615,172 B2 | 4/2020 | Nagata et al. |
| 10,629,613 B1 | 4/2020 | Shimizu et al. |
| 10,720,445 B1 | 7/2020 | Shimizu et al. |
| 10,748,925 B1 | 8/2020 | Tsutsumi et al. |
| 10,797,070 B2 | 10/2020 | Mushiga et al. |
| 10,804,291 B1 | 10/2020 | Rajashekhar et al. |
| 10,854,627 B1 * | 12/2020 | Moriyama ............ H10D 30/63 |
| 10,861,869 B2 | 12/2020 | Nishikawa et al. |
| 10,868,025 B2 | 12/2020 | Zhou et al. |
| 10,903,222 B2 | 1/2021 | Sakakibara et al. |
| 10,916,556 B1 | 2/2021 | Sakakibara et al. |
| 10,923,496 B2 | 2/2021 | Mushiga et al. |
| 10,923,498 B2 | 2/2021 | Otsu et al. |
| 10,957,648 B2 | 3/2021 | Hsu et al. |
| 10,964,715 B2 | 3/2021 | Kakazu et al. |
| 11,121,153 B1 | 9/2021 | Obu et al. |
| 11,127,759 B2 | 9/2021 | Obu et al. |
| 11,195,781 B2 | 12/2021 | Okina et al. |
| 11,201,107 B2 | 12/2021 | Okina et al. |
| 11,239,253 B2 | 2/2022 | Rajashekhar et al. |
| 11,244,953 B2 | 2/2022 | Kanakamedala et al. |
| 2015/0206898 A1 * | 7/2015 | Chen ...................... H10B 43/27 257/329 |
| 2017/0148810 A1 * | 5/2017 | Kai ........................ H10B 43/35 |
| 2019/0043830 A1 * | 2/2019 | Sakakibara ......... H01L 25/0657 |
| 2019/0371807 A1 * | 12/2019 | Nishikawa ............. H10B 41/10 |
| 2020/0219895 A1 * | 7/2020 | Mushiga ............... H10D 84/016 |
| 2020/0335487 A1 | 10/2020 | Rajashekhar et al. |
| 2020/0357815 A1 | 11/2020 | Iwai et al. |
| 2020/0388626 A1 | 12/2020 | Baraskar et al. |
| 2020/0388688 A1 | 12/2020 | Baraskar et al. |
| 2021/0375910 A1 | 12/2021 | Baraskar et al. |
| 2021/0408025 A1 | 12/2021 | Hinoue |
| 2021/0408031 A1 | 12/2021 | Sharangpani et al. |
| 2021/0408033 A1 | 12/2021 | Baraskar et al. |
| 2021/0408035 A1 | 12/2021 | Sato et al. |
| 2022/0045090 A1 | 2/2022 | Cui et al. |
| 2022/0045091 A1 | 2/2022 | Cui et al. |
| 2022/0045092 A1 | 2/2022 | Cui et al. |

OTHER PUBLICATIONS

U.S. Appl. No. 17/232,209, filed Apr. 16, 2021, Sandisk Technologies LLC.
U.S. Appl. No. 17/355,955, filed Jun. 23, 2021, Sandisk Technologies LLC.
U.S. Appl. No. 17/462,446, filed Aug. 31, 2021, Sandisk Technologies LLC.
U.S. Appl. No. 17/577,533, filed Jan. 18, 2022, Sandisk Technologies LLC.
U.S. Appl. No. 17/583,456, filed Jan. 25, 2022, Sandisk Technologies LLC.
U.S. Appl. No. 17/655,272, filed Mar. 17, 2022, Sandisk Technologies LLC.

* cited by examiner

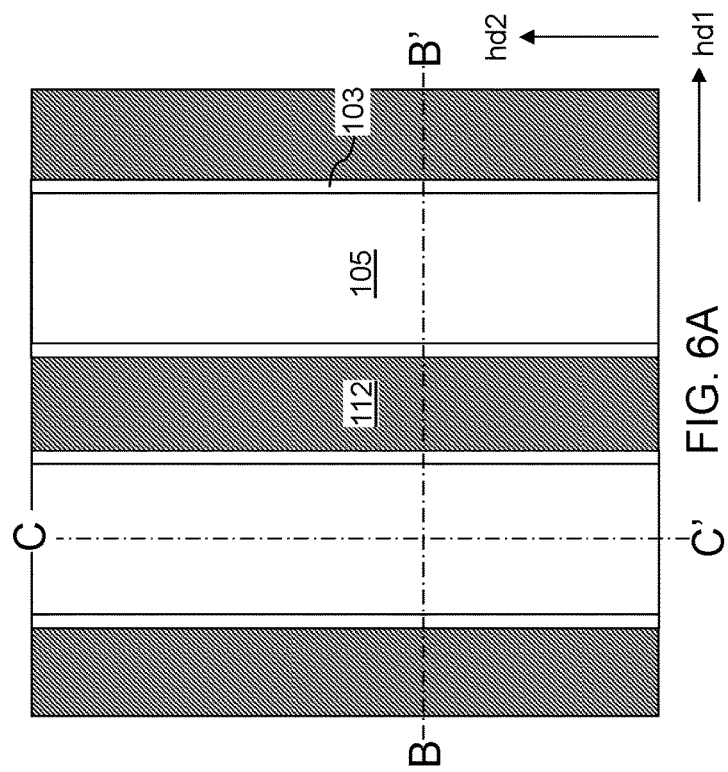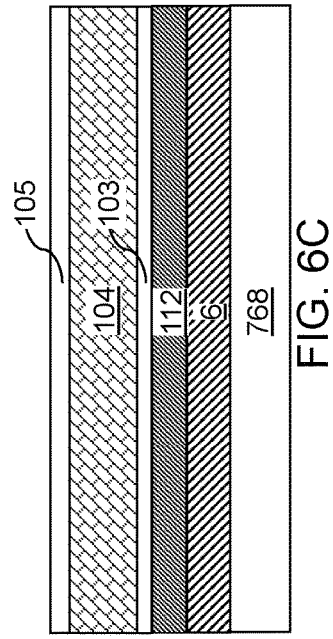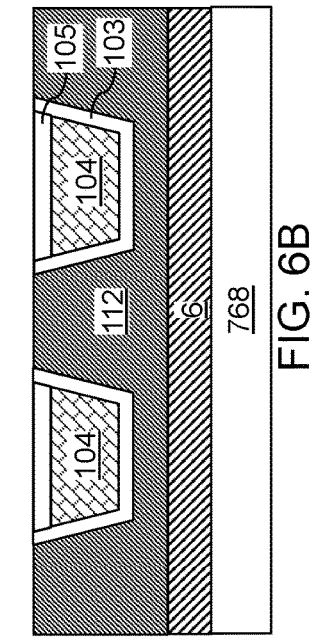

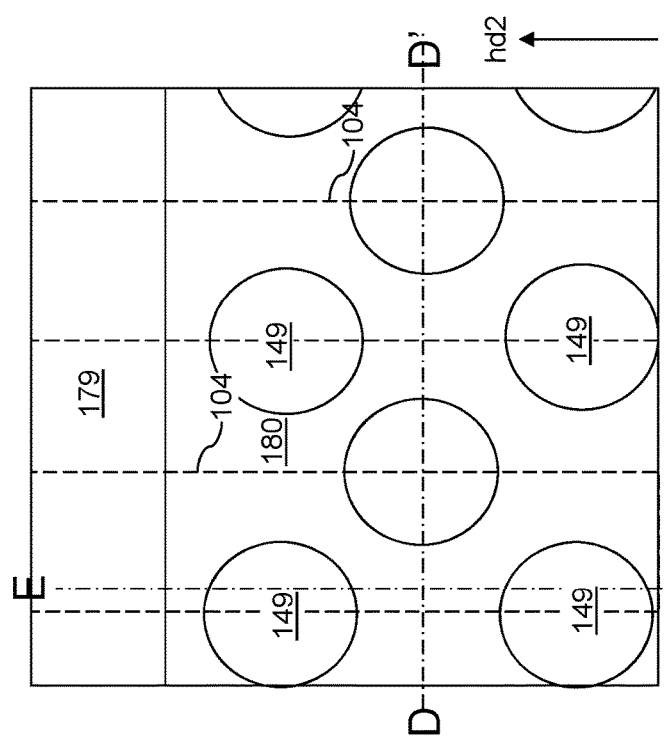
FIG. 12C
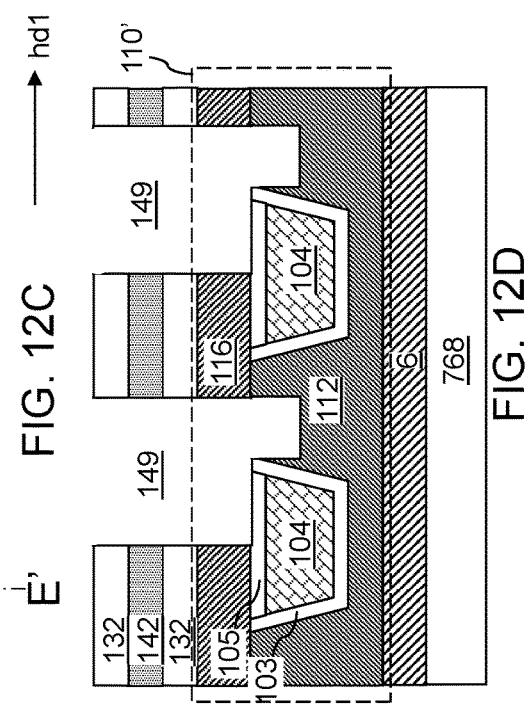
FIG. 12E
FIG. 12D

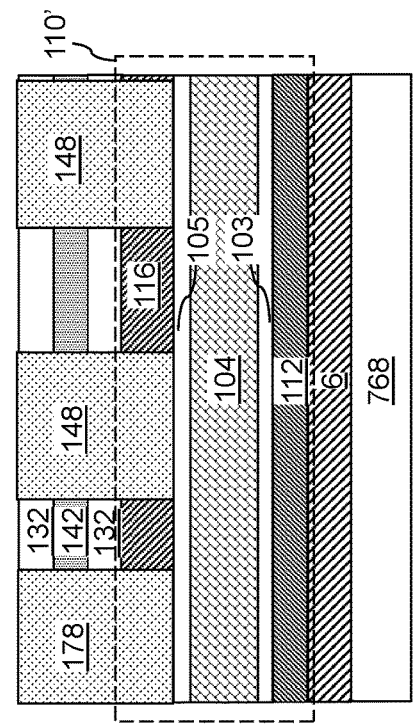
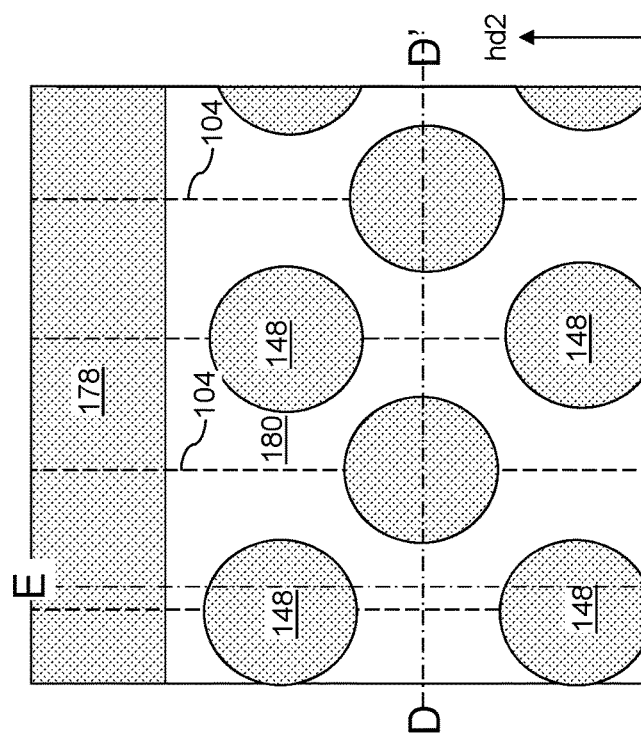
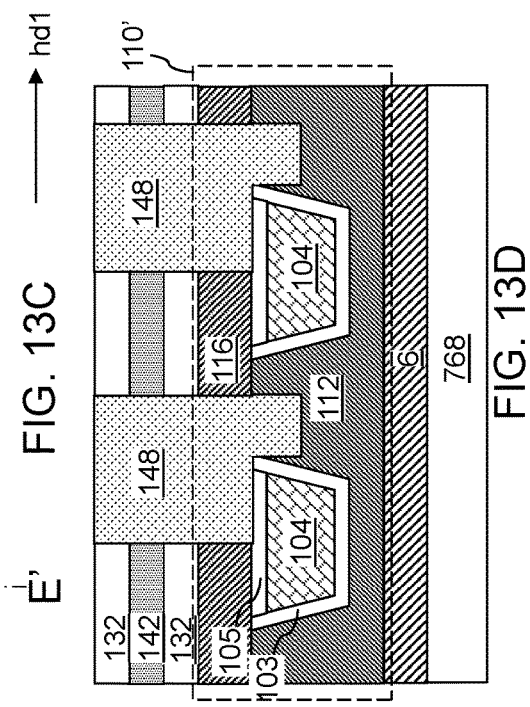
FIG. 13C
FIG. 13D
FIG. 13E

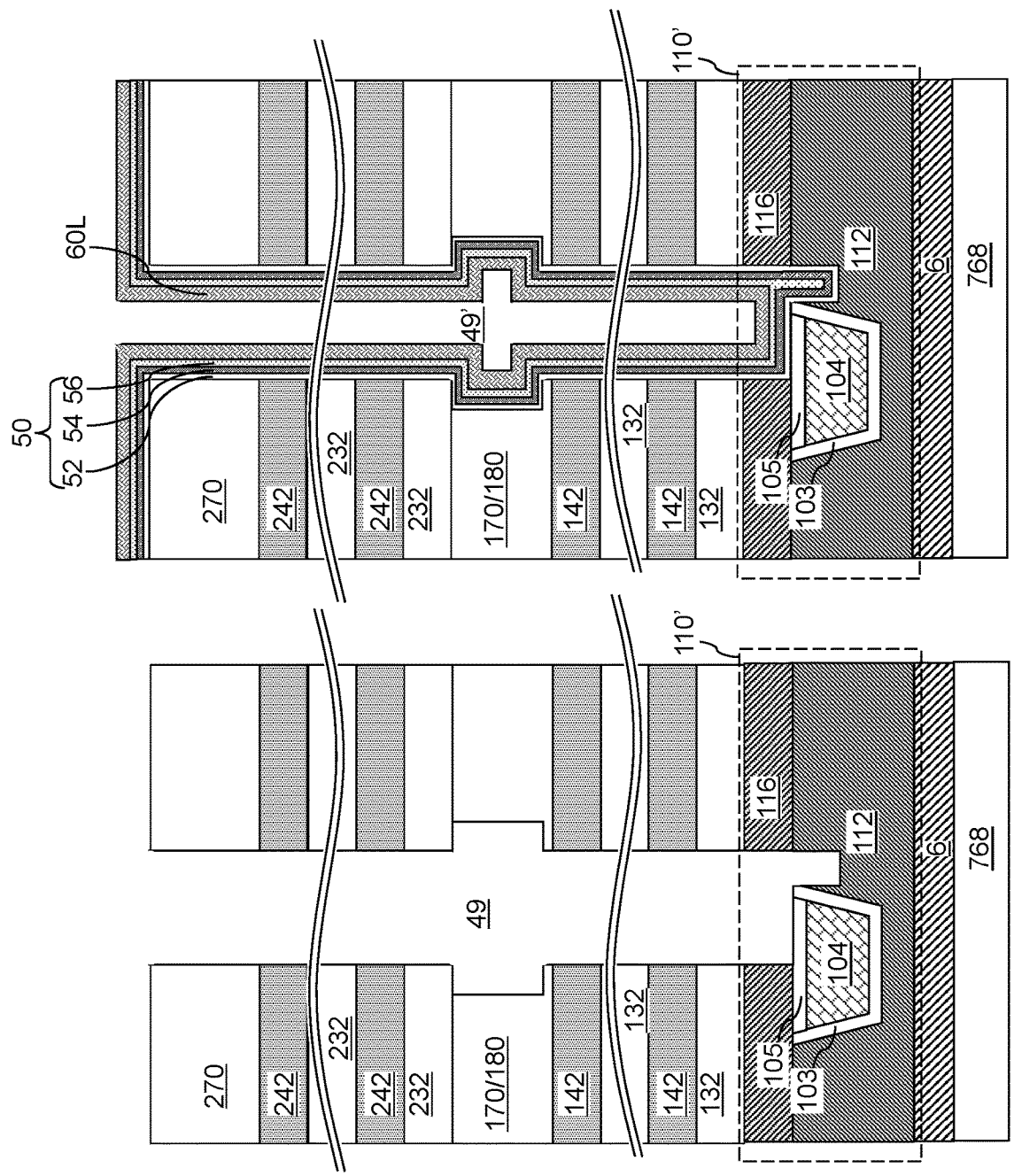

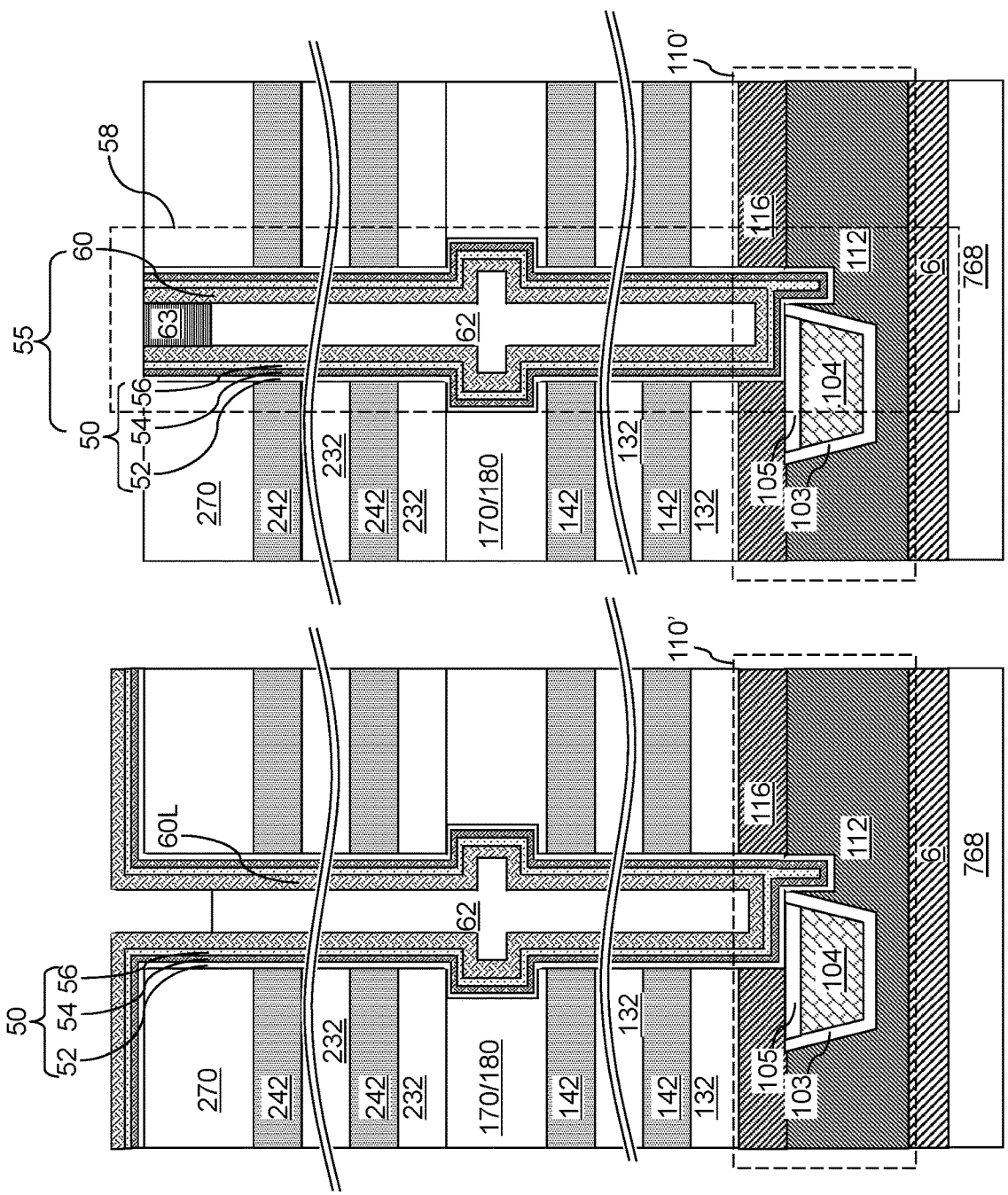

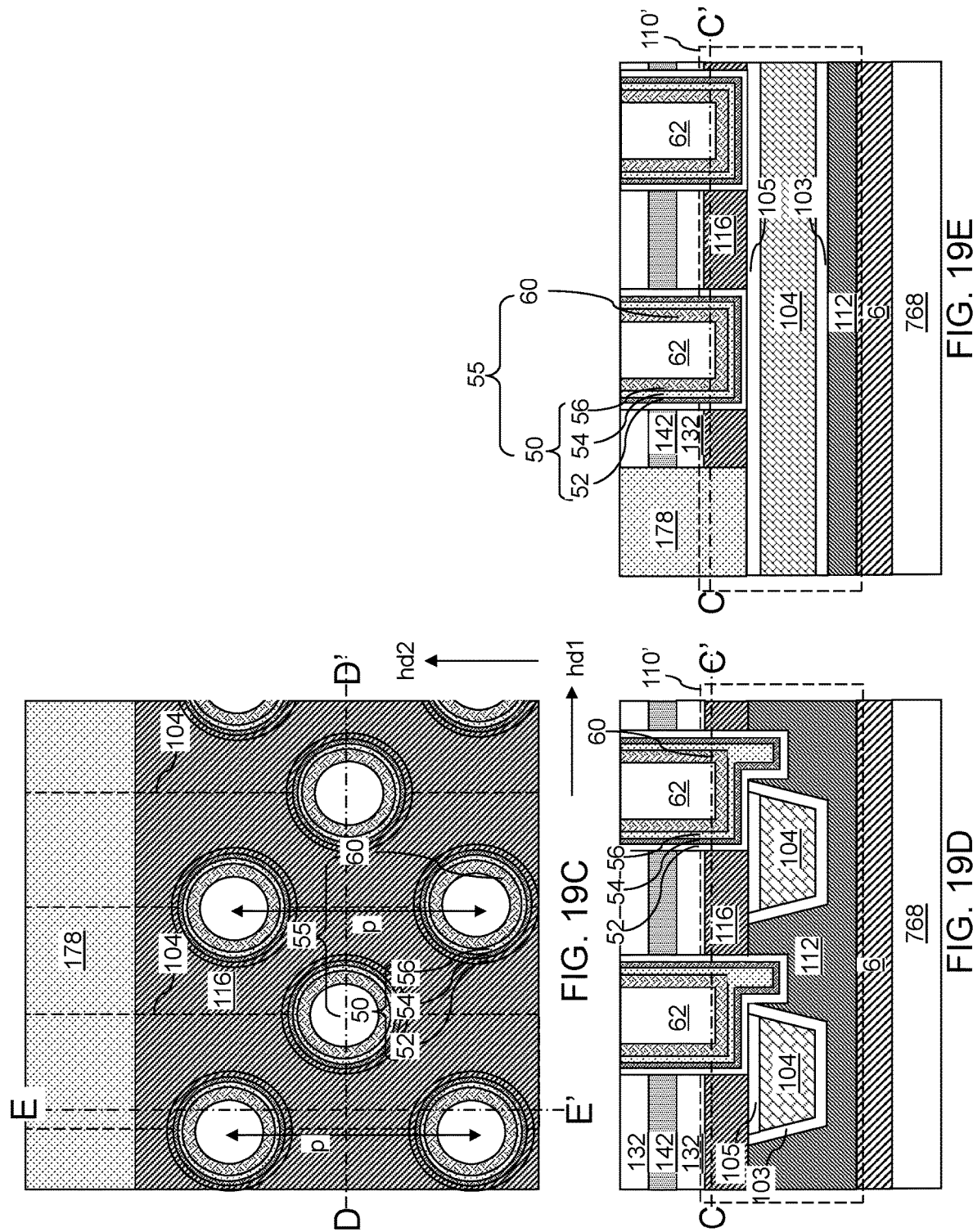

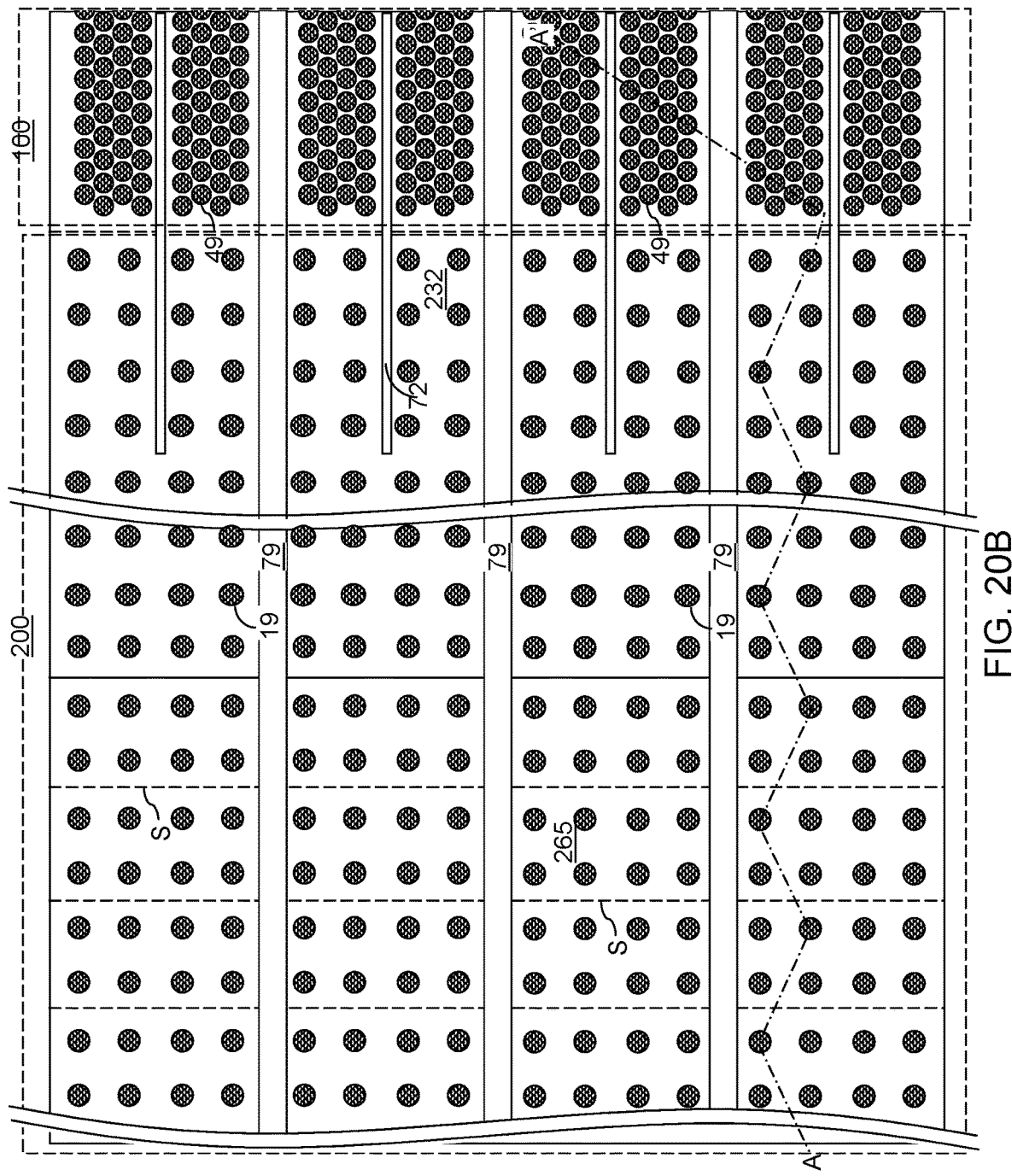

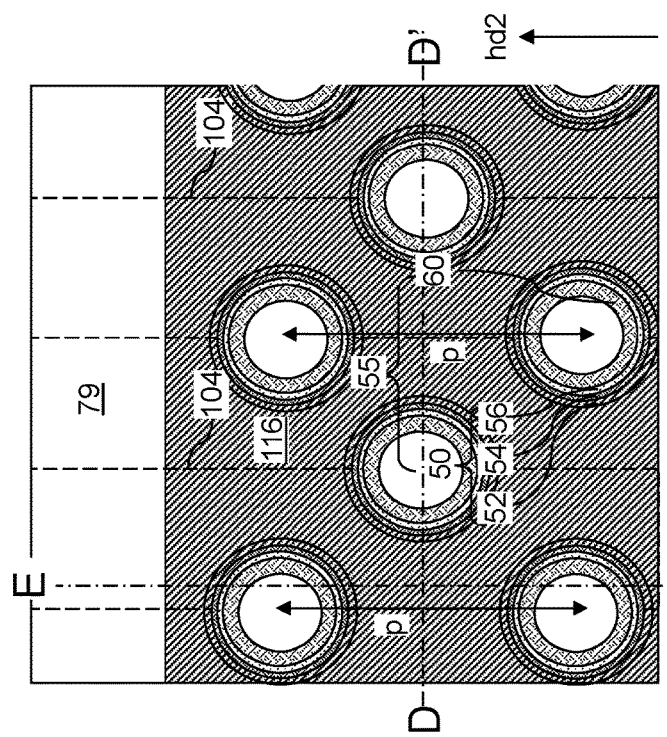
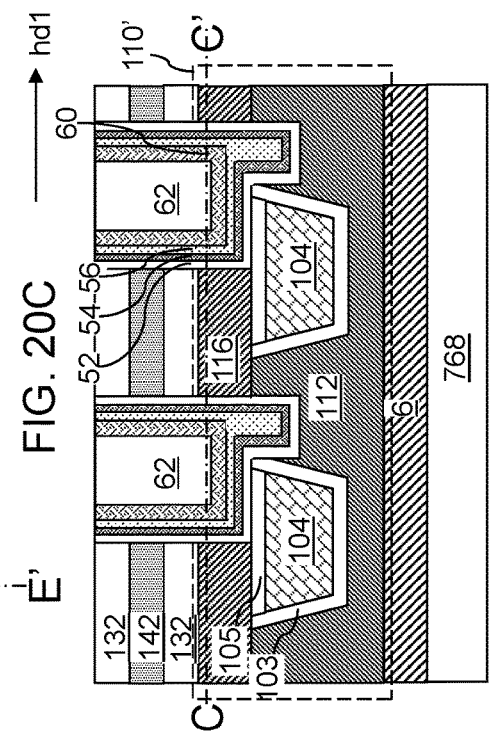
FIG. 20C
FIG. 20D
FIG. 20E

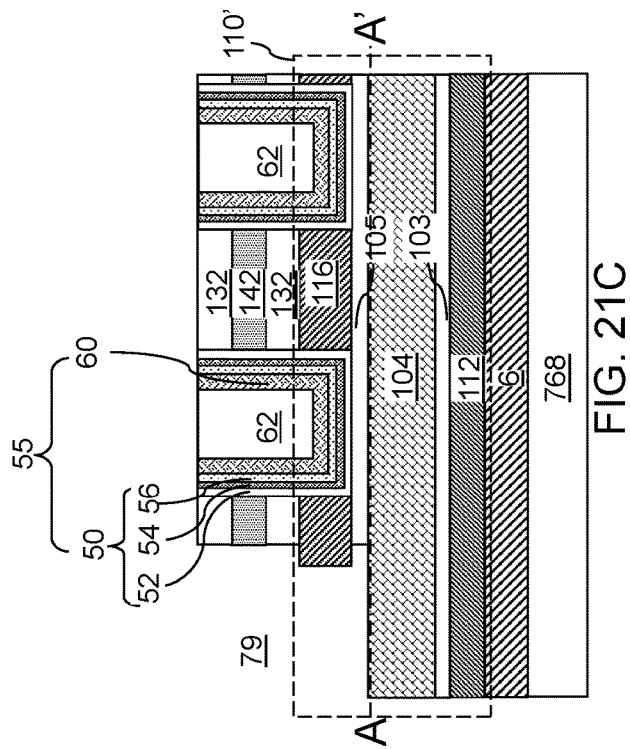
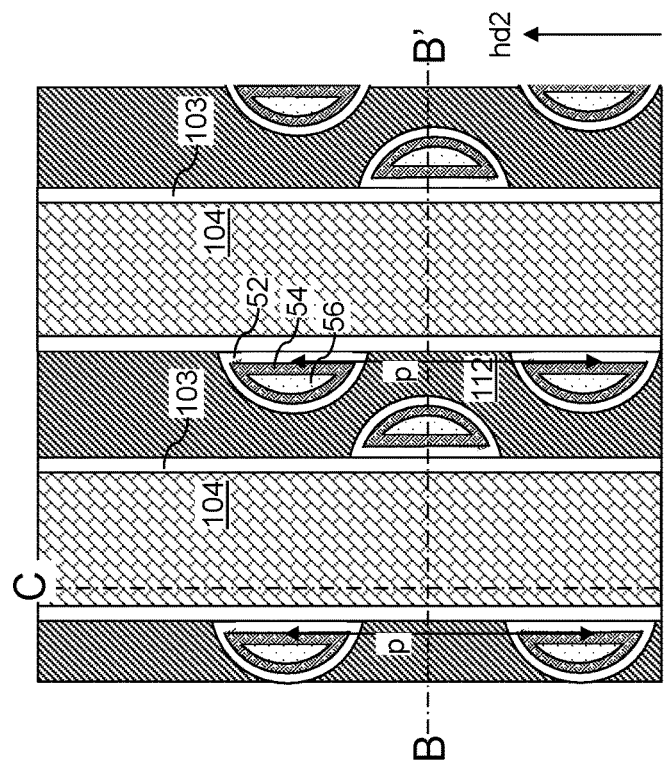
FIG. 21A
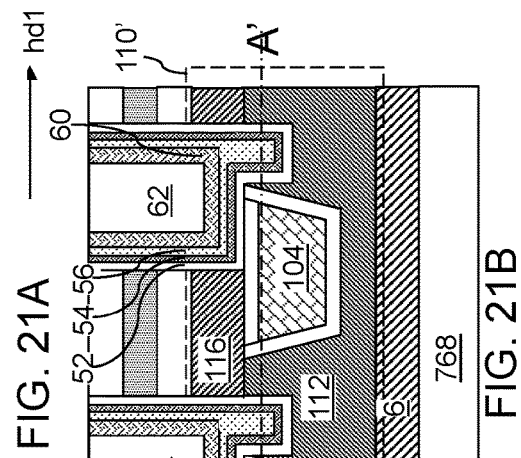
FIG. 21B
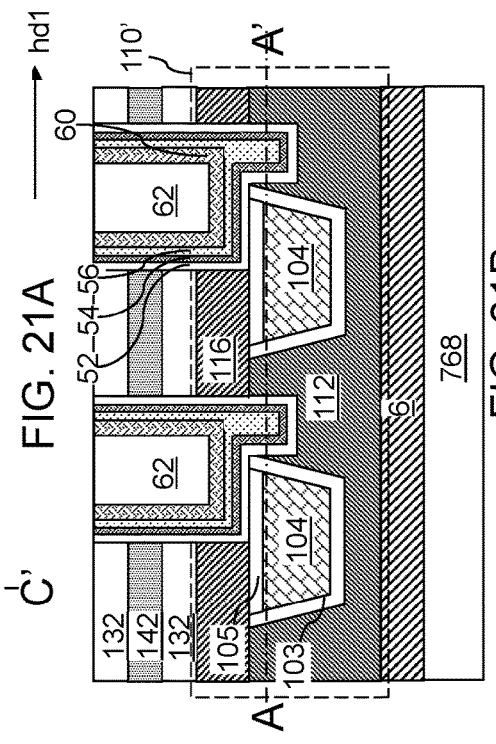
FIG. 21C

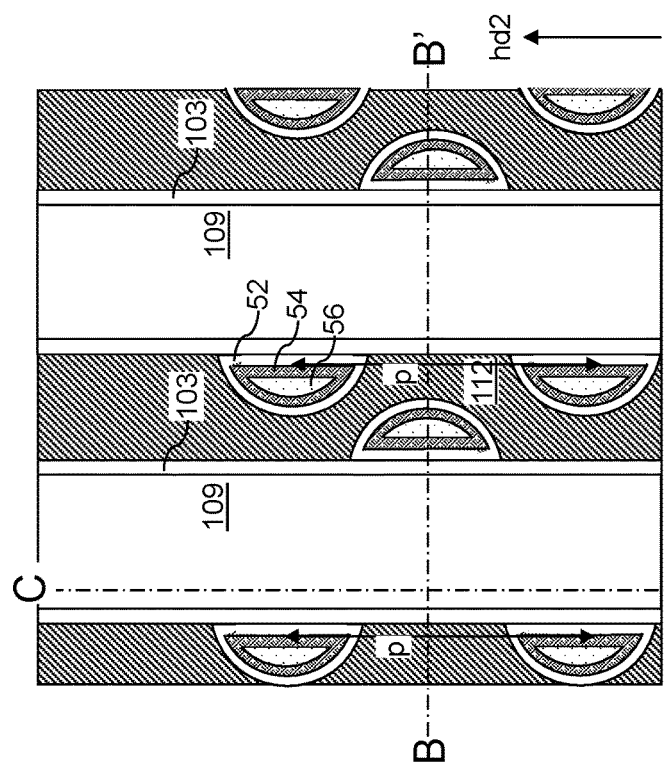
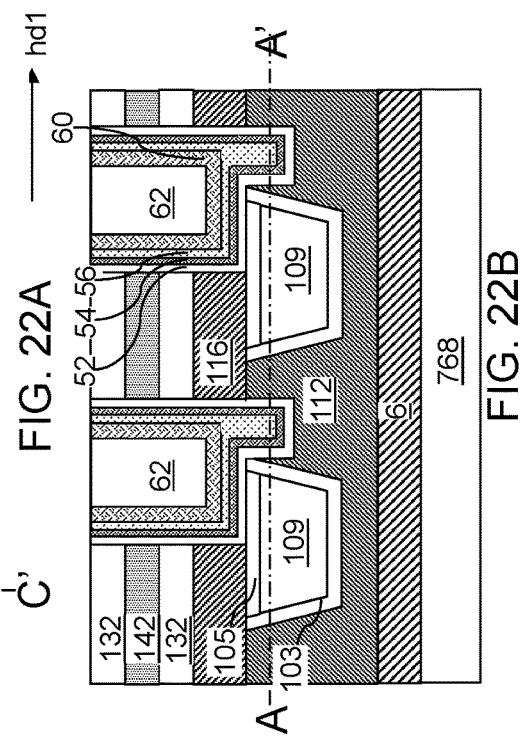
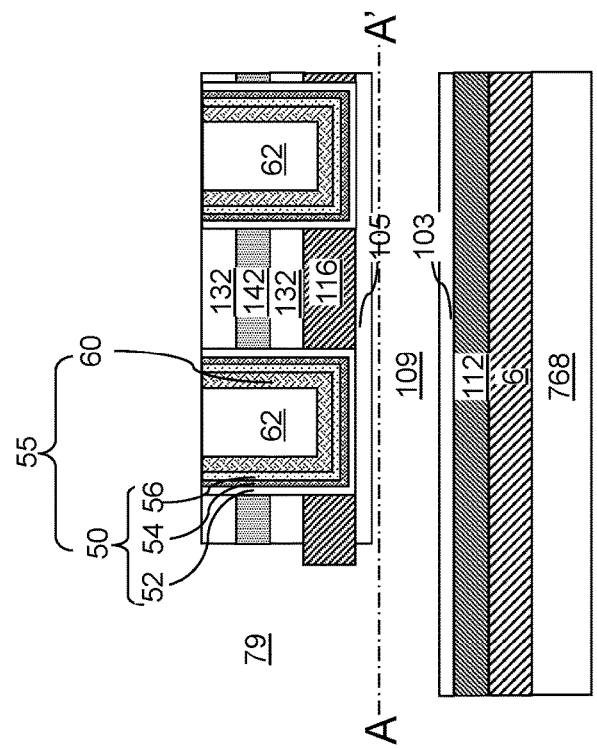
FIG. 22A
FIG. 22B
FIG. 22C

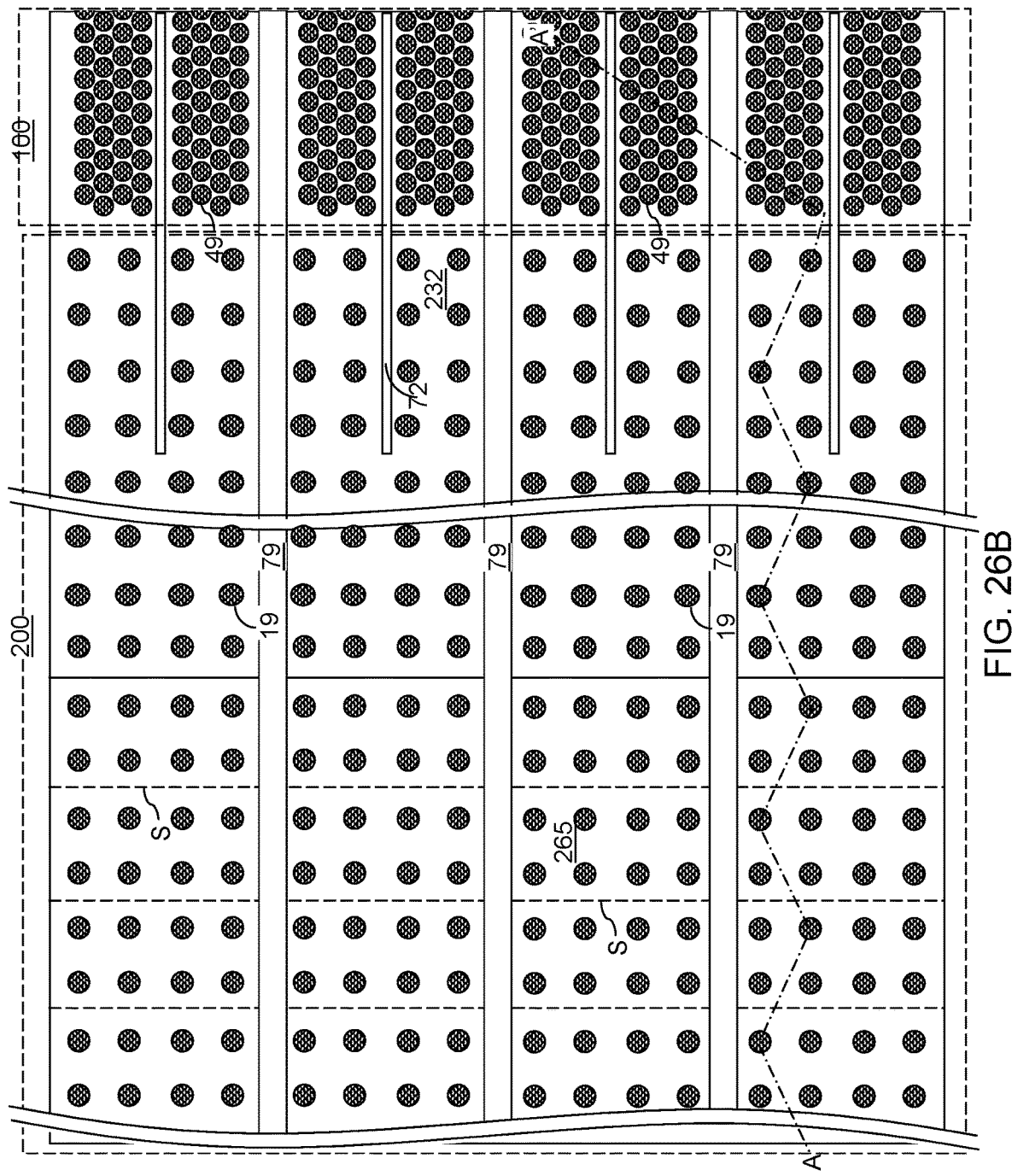

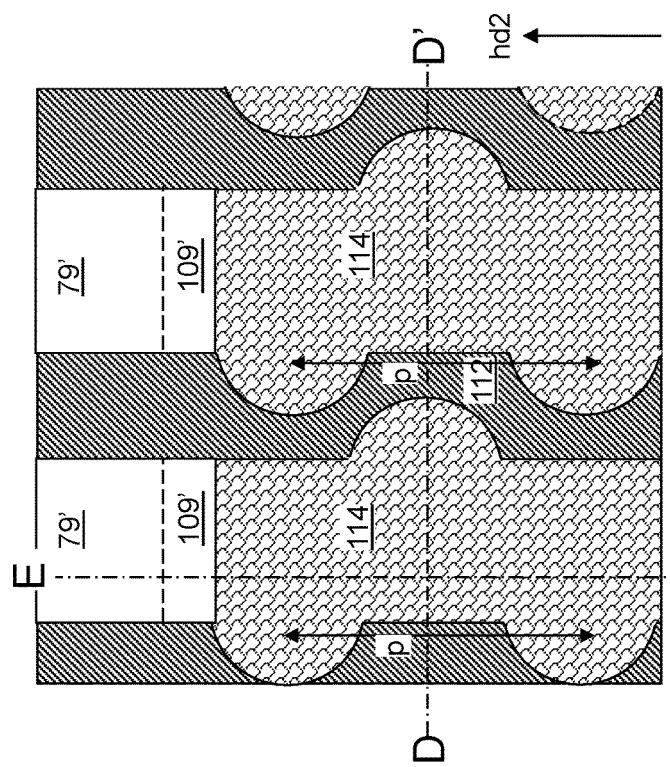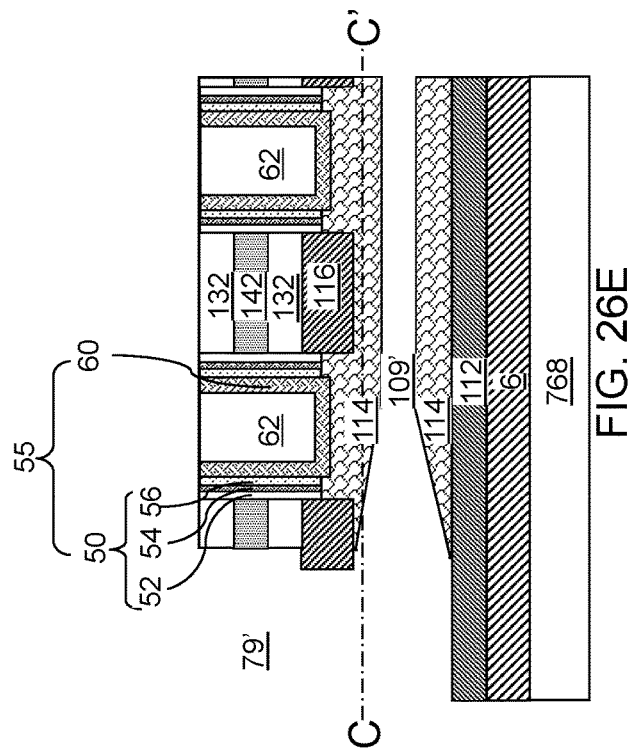

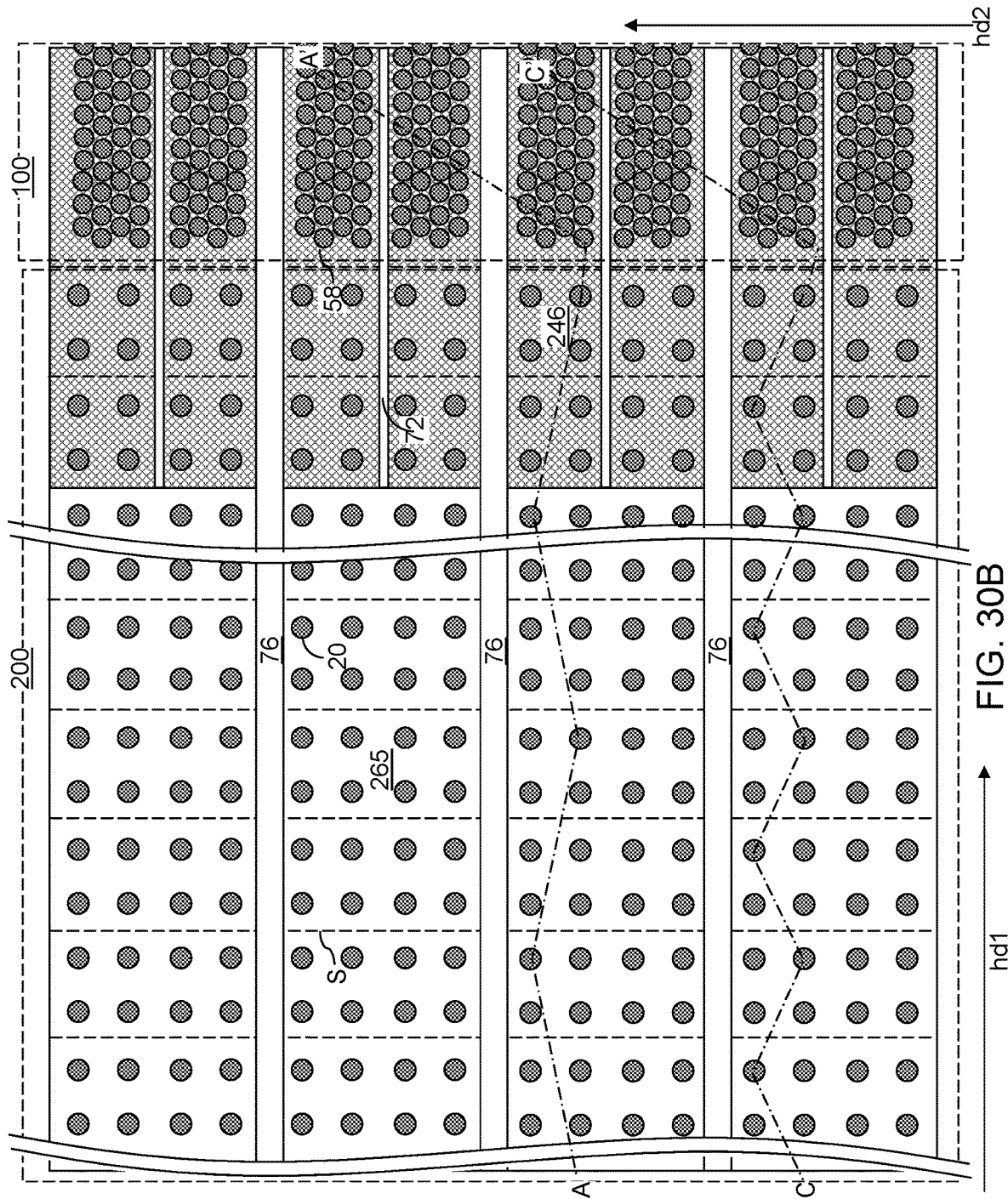

US 12,513,899 B2

THREE-DIMENSIONAL MEMORY DEVICE CONTAINING SOURCE RAILS AND METHOD OF MAKING THE SAME

FIELD

The present disclosure relates generally to the field of semiconductor devices, and particularly to a three-dimensional memory device including source rails and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a source-level structure located over a substrate and comprising a lower source-level semiconductor layer including elongated grooves in an upper portion thereof, doped semiconductor source rails located within the elongated grooves, and an upper source-level semiconductor layer that overlies the lower source-level semiconductor layer and the doped semiconductor source rails, wherein the doped semiconductor source rails are laterally spaced apart from each other along a first horizontal direction and laterally extend along a second horizontal direction; an alternating stack of insulating layers and electrically conductive layers located over the source-level structure; memory openings vertically extending through the alternating stack; and memory opening fill structures located in the memory openings and comprising a respective vertical stack of memory elements and a respective vertical semiconductor channel that contacts a respective one of the doped semiconductor source rails.

According to another aspect of the present disclosure, a method of forming a three-dimensional semiconductor device is provided, which comprises: forming sacrificial source-level rails in an upper portion of a lower source-level semiconductor layer, wherein the sacrificial source-level rails are laterally spaced apart from each other along a first horizontal direction and laterally extend along a second horizontal direction; forming an upper source-level semiconductor layer over the lower source-level semiconductor layer and the sacrificial source-level rails; forming an alternating stack of insulating layers and spacer material layers over the upper source-level semiconductor layer, wherein the spacer material layers are formed as, or are subsequently replaced with, electrically conductive layers; forming memory openings through the alternating stack and the upper source-level semiconductor layer and exposing a respective one of the sacrificial source-level rails; forming memory opening fill structures in the memory openings, wherein each of the memory opening fill structures comprises a respective vertical stack of memory elements and a respective vertical semiconductor channel; and replacing the sacrificial source-level rails and bottom portions of the memory opening fill structures with doped semiconductor source rails.

BRIEF DESCRIPTION OF THE DRAWINGS

FIG. 2A is a top-down view. FIG. 2B is a vertical cross-sectional view along the vertical plane B-B' of FIG. 2A. FIG. 2C is a vertical cross-sectional view along the vertical plane C-C' of FIG. 2A.

FIG. 3A is a top-down view. FIG. 3B is a vertical cross-sectional view along the vertical plane B-B' of FIG. 3A. FIG. 3C is a vertical cross-sectional view along the vertical plane C-C' of FIG. 3A.

FIG. 4A is a top-down view. FIG. 4B is a vertical cross-sectional view along the vertical plane B-B' of FIG. 4A. FIG. 4C is a vertical cross-sectional view along the vertical plane C-C' of FIG. 4A.

FIG. 5A is a top-down view. FIG. 5B is a vertical cross-sectional view along the vertical plane B-B' of FIG. 5A. FIG. 5C is a vertical cross-sectional view along the vertical plane C-C' of FIG. 5A.

FIGS. 6A-6C are various views of a region of the exemplary structure after formation of sacrificial source-level rails. FIG. 6A is a top-down view. FIG. 6B is a vertical cross-sectional view along the vertical plane B-B' of FIG. 6A. FIG. 6C is a vertical cross-sectional view along the vertical plane C-C' of FIG. 6A.

FIG. 7A is a top-down view. FIG. 7B is a vertical cross-sectional view along the vertical plane B-B' of FIG. 7A. FIG. 7C is a vertical cross-sectional view along the vertical plane C-C' of FIG. 7A.

FIG. 12C is a top-down view of a region C of FIG. 12B. FIG. 12D is a vertical cross-sectional view along the vertical plane D-D' of FIG. 12C. FIG. 12E is a vertical cross-sectional view along the vertical plane E-E' of FIG. 12C.

FIG. 13C is a top-down view of a region C of FIG. 13B. FIG. 13D is a vertical cross-sectional view along the vertical plane D-D' of FIG. 13C. FIG. 13E is a vertical cross-sectional view along the vertical plane E-E' of FIG. 13C.

FIGS. 18A-18D illustrate sequential vertical cross-sectional views of a memory opening during formation of a memory opening fill structure according to an embodiment of the present disclosure.

FIG. 19C is a top-down view of a region C of FIG. 19B. FIG. 19D is a vertical cross-sectional view along the vertical plane D-D' of FIG. 19C. FIG. 19E is a vertical cross-sectional view along the vertical plane E-E' of FIG. 19C.

FIG. 20B is a horizontal cross-sectional view of the exemplary structure along the horizontal plane B-B' of FIG. 20A. The hinged vertical plane A-A' corresponds to the plane of the vertical cross-sectional view of FIG. 20A.

FIG. 20C is a top-down view of a region C of FIG. 20B. FIG. 20D is a vertical cross-sectional view along the vertical plane D-D' of FIG. 20C. FIG. 20E is a vertical cross-sectional view along the vertical plane E-E' of FIG. 20C.

FIG. 21A is a top-down view of a region of the exemplary structure after isotropically etching the upper sacrificial capping liners. FIG. 21B is a vertical cross-sectional view along the vertical plane B-B' of FIG. 20A. FIG. 21C is a vertical cross-sectional view along the vertical plane C-C' of FIG. 21A.

FIG. 22A is a top-down view of a region of the exemplary structure after removal of the sacrificial material cores. FIG. 22B is a vertical cross-sectional view along the vertical plane B-B' of FIG. 20A. FIG. 22C is a vertical cross-sectional view along the vertical plane C-C' of FIG. 22A.

FIG. 26B is a horizontal cross-sectional view of the exemplary structure along the horizontal plane B-B' of FIG. 26A. The hinged vertical plane A-A' corresponds to the plane of the vertical cross-sectional view of FIG. 26A.

FIG. 26C is a top-down view of a region C of FIG. 26B. FIG. 26D is a vertical cross-sectional view along the vertical plane D-D' of FIG. 26C. FIG. 26E is a vertical cross-sectional view along the vertical plane E-E' of FIG. 26C.

FIG. 30B is a horizontal cross-sectional view of the exemplary structure along the horizontal plane B-B' of FIG. 30A. The hinged vertical plane A-A' corresponds to the plane of the vertical cross-sectional view of FIG. 30A.

DETAILED DESCRIPTION

Figure 1A:
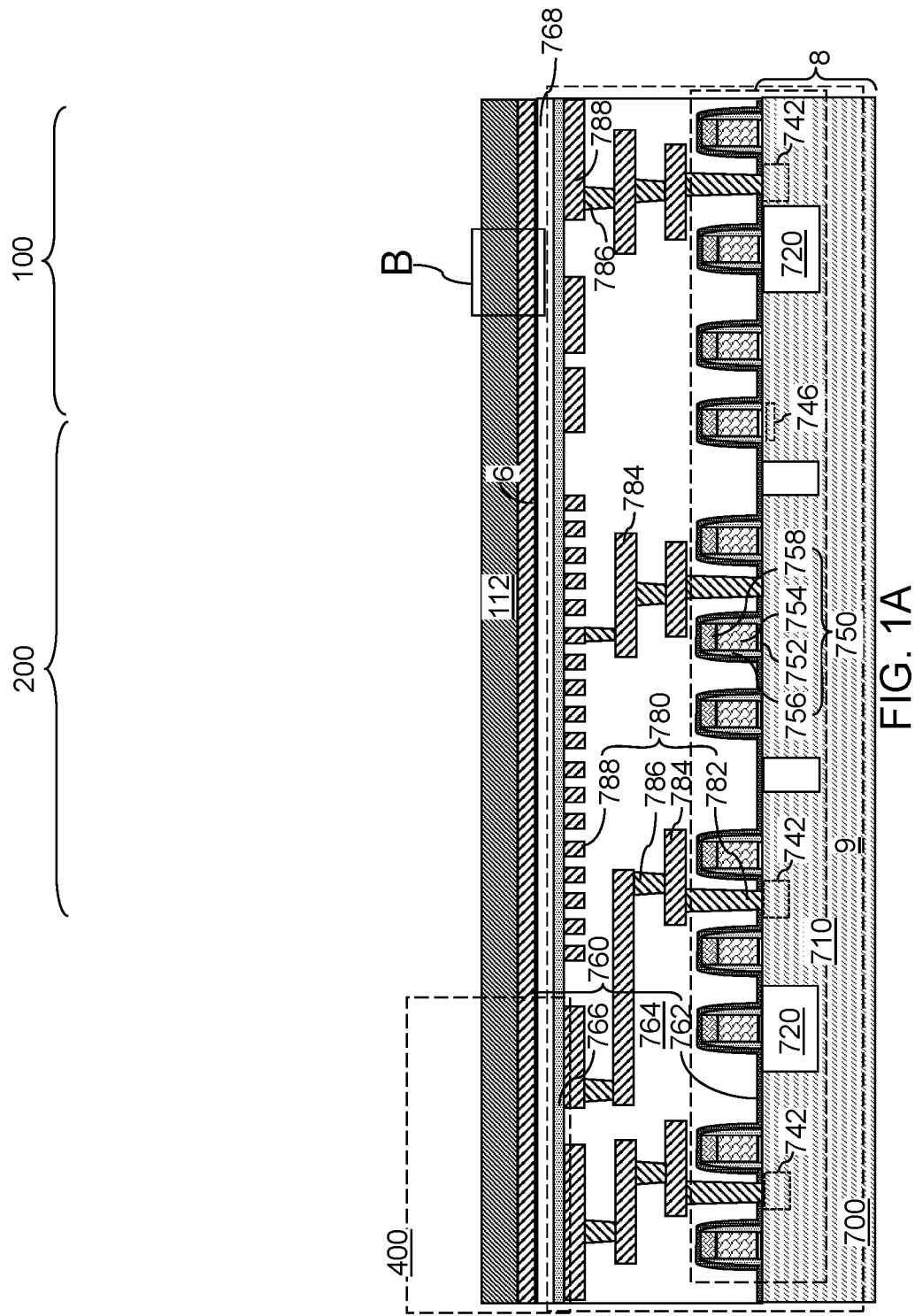
FIG. 1A is a vertical cross-sectional view of an exemplary structure after formation of semiconductor devices, lower level dielectric layers, lower metal interconnect structures, and a lower source-level semiconductor layer over a semiconductor substrate according to an embodiment of the present disclosure.

Embodiments of the present disclosure provide a three-dimensional memory device including source rails formed by replacement of sacrificial rails and methods of manufacturing the same, the various aspects of which are described herein in detail. The embodiments of the present disclosure may be used to form various semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies.

A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
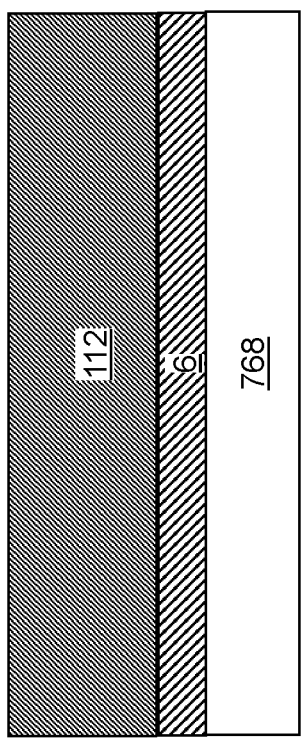
FIG. 1B is a magnified view of region B in FIG. 1A.

Referring to FIGS. 1A and 1B, an exemplary structure according to an embodiment of the present disclosure is illustrated. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional conductive plate layer 6 and a lower source-level semiconductor layer 112 can be formed over the at least one second dielectric material layer 768. The optional conductive plate layer 6, if present, provides a high conductivity conduction path for electrical current that flows into, or out of, the lower source-level semiconductor layer 112. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The lower source-level semiconductor layer 112 includes a doped semiconductor material such as doped polysilicon or doped amorphous silicon. The conductivity type of the lower source-level semiconductor layer 112 may be the opposite of the conductivity of vertical semiconductor channels to be subsequently formed. For example, if the vertical semiconductor channels to be subsequently formed have a doping of a first conductivity type, the lower source-level semiconductor layer 112 has a doping of a second conductivity type that is the opposite of the first conductivity type. The thickness of the lower source-level semiconductor layer 112 may be in a range from 100 nm to 1,000 nm, such as from 150 nm to 500 nm, although lesser and greater thicknesses may also be used.

Figure 2C:
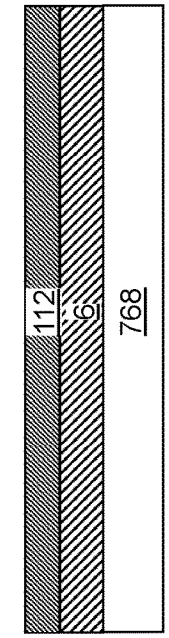
FIGS. 2A-2C are various views of a region of the exemplary structure after formation of grooves in an upper portion of the lower source-level semiconductor layer.
Figure 2A:
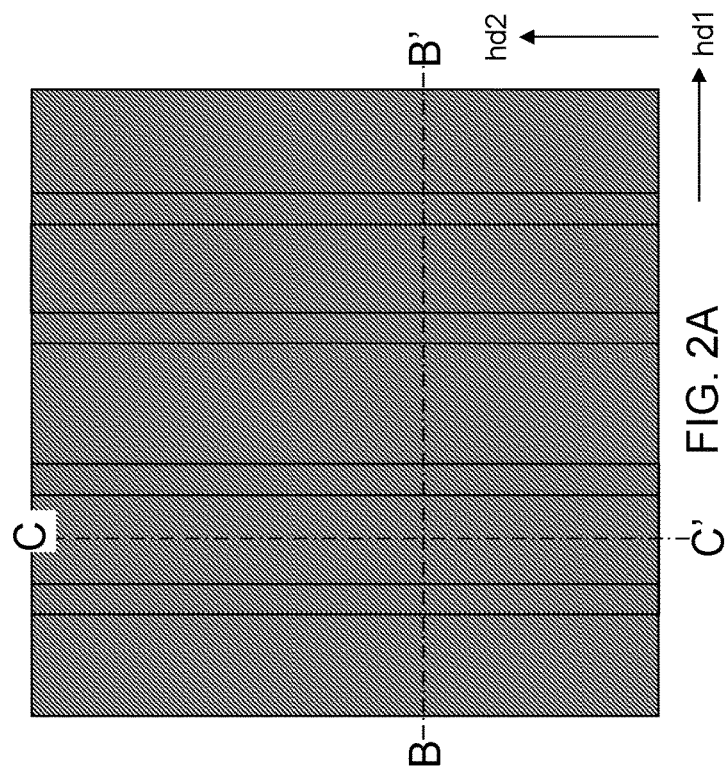
Figure 2B:
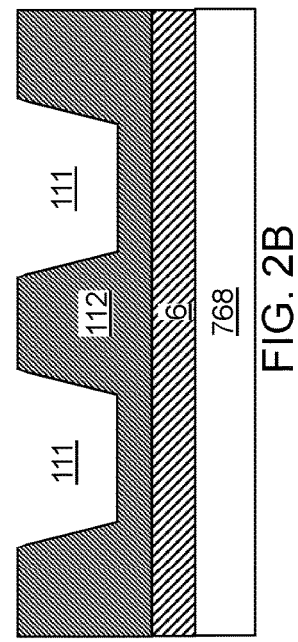

Referring to FIGS. 2A-2C, a photoresist layer (not shown) can be applied over the lower source-level semiconductor layer 112, and can be lithographically patterned with a line-and-space pattern in the memory array region 100. The line-and-space pattern may include line-shaped openings that are laterally spaced apart along the first horizontal direction (e.g., word line direction) hd1 and laterally spaced apart along the second horizontal direction (e.g., bit line direction) hd2. The pitch of the line-and-space pattern along the first horizontal direction hd1 may be the same as the pitch of a pattern of memory openings to be subsequently formed along the first horizontal direction hd1. An etch process can be performed to transfer the line-and-space pattern in the photoresist layer into an upper portion of the lower source-level semiconductor layer 112. Grooves 111 laterally extending along the second horizontal direction hd2 and laterally spaced apart along the first horizontal direction hd1 can be formed in the upper portion of the lower source-level semiconductor layer 112. The depth of the grooves 111 may be in a range from 10% to 90%, such as from 20% to 80%, of the thickness of the lower source-level semiconductor layer 112. In one embodiment, the grooves 111 are located only in the memory array region 100 but not in the staircase region 200.

Figure 3C:
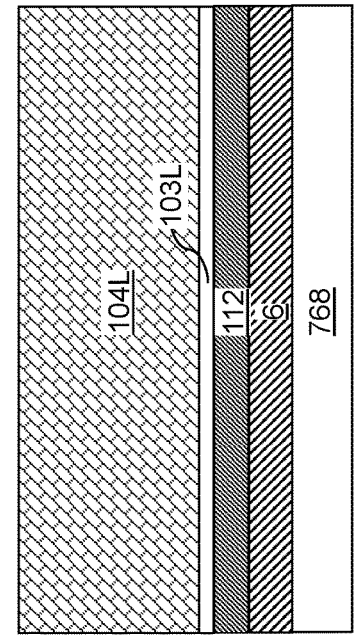
FIGS. 3A-3C are various views of a region of the exemplary structure after formation of a lower sacrificial liner layer and a sacrificial source-level material layer.
Figure 3A:
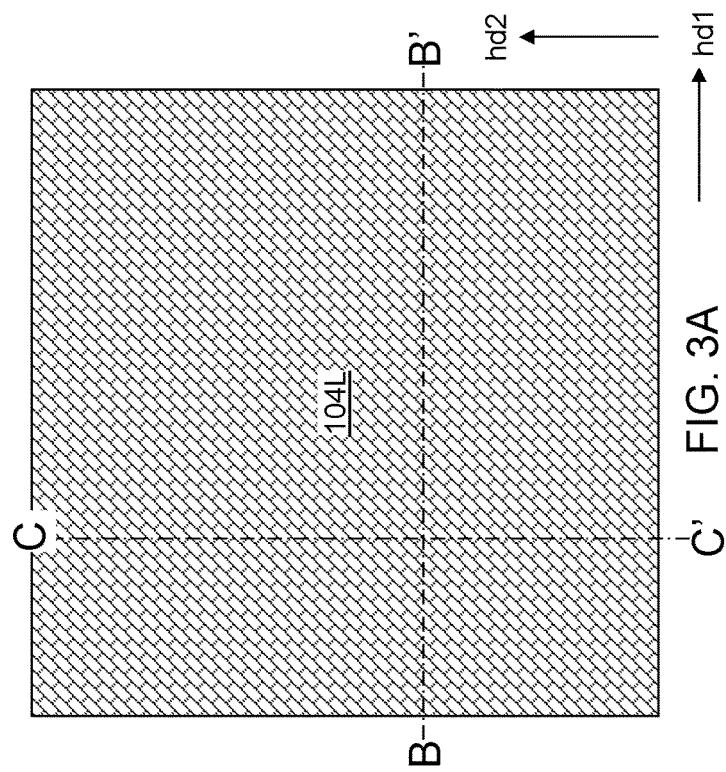
Figure 3B:
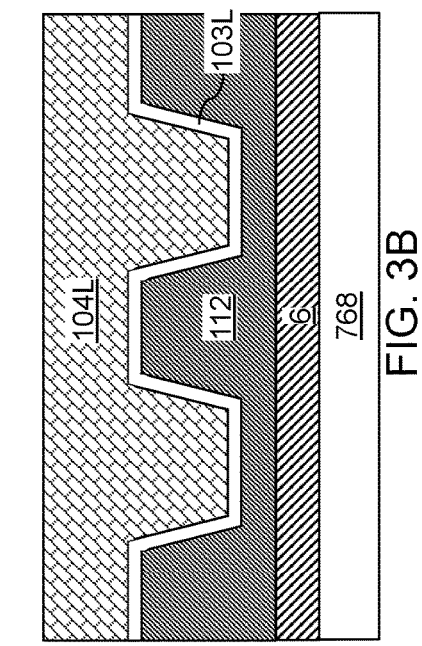

Referring to FIGS. 3A-3C, a lower sacrificial liner layer 103L and a sacrificial source-level material layer 104L can be formed over the lower source-level semiconductor layer 112. The lower sacrificial liner layer 103L includes a dielectric material such as silicon oxide, silicon nitride, silicon carbide, or a dielectric metal oxide. The lower sacrificial liner layer 103L may be formed by deposition of a dielectric material or by conversion of a surface portion of the lower source-level semiconductor layer 112 into a dielectric material. For example, the lower sacrificial liner layer 103L may be formed by thermal oxidation or plasma oxidation of a surface portion of the lower source-level semiconductor layer 112 (e.g., by oxidation of a polysilicon layer 112 to form a silicon oxide liner layer 103L). The thickness of the lower sacrificial liner layer 103L may be in a range from 1 nm to 20 nm, although lesser and greater thicknesses may also be employed.

The sacrificial source-level material layer 104L comprises a material that can be subsequently removed selective to the material of the lower sacrificial liner layer 103L and the alternating stack of layers to be formed above it. For example, if the lower sacrificial liner layer 103L comprises silicon oxide, and the alternating stack will comprise a stack of alternating silicon oxide and silicon nitride layers, then lower sacrificial liner layer 103L may comprise any material which may be etched away selectively to silicon oxide and silicon nitride.

In one embodiment, the sacrificial source-level material layer 104L comprises, and/or consists essentially of, an electrically conductive material (e.g., metal or metal alloy) such as TiN, TaN, WN, MoM, W, Ti, Ta, Mo, Co, Ru, or a combination thereof. In this embodiment, the sacrificial source-level material layer 104L comprises a material that can provide high etch resistance during a subsequent anisotropic etch process that forms memory openings. In another embodiment, the sacrificial source-level material layer 104L comprises a semiconductor material (such as silicon or a silicon-germanium alloy), amorphous carbon or diamond-like carbon (DLC), or a metallic material. The sacrificial source-level material layer 104L may be deposited such that the entire volume of each groove 111 is filled with a respective portion of the lower sacrificial liner layer 103L and a respective portion of the sacrificial source-level material layer 104L.

Figure 4C:
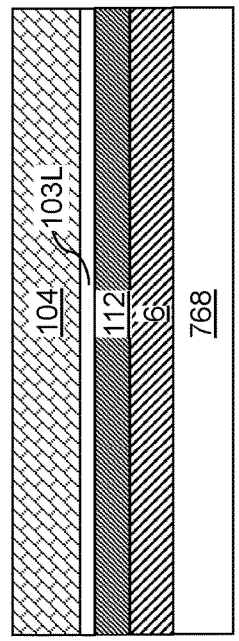
FIGS. 4A-4C are various views of a region of the exemplary structure after formation of sacrificial material cores.
Figure 4A:
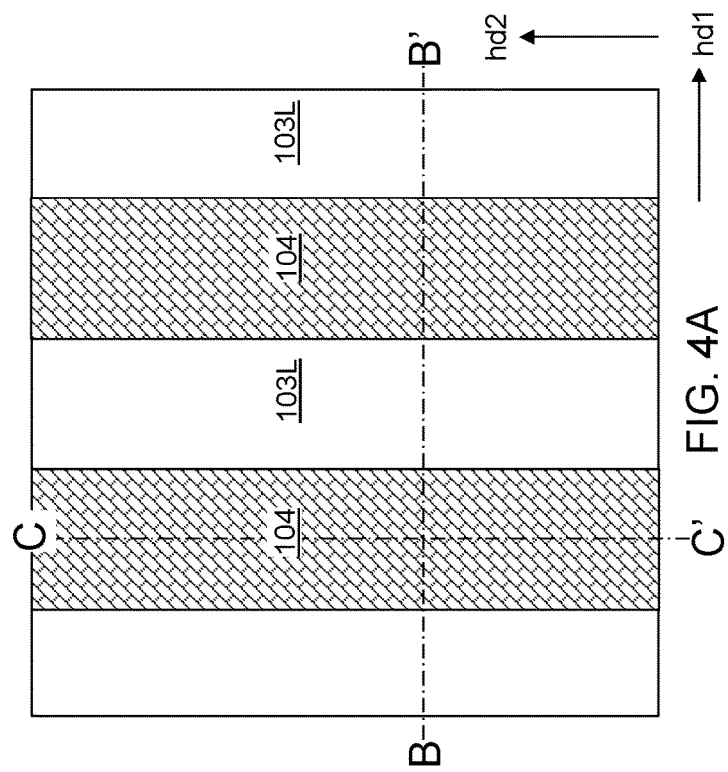
Figure 4B:
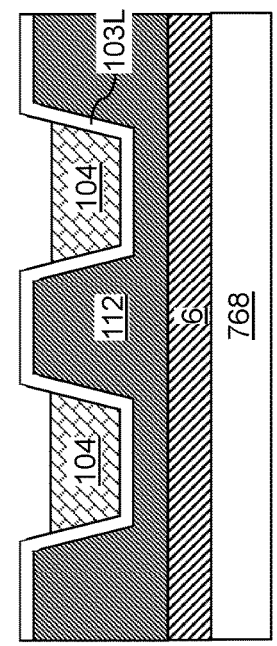

Referring to FIGS. 4A-4C, the sacrificial source-level material layer 104L can be vertically recessed such that each remaining portion of the sacrificial source-level material layer 104L is located entirely within a volume of a respective groove 111. Each patterned portion of the sacrificial source-level material layer 104L is herein referred to as a sacrificial material core 104. The top surfaces of the sacrificial material cores 104 may be located below a horizontal plane including the topmost surfaces of the lower source-level semiconductor layer 112. The sacrificial material cores 104 are formed in a respective one of the grooves 111 over the lower sacrificial liner layer 103L.

Figure 5A:
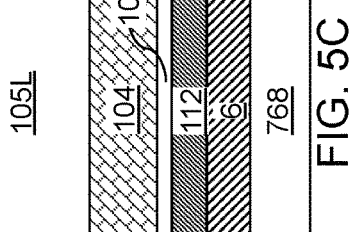
FIGS. 5A-5C are various views of a region of the exemplary structure after formation of an upper sacrificial liner layer.
Figure 5B:
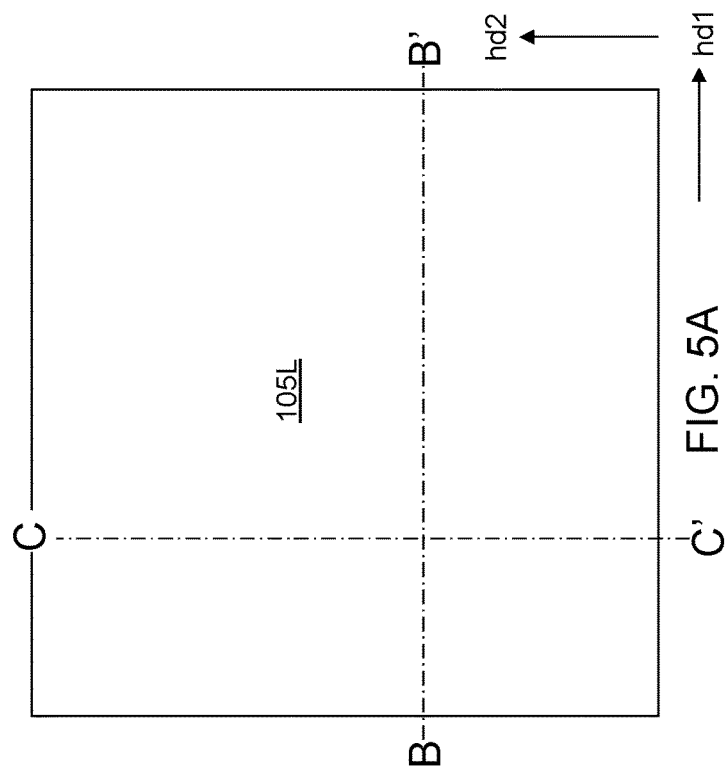
Figure 5C:
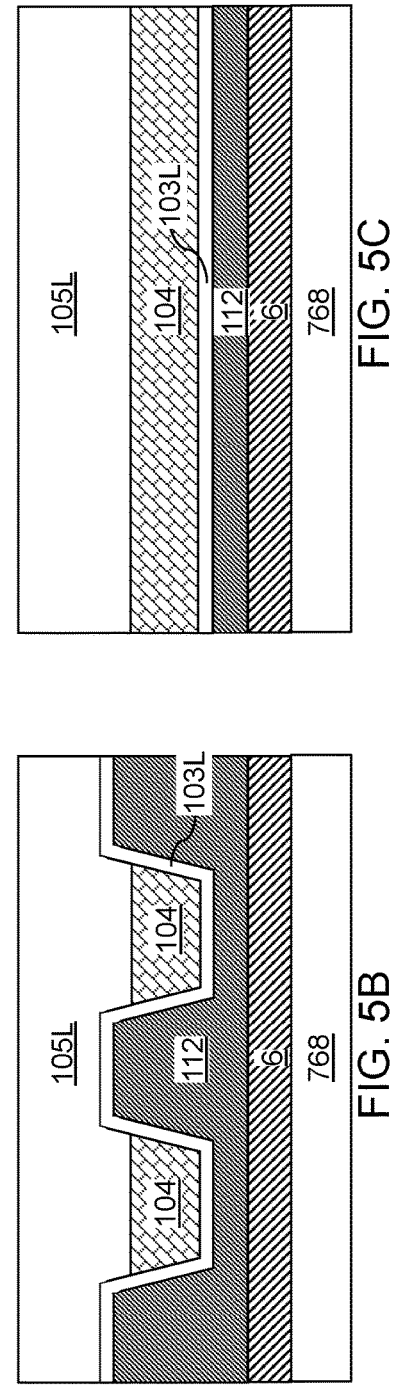

Referring to FIGS. 5A-5C, an upper sacrificial liner layer 105L can be deposited over the sacrificial material cores 104 and the lower sacrificial liner layer 103L. The upper sacrificial liner layer 105L may comprise any material that may be employed for the lower sacrificial liner layer 103L. In one embodiment, the upper sacrificial liner layer 105L may comprise a same dielectric material, such as silicon oxide, as the lower sacrificial liner layer 103L.

Referring to FIGS. 6A-6C, a planarization process can be performed to remove portions of the upper sacrificial liner layer 105L and the lower sacrificial liner layer 103L from above the horizontal plane including the top surface of the lower source-level semiconductor layer 112. A chemical mechanical polishing process and/or a recess etch process may be employed for the planarization process. Each remaining portion of the upper sacrificial liner layer 105L located in an upper portion of a respective groove 1111 comprises an upper sacrificial liner 105. Each remaining portion of the lower sacrificial liner layer 103L located in a respective groove 111 comprises a lower sacrificial liner 103. Each contiguous combination of a lower sacrificial liner 103, a sacrificial material core 104, and an upper sacrificial liner 105 constitutes a sacrificial source-level rail (103, 104, 105). In one embodiment, the sacrificial source-level rails (103, 104, 105) may be formed as a one-dimensional periodic array having a pitch along the first horizontal direction hd1. The pitch of the one-dimensional array of sacrificial source-level rails (103, 104, 105) may be the same as a first pitch of a two-dimensional array of memory openings to be subsequently formed along the first horizontal direction hd1. Generally, the sacrificial source-level rails (103, 104, 105) can be formed in an upper portion of a lower source-level semiconductor layer 112, and can be laterally spaced apart from each other along the first horizontal direction hd1, and can laterally extend along the second horizontal direction hd2.

Figure 7A:
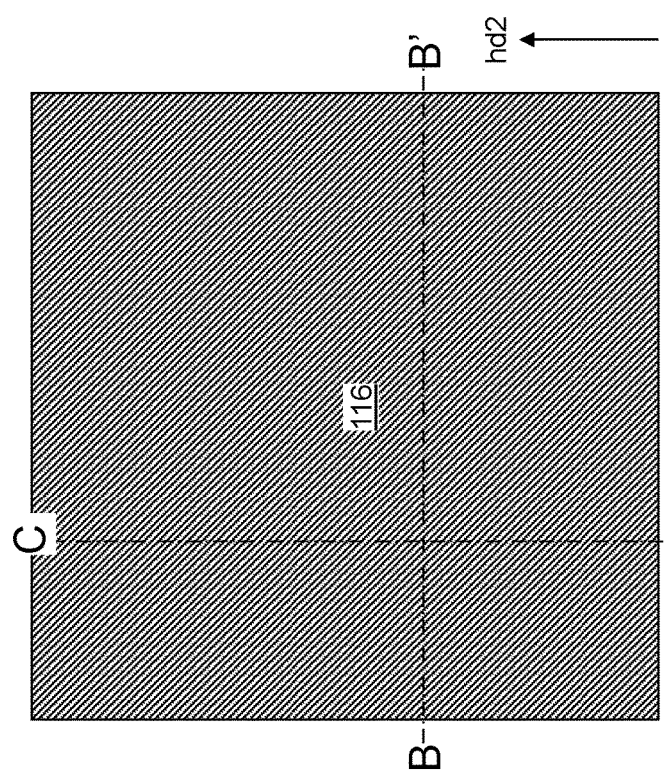
FIGS. 7A-7C are various views of a region of the exemplary structure after formation of an upper source-level semiconductor layer.
Figure 7C:
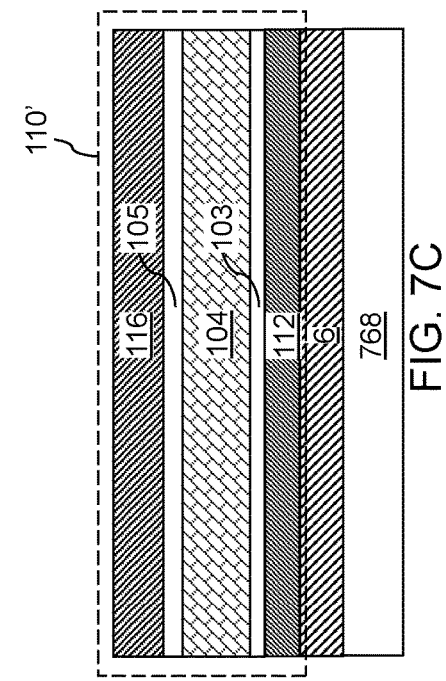
Figure 7B:
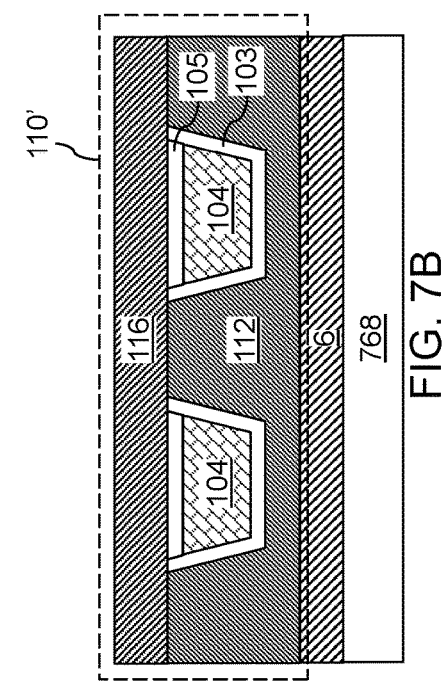

Referring to FIGS. 7A-7C, and an upper source-level semiconductor layer 116 can be formed over the sacrificial source-level rails (103, 104, 105) and the lower source-level semiconductor layer 112. The upper source-level semiconductor layer 116 includes a doped semiconductor material such as doped polysilicon or doped amorphous silicon. The upper source-level semiconductor layer 116 has a doping of the second conductivity type, which is the same conductivity type as the lower source-level semiconductor layer 112. The thickness of the upper source-level semiconductor layer 116 may be in a range from 50 nm to 500 nm, such as from 100 nm to 300 nm, although lesser and greater thicknesses may also be used. The combination of the lower source-level semiconductor layer 112, the sacrificial source-level rails (103, 104, 105), and the upper source-level semiconductor layer 116 constitutes an in-process source-level structure 110'.

Figure 8:
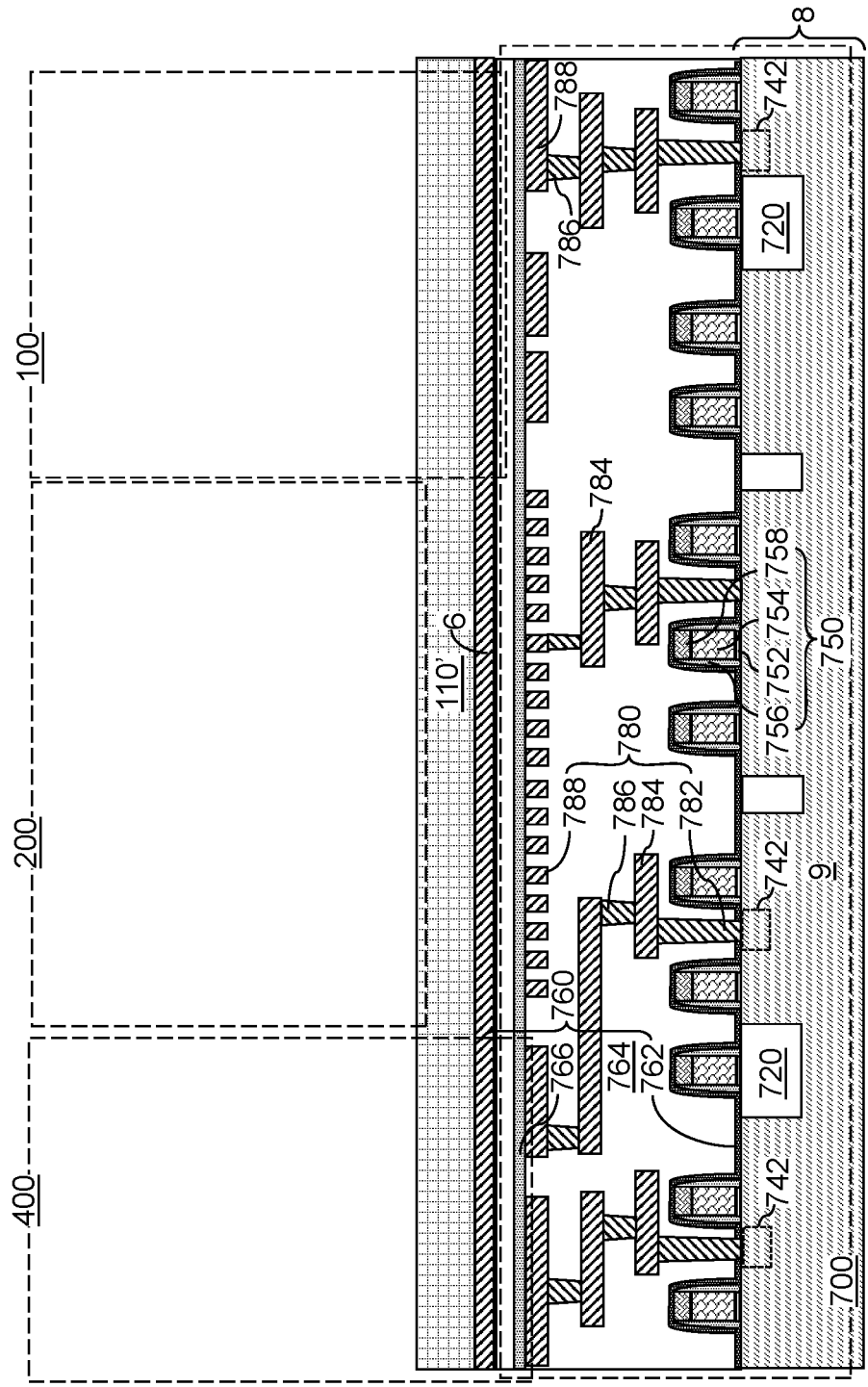
FIG. 8 is a vertical cross-sectional view of the exemplary structure after formation of an in-process source-level structure according to an embodiment of the present disclosure.

Referring to FIG. 8, the exemplary structure is illustrated after formation of the in-process source-level structure 110'.

Figure 9:
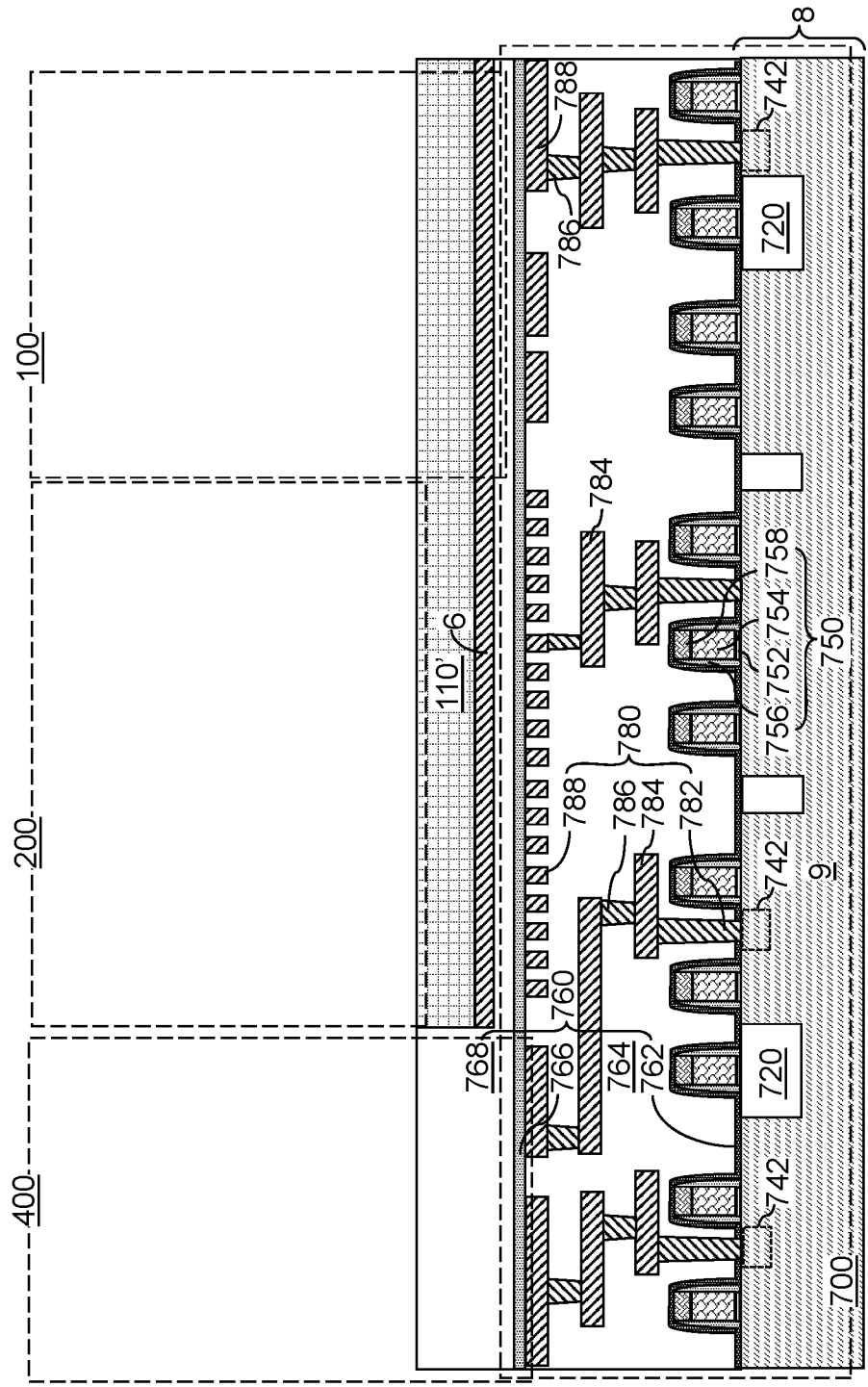
FIG. 9 is a vertical cross-sectional view of the exemplary structure after patterning the in-process source-level structure according to an embodiment of the present disclosure.

Referring to FIG. 9, the in-process source-level structure 110' may be patterned, for example, by applying and patterning a photoresist layer such that the patterned portion of the photoresist layer covers the memory array region 100 and the staircase region 200, and by etching unmasked portion of the in-process source-level structure 110' and the optional conductive plate layer 6 by performing an etch process (such as an anisotropic etch process) that employs the patterned photoresist layer as an etch mask. The patterned photoresist layer can be subsequently removed, for example, by ashing. A dielectric fill material can be deposited in volumes from which the materials of the in-process source-level structure 110' and the optional conductive plate layer 6. Excess portions of the dielectric fill material can be removed from above the horizontal plane including the top surface of the in-process source-level structure by a planarization process. Remaining portions of the dielectric fill material may be incorporated into the at least one second dielectric layer 768.

Figure 10:
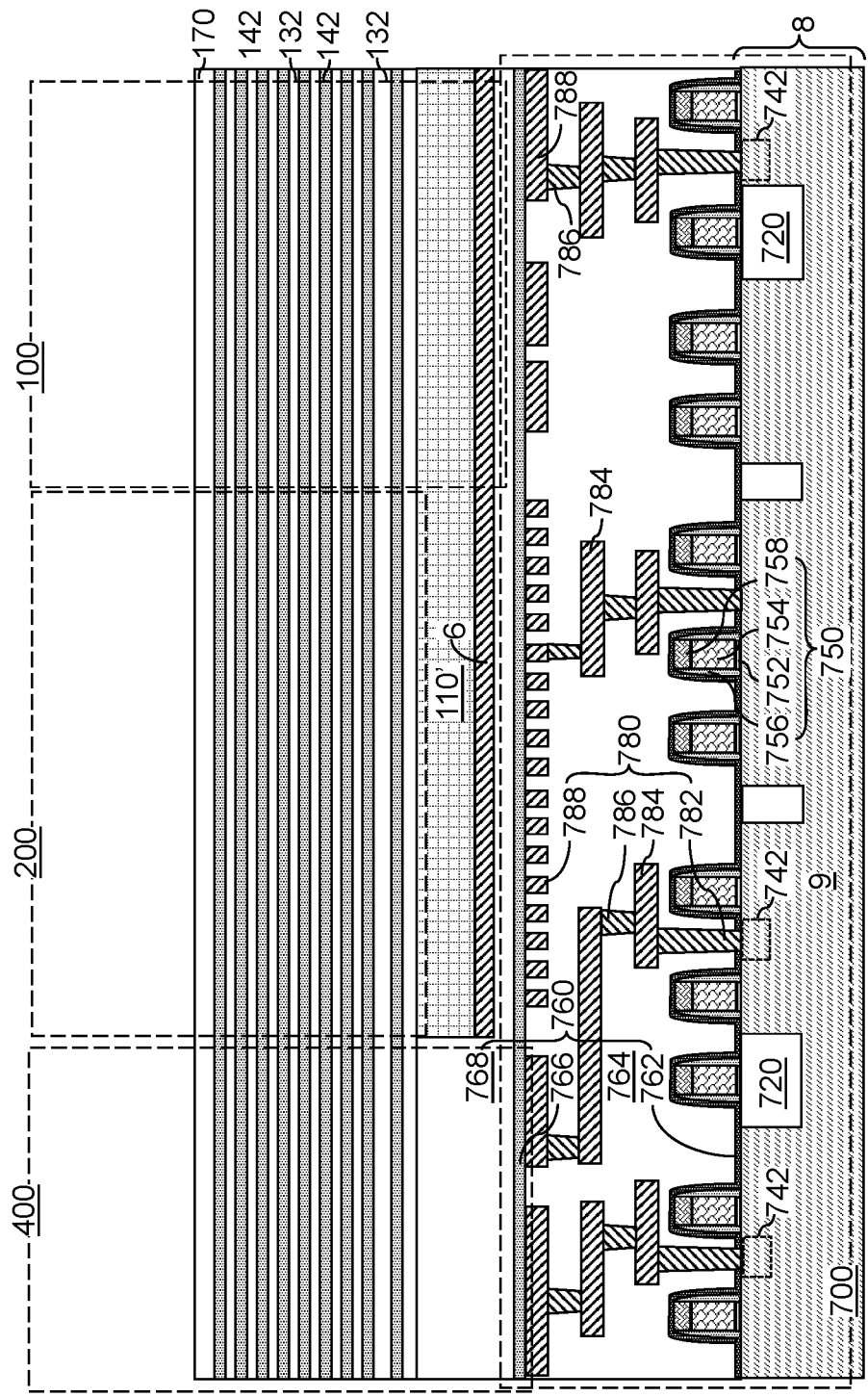
FIG. 10 is a vertical cross-sectional view of the exemplary structure after formation of a first-tier alternating stack of first insulting layers and first spacer material layers according to an embodiment of the present disclosure.

Referring to FIG. 10, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level structure 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 11:
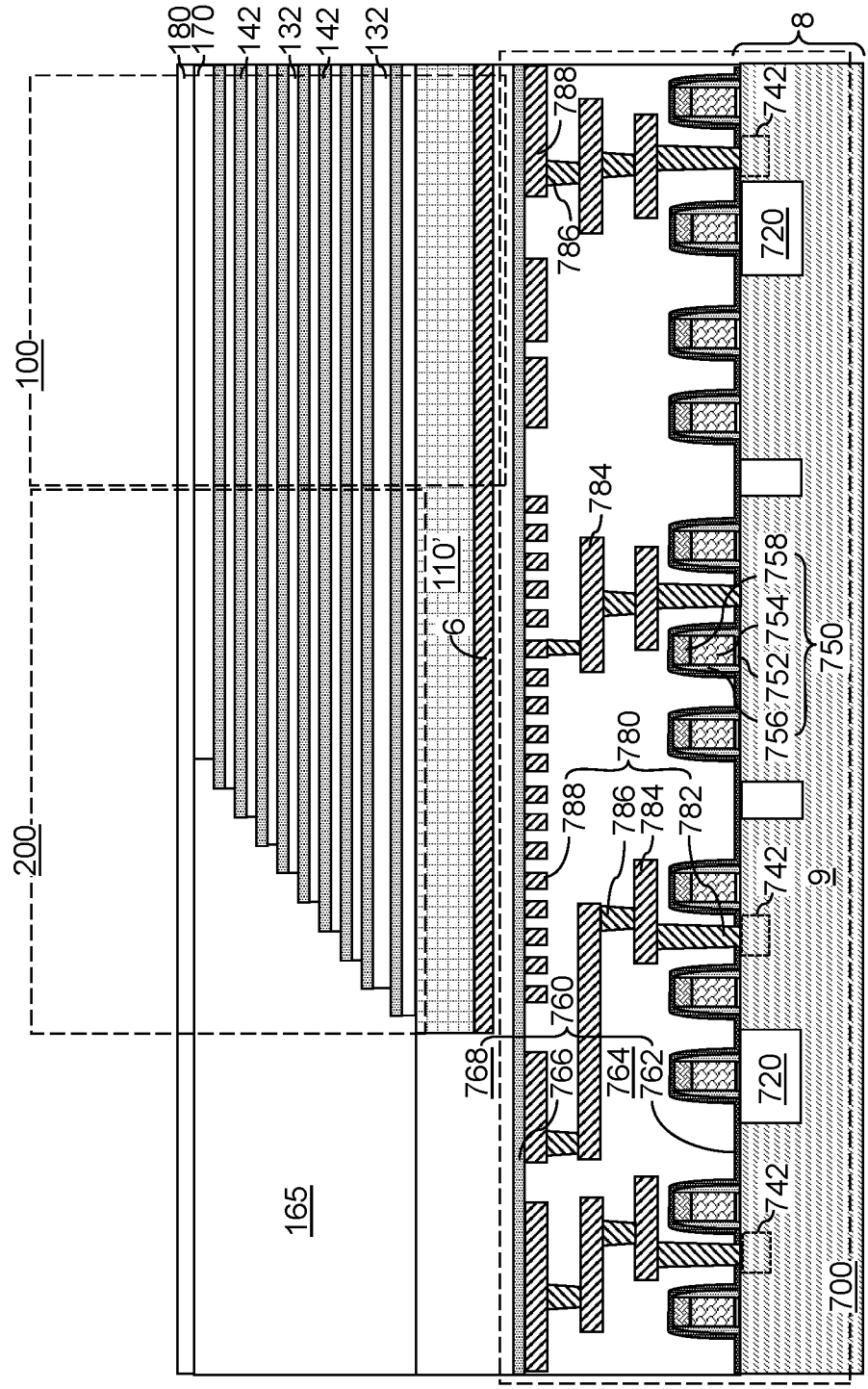
FIG. 11 is a vertical cross-sectional view of the exemplary structure after patterning a first-tier staircase region, a first retro-stepped dielectric material portion, and an inter-tier dielectric layer according to an embodiment of the present disclosure.
Figure 12A:
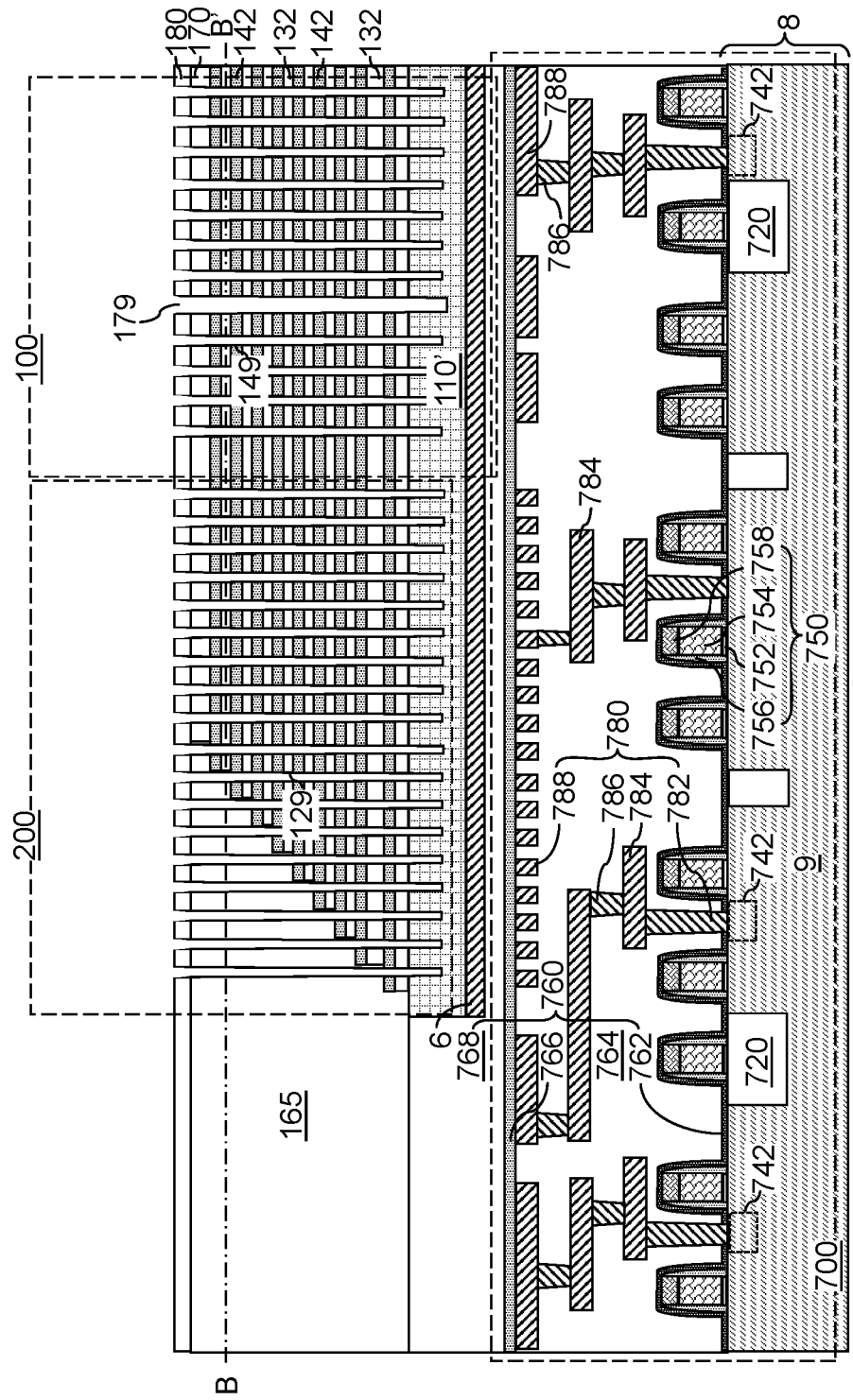
FIG. 12A is a vertical cross-sectional view of the exemplary structure after formation of first-tier memory openings and first-tier support openings according to an embodiment of the present disclosure.
Figure 12B:
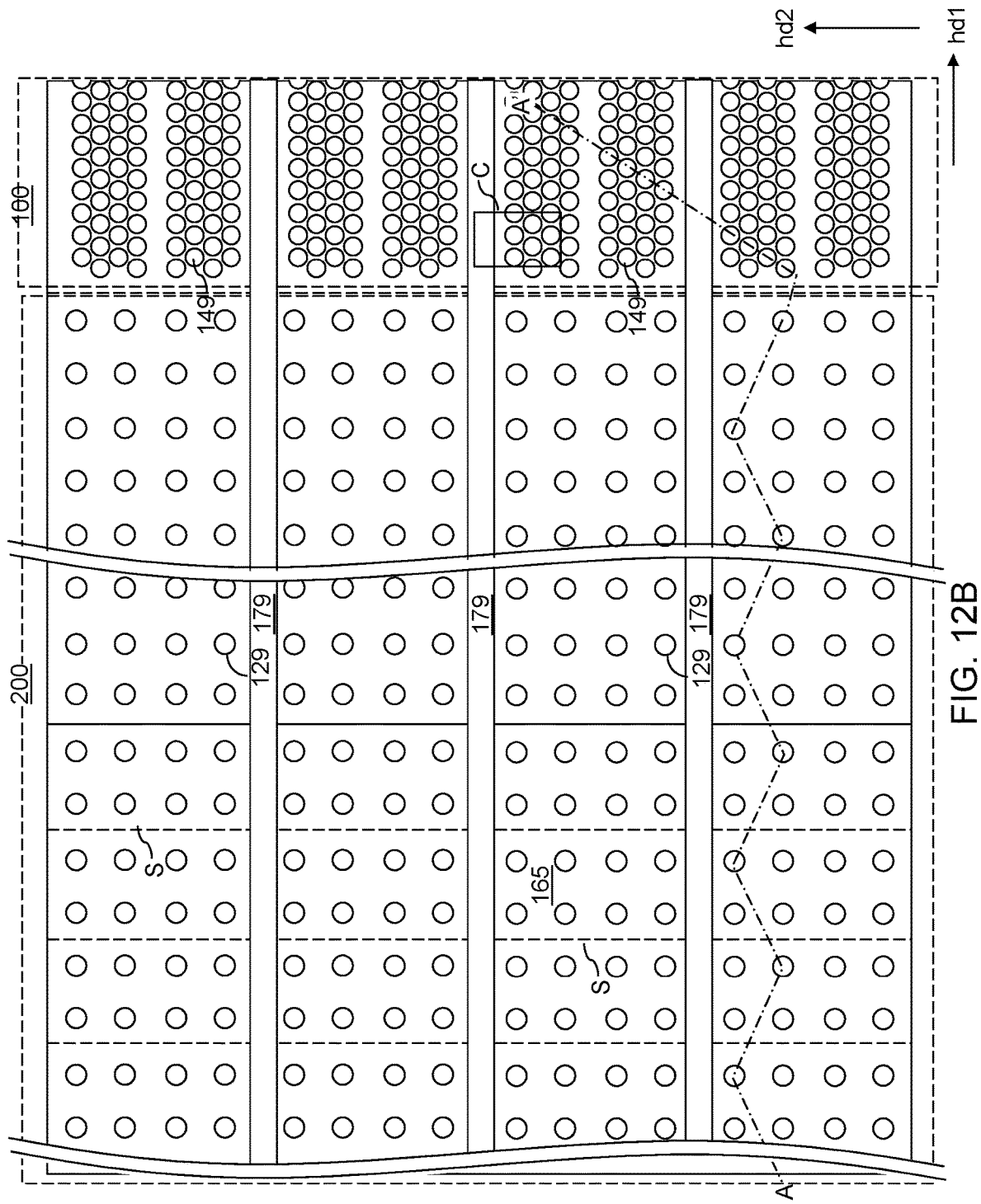
FIG. 12B is a horizontal cross-sectional view of the exemplary structure of FIG. 12A. The hinged vertical plane A-A' corresponds to the plane of the vertical cross-sectional view of FIG. 4A.
Figure 13A:
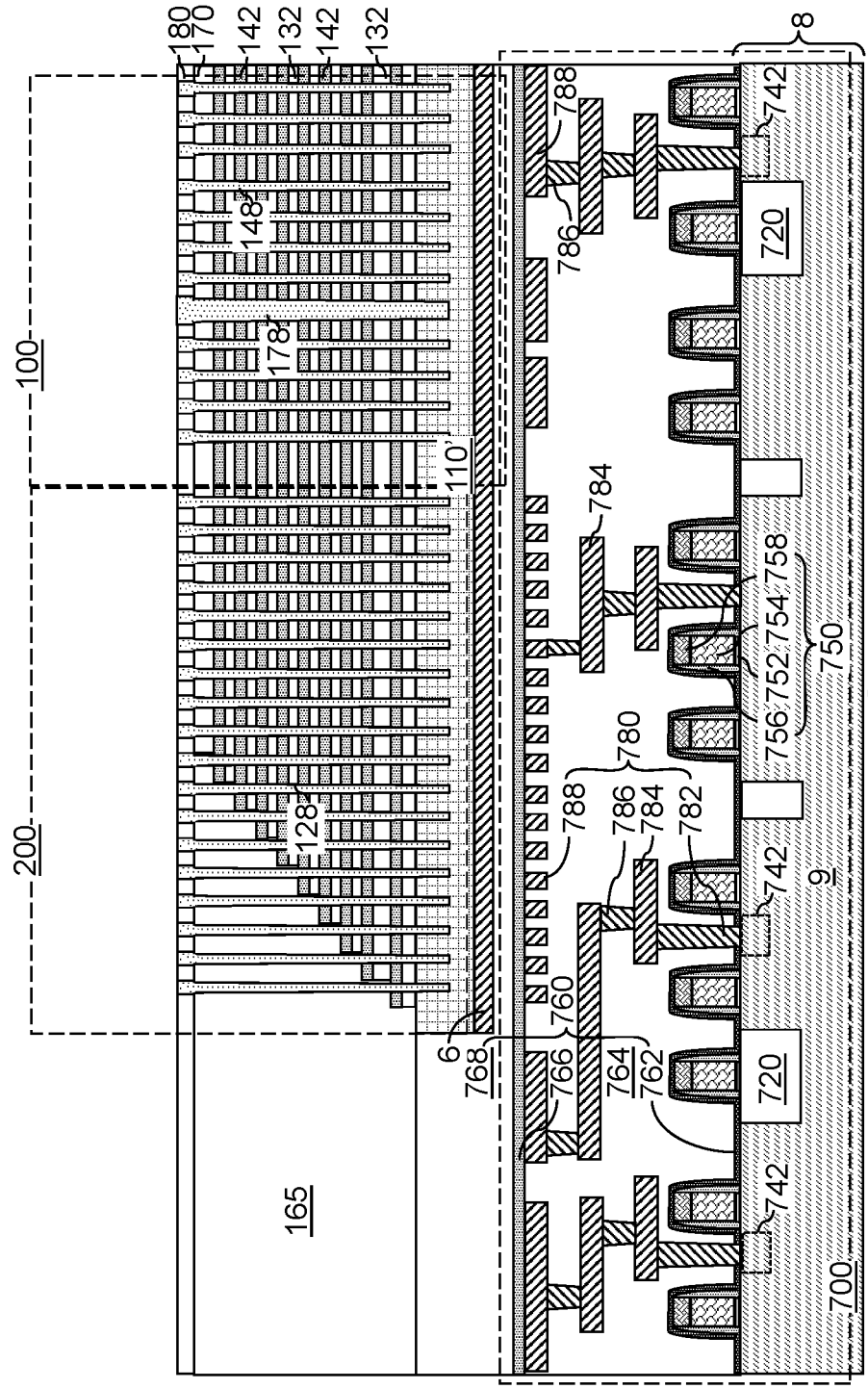
FIG. 13A is a vertical cross-sectional view of the exemplary structure after formation of various first-tier sacrificial fill structures according to an embodiment of the present disclosure.
Figure 13B:
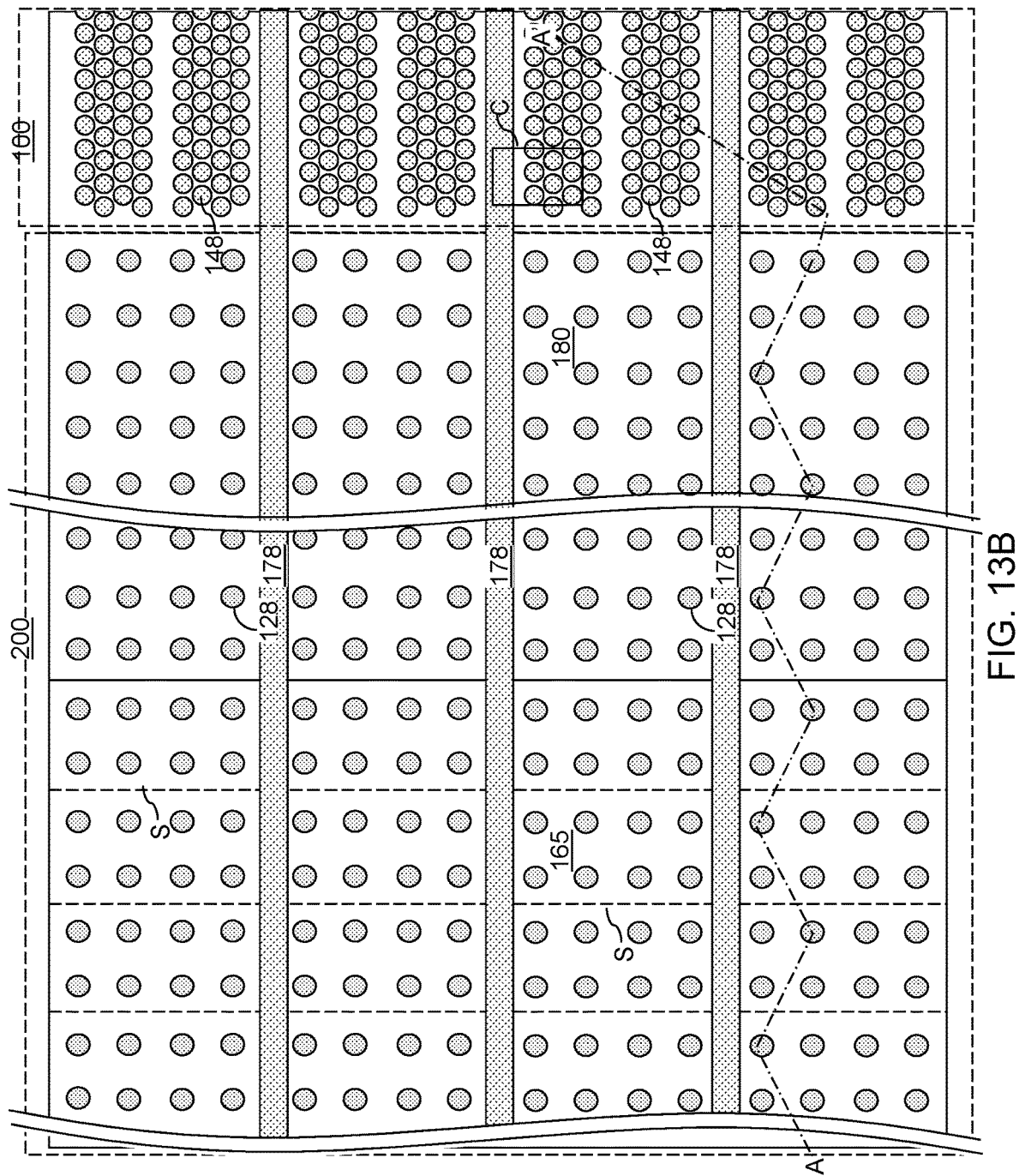
FIG. 13B is a horizontal cross-sectional view of the exemplary structure of FIG. 13A. The hinged vertical plane A-A' corresponds to the plane of the vertical cross-sectional view of FIG. 13A.

Referring to FIG. 11, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Referring to FIGS. 12A-12E, various first-tier openings (149, 129, 179) may be formed through the inter-tier dielectric layer 180 and the first-tier structure (132, 142, 170, 165) and into the in-process source-level structure 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level structure 110' by a first anisotropic etch process to form the various first-tier openings (149, 129, 179) concurrently, i.e., during the first isotropic etch process. The various first-tier openings (149, 129, 179) may include first-tier memory openings 149, first-tier support openings 129, and first-tier backside openings. In this embodiment, the first-tier backside openings comprise first-tier backside trenches 179. As will be discussed with regard to the first through third alternative embodiments below, the backside trenches 179 may be replaced with discrete backside openings, such as cylindrical openings. The backside openings may be arranged in rows along the first horizontal direction hd1. Locations of steps S in the first-tier alternating stack (132, 142) are illustrated as dotted lines in FIG. 12B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149. According to an aspect of the present disclosure, the sacrificial source-level rails (103, 104, 105) may be employed as etch stop structures during formation of the first-tier memory openings 149. In one embodiment, physically exposed portions of the upper sacrificial liners 105 may, or may not, be etched through. In one embodiment, portions of the upper sacrificial liners 105 may remain after the anisotropic etch process. Alternatively, physically exposed portions of the upper sacrificial liners 105 may be removed, and segments of top surfaces of the sacrificial material cores 104 may be physically exposed at the bottom of the first-tier memory openings 149. Generally, the upper sacrificial liners 105 and/or the sacrificial material cores 104 may be employed as etch stop structures for the anisotropic etch process that forms the various first-tier openings (149, 129, 179).

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

The first-tier backside trenches 179 are trenches that laterally extend through the memory array region 100 and the staircase region 200 along the first horizontal direction between neighboring clusters of first-tier memory openings 149 and neighboring clusters of first-tier support openings 129. Each first-tier backside trench 179 laterally extends along a first horizontal direction hd1 that is perpendicular to an interface between the memory array region 100 and the staircase region 200, and may have a uniform width along a second horizontal direction hd2 that is parallel to the interface between the memory array region 100 and the staircase region 200. The first-tier backside trenches 179 may be laterally spaced apart from each other along the second horizontal direction hd2. Thus, the sacrificial material cores 104 may extend perpendicular to the first-tier backside trenches 179.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129, 179) may be substantially vertical, or may be tapered. The photoresist layer may be subsequently removed, for example, by ashing.

Referring to FIGS. 13A-13E, sacrificial first-tier opening fill portions (148, 128, 178) may be formed in the various first-tier openings (149, 129, 179). For example, a sacrificial first-tier fill material is concurrently deposited in each of the first-tier openings (149, 129, 179). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128, 178). Specifically, each remaining portion of the sacrificial material in a first-tier memory opening 149 constitutes a sacrificial first-tier memory opening fill portion 148. In one embodiment, one, a plurality, or each, of the first-tier memory opening fill portions 148 may comprise a respective downward-protruding portion that protrudes downward from a horizontal plane including horizontal interfaces between the first-tier memory opening fill portions 148 and the sacrificial source-level rails (103, 104, 105). Each remaining portion of the sacrificial material in a first-tier support opening 129 constitutes a sacrificial first-tier support opening fill portion 128. Each remaining portion of the sacrificial material in a first-tier backside trench 179 constitutes a sacrificial first-tier backside trench fill portion 178. The various sacrificial first-tier opening fill portions (148, 128, 178) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128, 178) may be coplanar with the top surface of the inter-tier dielectric layer 180. Each of the sacrificial first-tier opening fill portions (148, 128, 178) may, or may not, include cavities therein.

Figure 14:
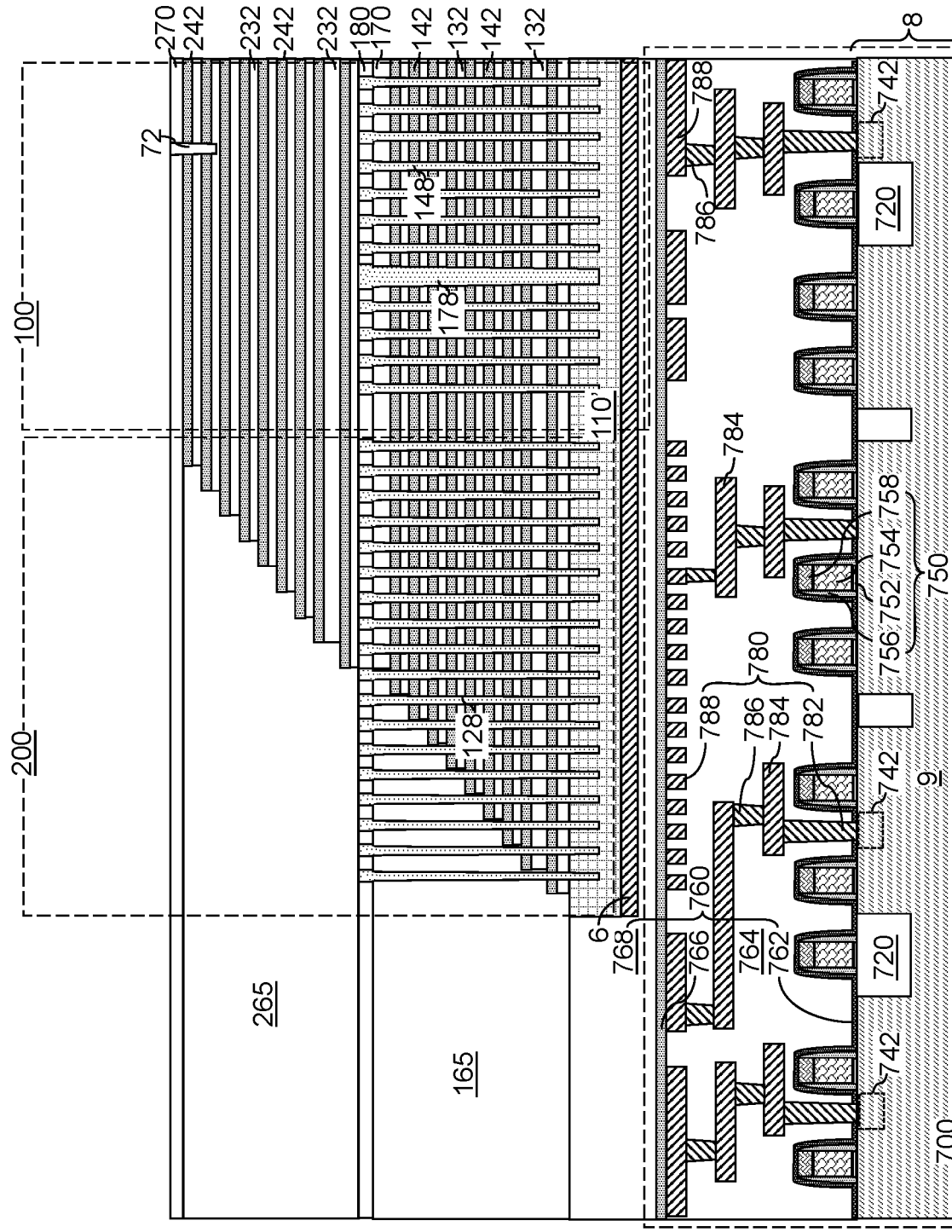
FIG. 14 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 14, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level structure 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1.

The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 15A:
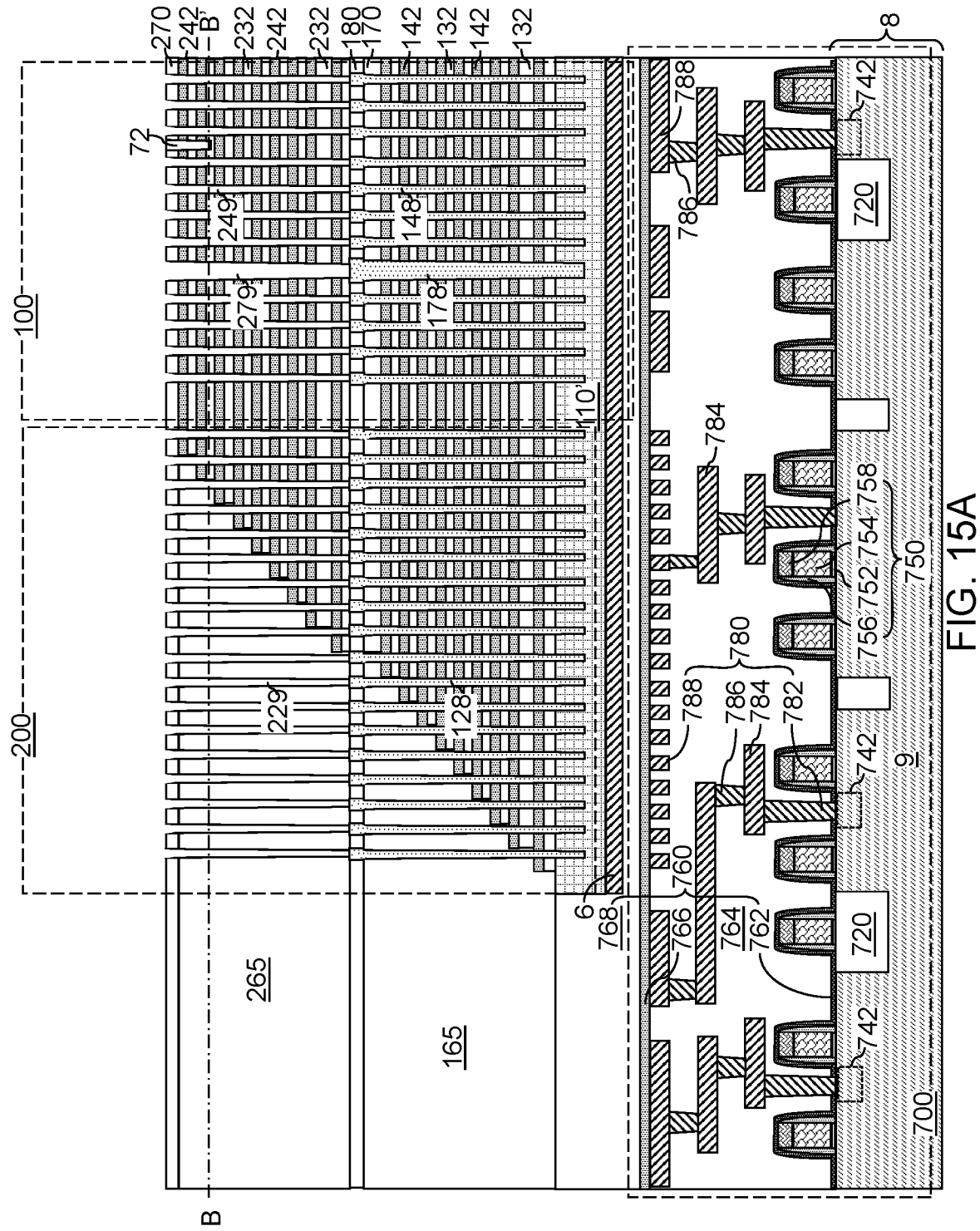
FIG. 15A is a vertical cross-sectional view of the exemplary structure after formation of second-tier memory openings and second-tier support openings according to an embodiment of the present disclosure.
Figure 15B:
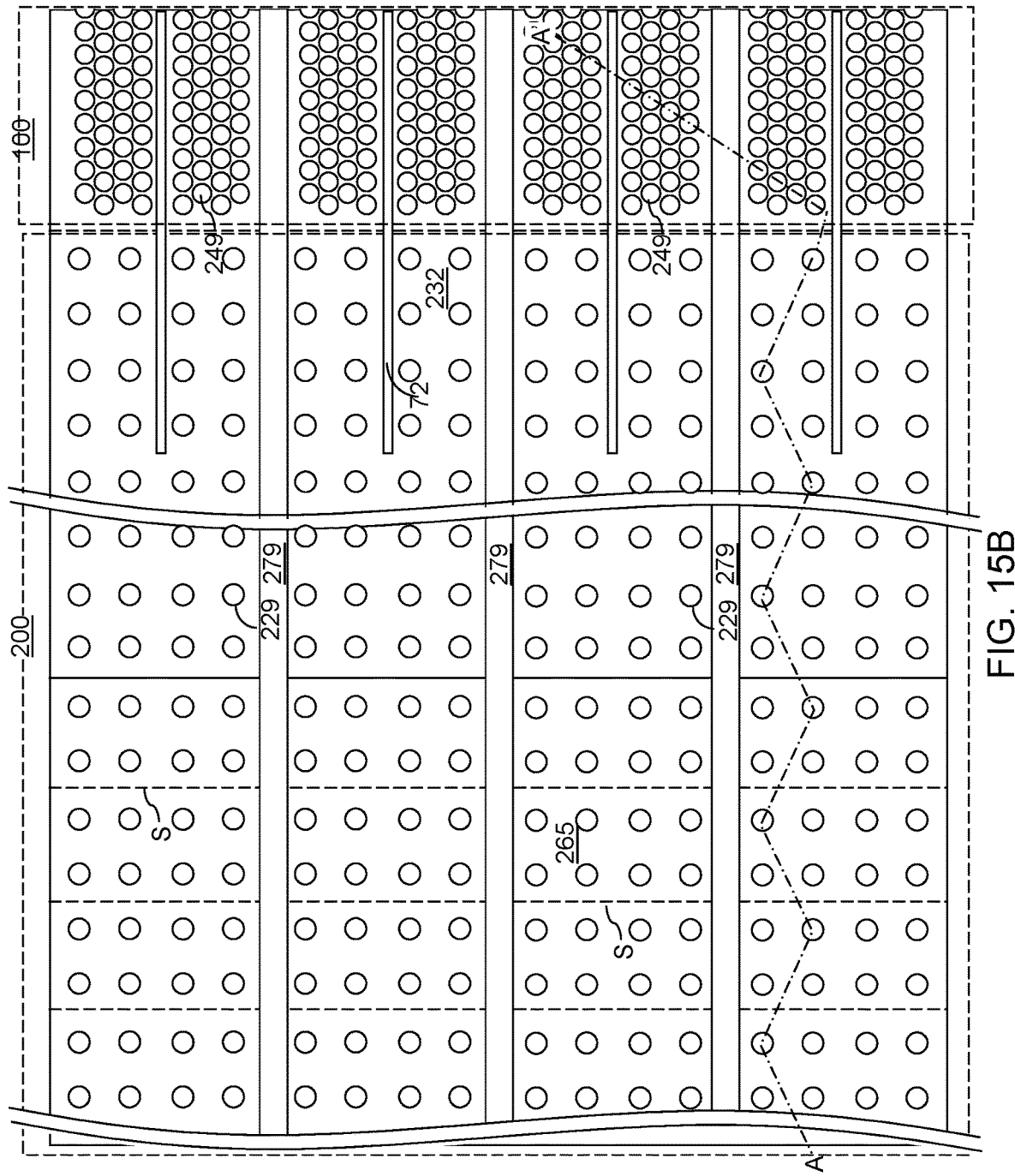
FIG. 15B is a horizontal cross-sectional view of the exemplary structure along the horizontal plane B-B' of FIG. 15A. The hinged vertical plane A-A' corresponds to the plane of the vertical cross-sectional view of FIG. 15A.

Referring to FIGS. 15A and 15B, various second-tier openings (249, 229, 279) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129, 179), which is the same as the sacrificial first-tier opening fill portions (148, 128, 178). Thus, the lithographic mask used to pattern the first-tier openings (149, 129, 179) may be used to pattern the photoresist layer.

The pattern of openings in the photoresist layer may be transferred through the second-tier structure (232, 242, 265, 270, 72) by a second anisotropic etch process to form various second-tier openings (249, 229, 279) concurrently, i.e., during the second anisotropic etch process. The various second-tier openings (249, 229, 279) may include second-tier memory openings 249, second-tier support openings 229, and second-tier backside openings. In this embodiment, the second-tier backside openings comprise second-tier backside trenches 279. However, in alternative embodiments described below, rows of discrete second-tier backside openings extending in the first horizontal direction hd1 may be formed instead of the trenches.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. The second-tier backside trenches 279 are formed directly on a top surface of a respective one of the first-tier backside trench fill portions 178. In one embodiment, each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229, 279) may be substantially vertical, or may be tapered. A bottom periphery of each second-tier opening (249, 229, 279) may be laterally offset, and/or may be located entirely within, a periphery of a top surface of an underlying sacrificial first-tier opening fill portion (148, 128, 178). The photoresist layer may be subsequently removed, for example, by ashing.

Figure 16A:
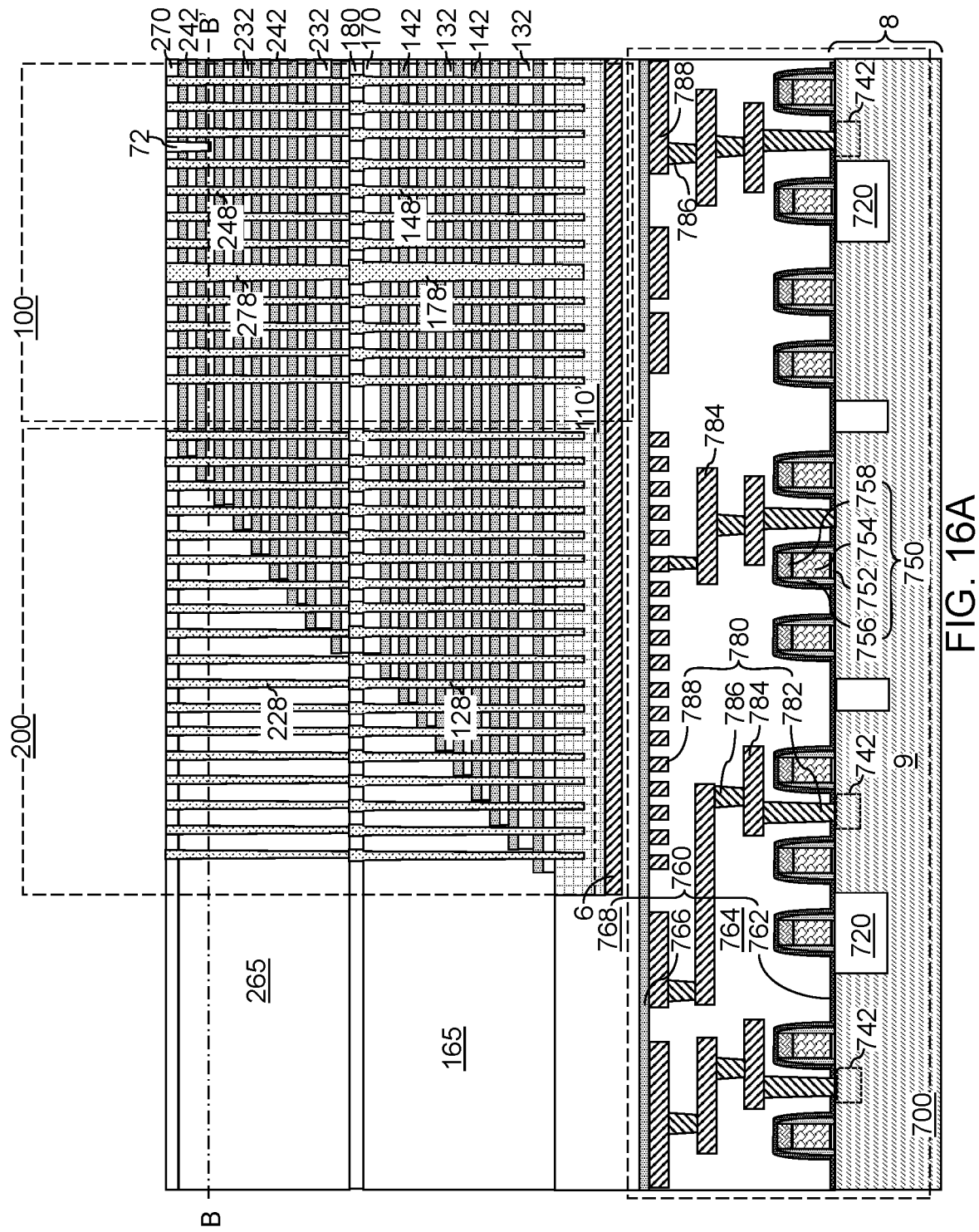
FIG. 16A is a vertical cross-sectional view of the exemplary structure after formation of various second-tier sacrificial fill structures according to an embodiment of the present disclosure.
Figure 16B:
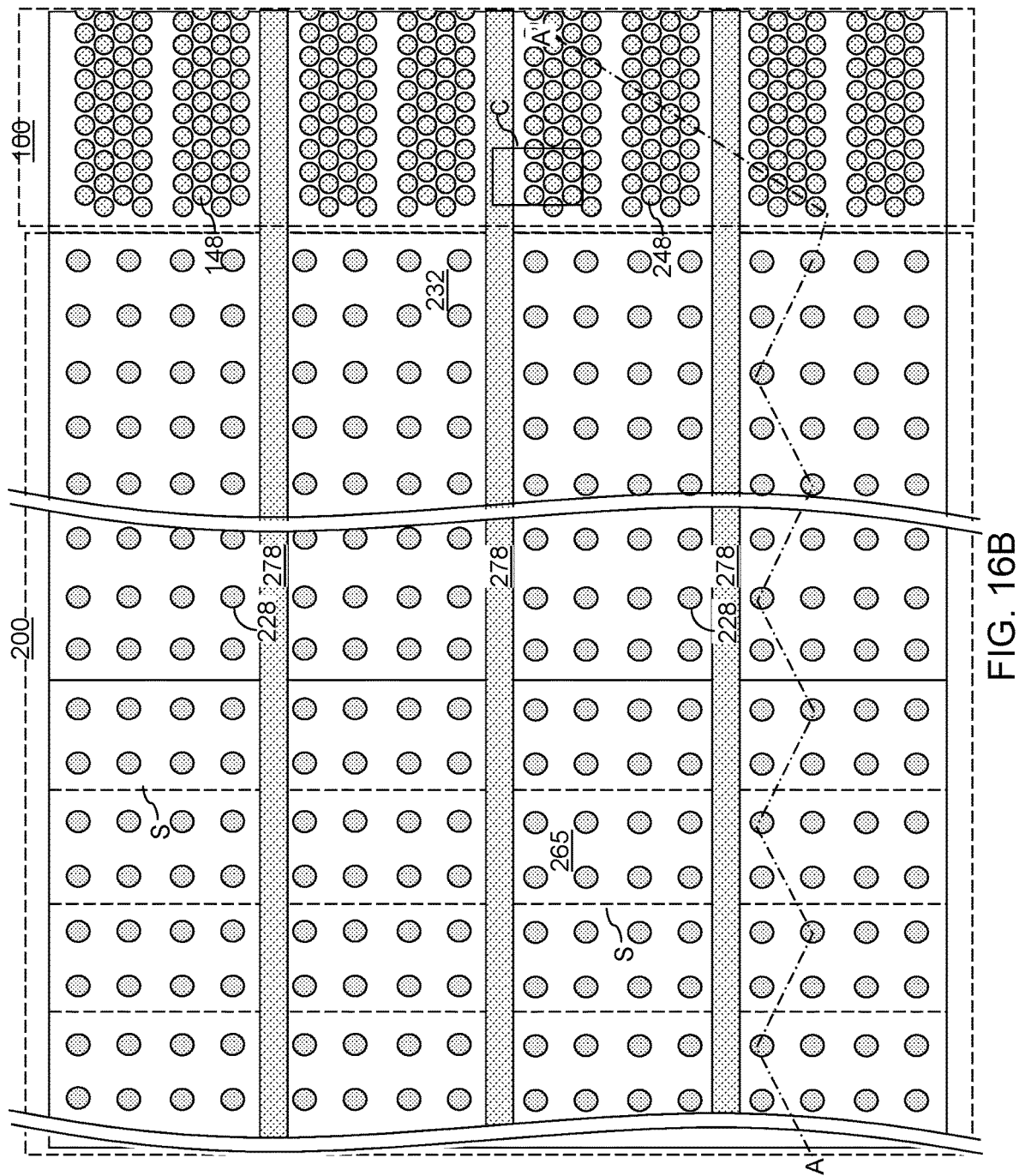
FIG. 16B is a horizontal cross-sectional view of the exemplary structure of FIG. 16A. The hinged vertical plane A-A' corresponds to the plane of the vertical cross-sectional view of FIG. 16A.
Figure 17A:
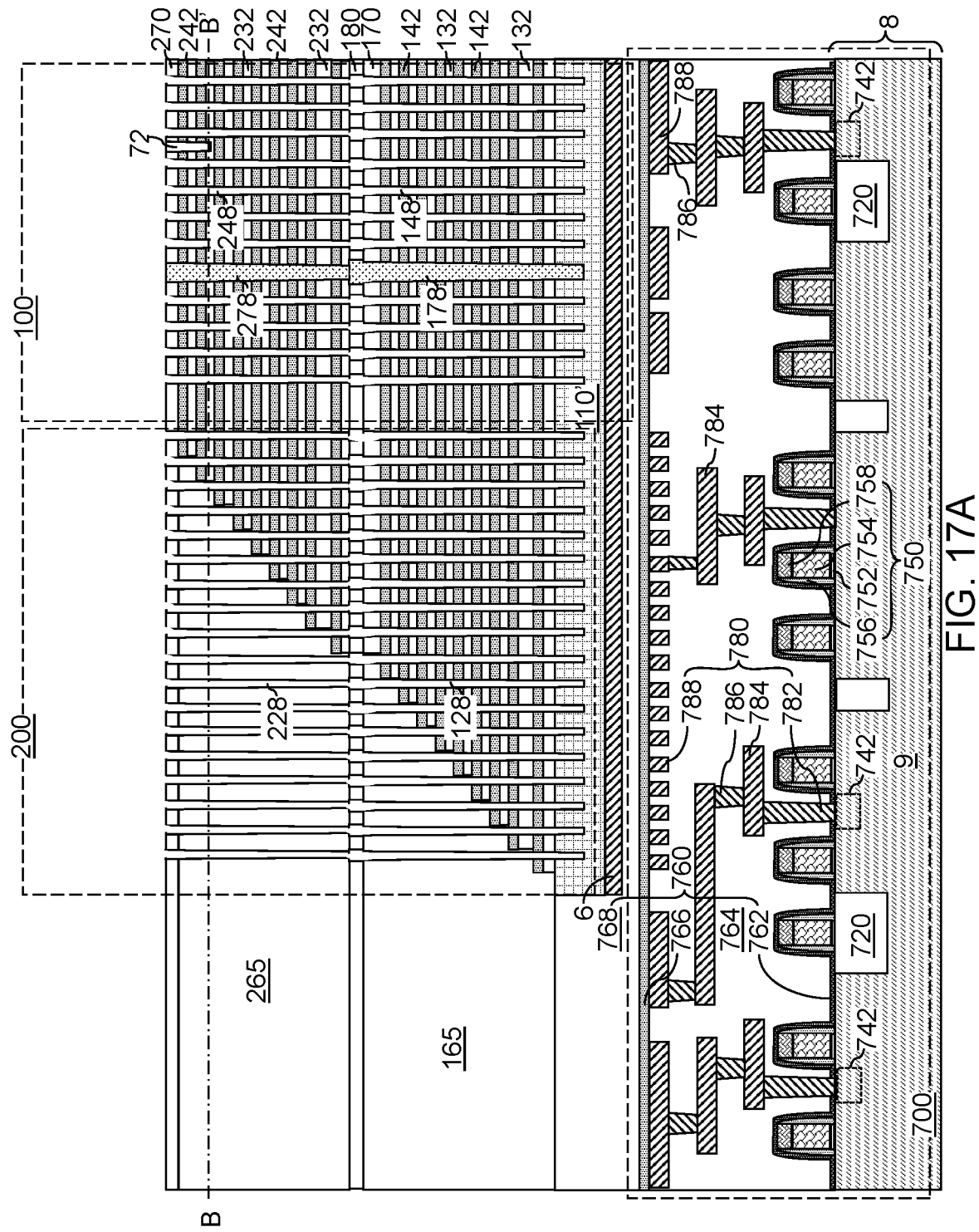
FIG. 17A is a vertical cross-sectional view of the exemplary structure after formation of inter-tier memory openings and inter-tier support openings according to an embodiment of the present disclosure.
Figure 17B:
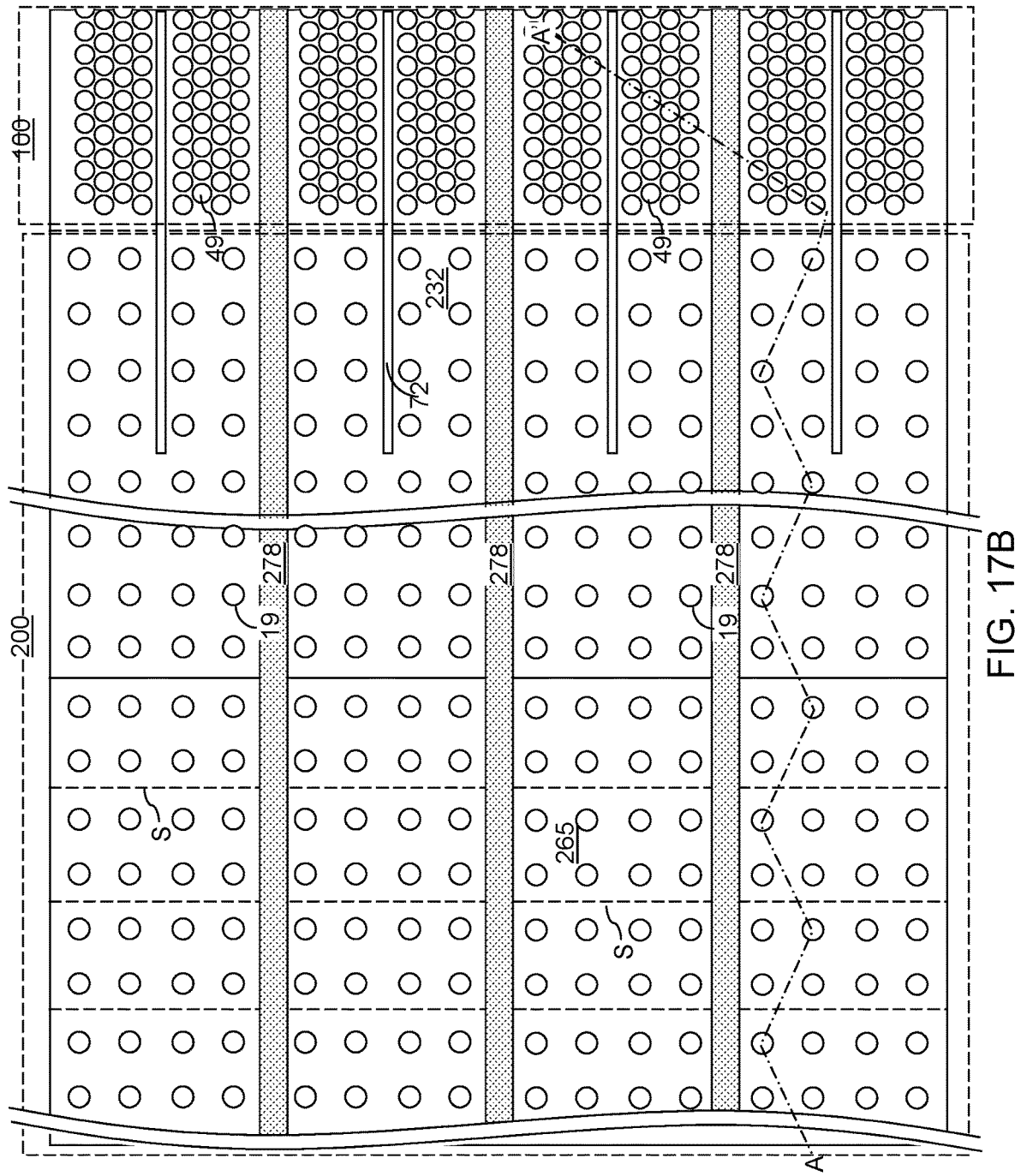
FIG. 17B is a horizontal cross-sectional view of the exemplary structure of FIG. 17A. The hinged vertical plane A-A' corresponds to the plane of the vertical cross-sectional view of FIG. 17A.
Figure 17E:
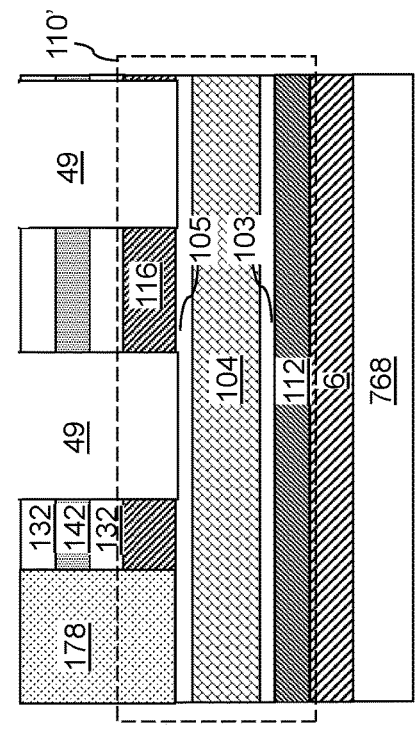
FIG. 17E is a vertical cross-sectional view along the vertical plane E-E' of FIG. 17C.
Figure 17C:
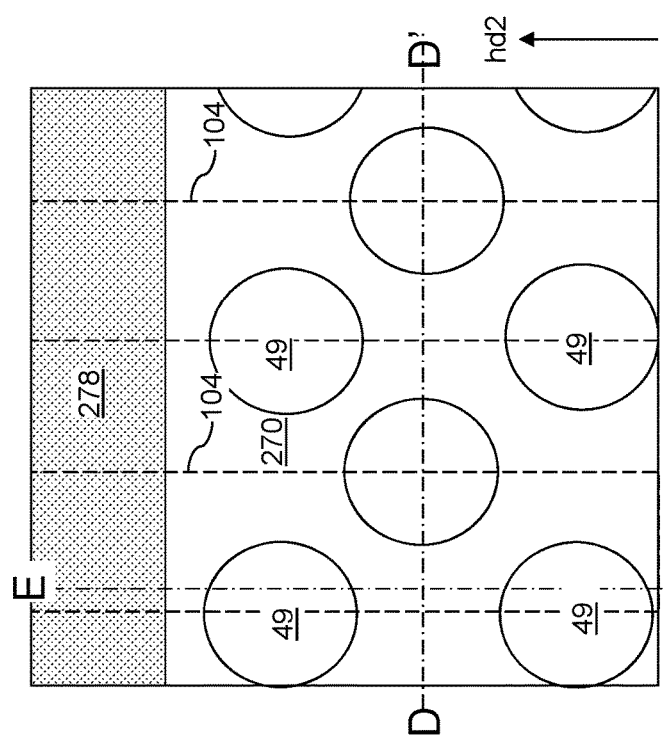
FIG. 17C is a top-down view of a region C of FIG. 17B.
Figure 17D:
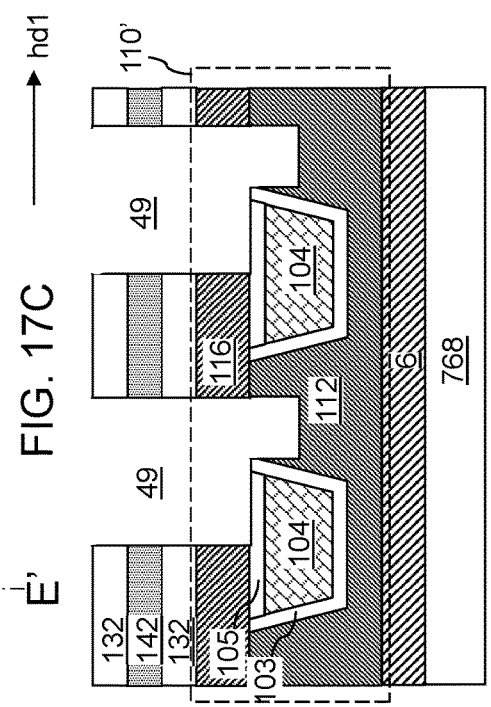
FIG. 17D is a vertical cross-sectional view along the vertical plane D-D' of FIG. 17C.
Figure 19A:
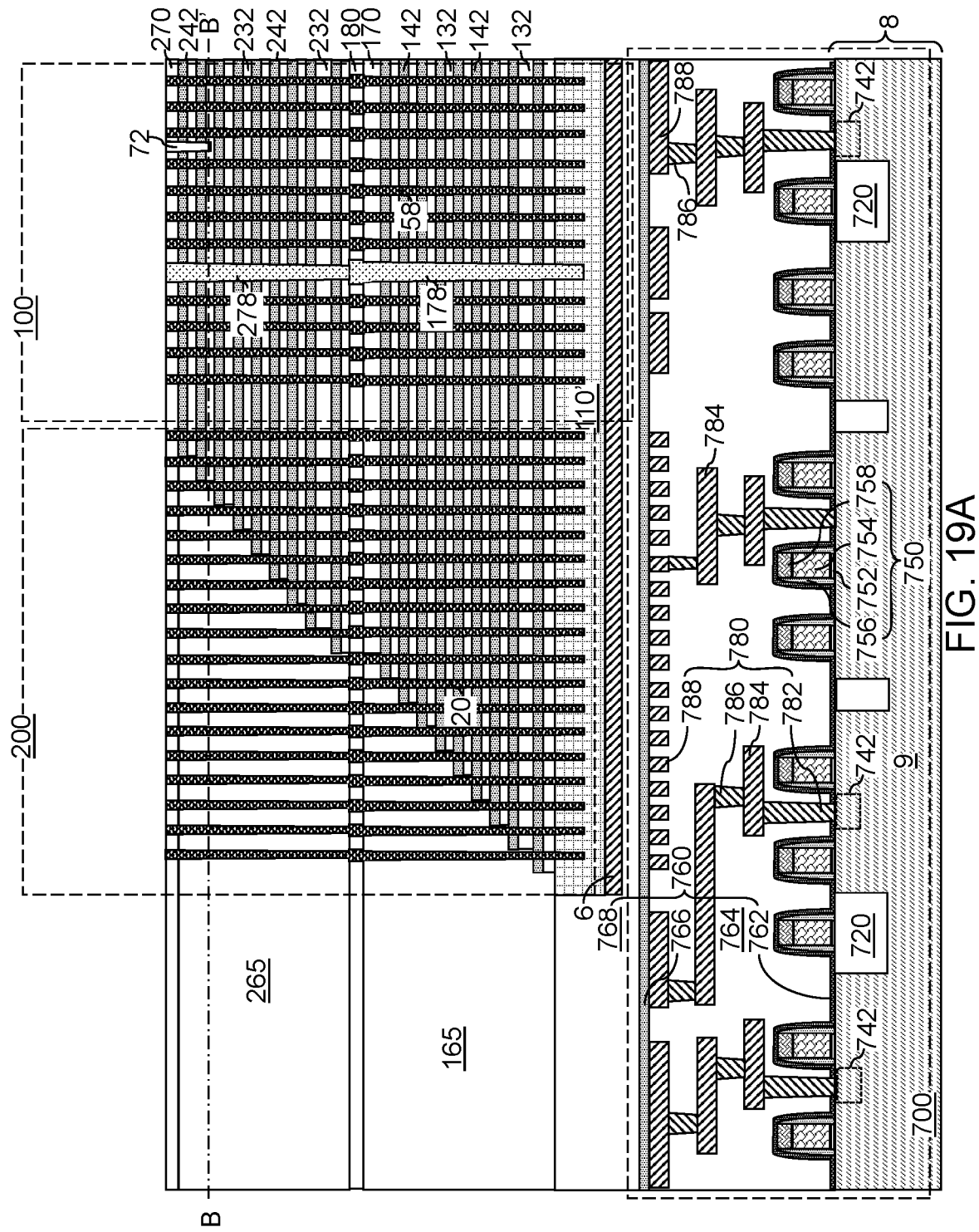
FIG. 19A is a vertical cross-sectional view of the exemplary structure after formation of memory opening fill structures and support pillar structures according to an embodiment of the present disclosure.
Figure 19B:
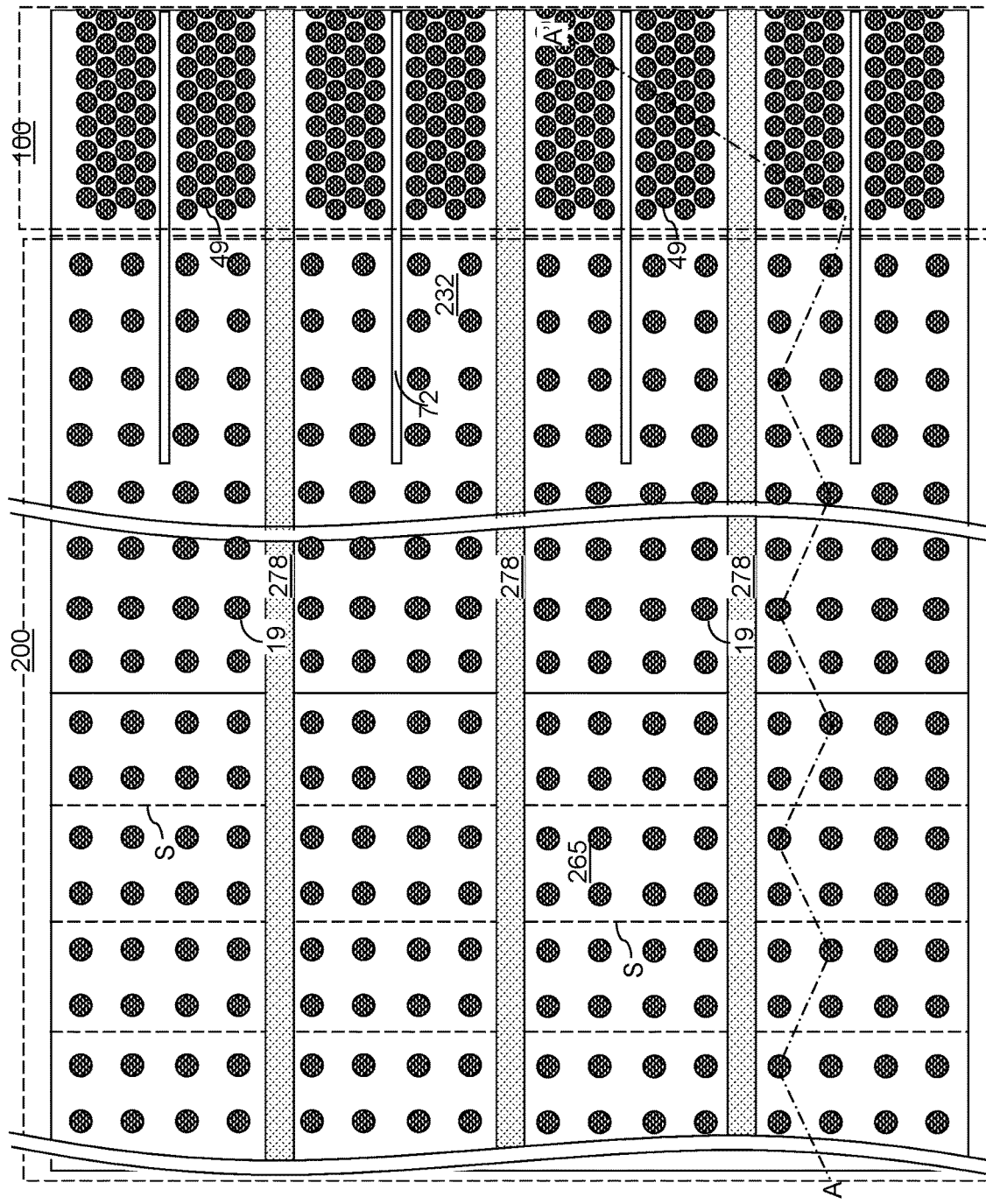
FIG. 19B is a horizontal cross-sectional view of the exemplary structure along the horizontal plane B-B' of FIG. 19A. The hinged vertical plane A-A' corresponds to the plane of the vertical cross-sectional view of FIG. 19A.
Figure 20A:
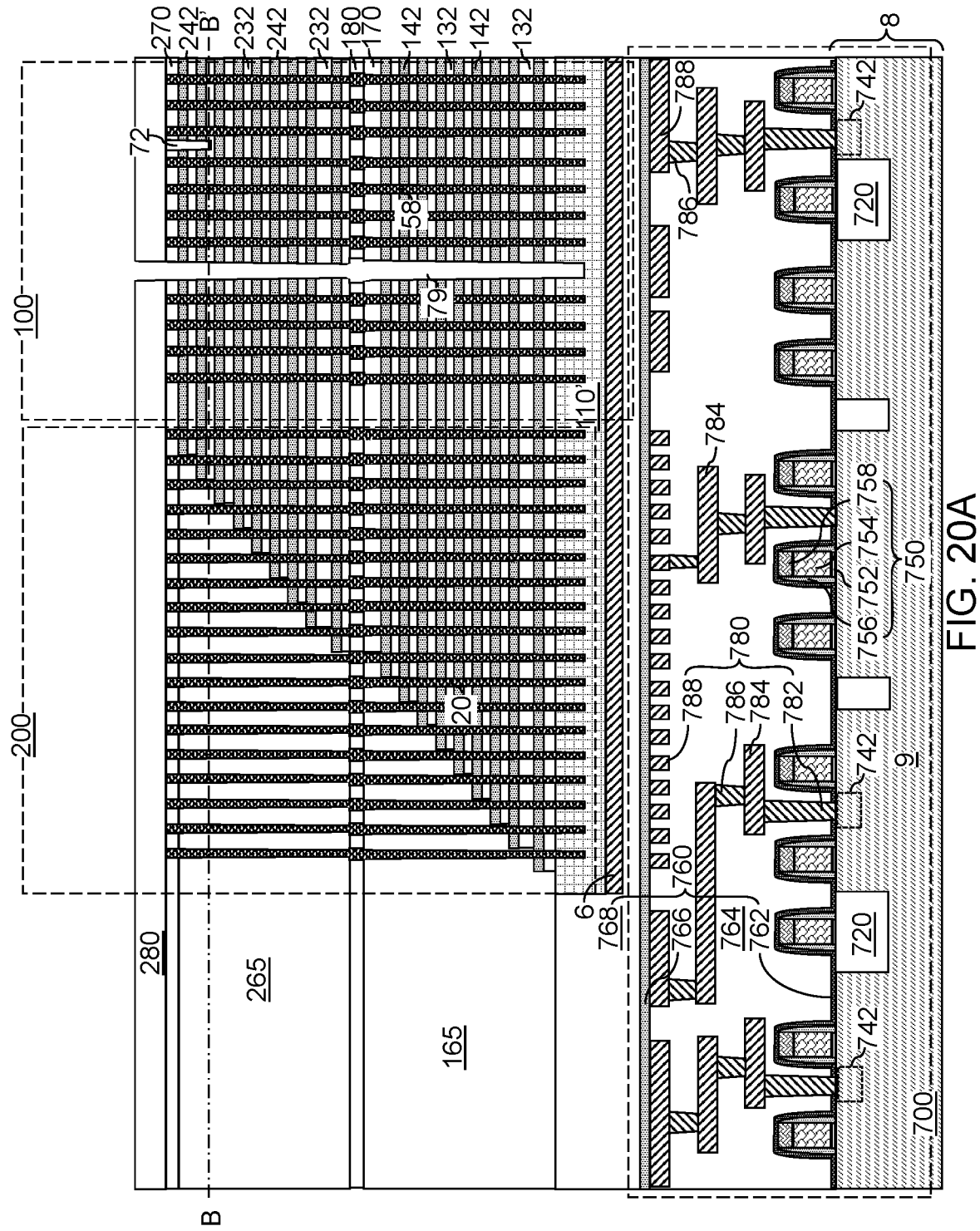
FIG. 20A is a vertical cross-sectional view of the exemplary structure after formation of backside openings according to an embodiment of the present disclosure.

Referring to FIGS. 16A and 16B, sacrificial second-tier opening fill portions (248, 228, 278) may be formed in the various second-tier openings (249, 229, 279). For example, a sacrificial second-tier fill material is concurrently deposited in each of the second-tier openings (249, 229, 279). The sacrificial second-tier fill material includes a material that may be subsequently removed selective to the materials of the second insulating layers 232 and the second sacrificial material layers 242. The sacrificial second-tier fill material may comprise any material that may be employed as the sacrificial first-tier fill material. In one embodiment, the sacrificial second-tier fill material may be the same as the sacrificial first-tier fill material.

Portions of the deposited sacrificial material may be removed from above a horizontal plane including a top surface of the second insulating cap layer 270. For example, the sacrificial second-tier fill material may be recessed to the top surface of the second insulating cap layer 270 using a planarization process. The planarization process may include a recess etch, chemical mechanical planarization (CMP), or a combination thereof. The top surface of the second insulating cap layer 270 may be used as an etch stop layer or a planarization stop layer.

Remaining portions of the sacrificial second-tier fill material comprise sacrificial second-tier opening fill portions (248, 228, 278). Specifically, each remaining portion of the sacrificial material in a second-tier memory opening 249 constitutes a sacrificial second-tier memory opening fill portion 248. Each remaining portion of the sacrificial material in a second-tier support opening 229 constitutes a sacrificial second-tier support opening fill portion 228. Each remaining portion of the sacrificial material in a second-tier backside trench 279 constitutes a sacrificial second-tier backside trench fill portion 278. The various sacrificial second-tier opening fill portions (248, 228, 278) are concurrently formed, i.e., during a same set of processes including the deposition process that deposits the sacrificial second-tier fill material and the planarization process that removes the second-tier deposition process from above the second-tier alternating stack (232, 242) (such as from above the top surface of the second insulating cap layer 270). The top surfaces of the sacrificial second-tier opening fill portions (248, 228, 278) may be coplanar with the top surface of the second insulating cap layer 270. Each of the sacrificial second-tier opening fill portions (248, 228, 278) may, or may not, include cavities therein.

Referring to FIGS. 17A-17E, a photoresist layer (not shown) may be applied over the second insulating cap layer 270, and may be lithographically patterned to cover the second-tier backside trench fill portions 278 without covering the sacrificial second-tier memory opening fill portions 249 or the sacrificial second-tier support opening fill portions 228. The sacrificial second-tier memory opening fill portions 248, the sacrificial second-tier support opening fill portions 228, the sacrificial first-tier memory opening fill portions 148, and the sacrificial first-tier support opening fill portions 128 may be removed by performing an etch process that etches the unmasked portions of the sacrificial second-tier fill material and the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 18A-18D provide sequential cross-sectional views of a memory opening 49 during formation of a memory opening fill structure. The same structural change occurs in each of the memory openings 49 and the support openings 19.

Referring to FIG. 18A, a memory opening 49 in the first exemplary device structure of FIGS. 17A-17E is illustrated. The memory opening 49 extends through the first-tier structure and the second-tier structure.

Referring to FIG. 18B, a stack of layers including a blocking dielectric layer 52, a charge storage layer 54, a tunneling dielectric layer 56, and a semiconductor channel material layer 60L may be sequentially deposited in the memory openings 49 directly on physically exposed surfaces of the sacrificial source-level rails (103, 104, 105), the lower source-level semiconductor layer 112, and the upper source-level semiconductor layer 116. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 18C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 18D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level structure 110', the first-tier structure (132, 142, 170, 165), the second-tier structure (232, 242, 270, 265, 72), the inter-tier dielectric layer 180, the memory opening fill structures 58, and support pillar structures that are formed in the support openings 19 collectively constitute a memory-level assembly.

Referring to FIGS. 19A-19E, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Referring to FIGS. 20A-20E, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form openings in areas overlying the second-tier backside trench fill portions 278. An anisotropic etch can be performed to form trenches through the first contact-level dielectric layer 280 over the second-tier backside trench fill portions 278. Subsequently, the second-tier backside trench fill portions 278 and the first-tier backside trench fill portions 178 can be removed selective to the materials of the first-tier alternating stack (132, 142) and the second-tier alternating stack (232, 242). Backside openings can be formed volumes from which the first-tier backside trench fill portions 178 and the second-tier backside trench fill portions 278 are removed and in the etched volumes of the first contact-level dielectric layer 280. In this embodiment, the backside openings comprise backside trenches 79, which are also referred to as inter-tier backside trenches. However, in alternative embodiments described below, rows of discrete backside openings extending in the first horizontal direction hd1 may be formed instead of the trenches 79. The photoresist layer may be removed, for example, by ashing.

The backside trenches 79 are formed through the alternating stacks {(132, 142), (232, 242)} and the upper source-level semiconductor layer 116. Top surface segments of the sacrificial source-level rails (103, 104, 105) are physically exposed underneath the backside trenches 79. The memory opening fill structures 58 can be arranged in multiple rows of memory opening fill structures 58. As shown in FIG. 20C, memory opening fill structures 58 within each row of memory opening fill structures 58 can be arranged with a uniform pitch p along the second horizontal direction hd2, which is herein referred to as a second pitch. The multiple rows are laterally spaced from each other along the first horizontal direction hd1 with a periodicity having the same pitch as the pitch of the sacrificial source-level rails (103, 104, 105).

Referring to FIGS. 21A-21C, a first isotropic etch process can be performed to etch physically exposed portions of the upper sacrificial liners 105. For example, if the upper sacrificial liners 105 comprise silicon oxide, a wet etch process employing dilute hydrofluoric acid can be performed to etch portions of the upper sacrificial liners 105 that underlie the backside trenches 79. Segments of top surfaces of the sacrificial material cores 104 can be physically exposed underneath the backside trenches 79.

Referring to FIGS. 22A-22C, a second isotropic etch process can be performed to etch the sacrificial material cores 104 selective to the materials of the lower sacrificial liners 103, the upper sacrificial liners 105, and the alternating stacks {(132, 142), (232, 242)}, and optionally selective to the upper source-level semiconductor layer 116. For example, in case the sacrificial material cores 104 comprise a metallic material, a wet etch process that etches the metallic material selective to the materials of the alternating stacks {(132, 142), (232, 242)} can be performed. For example, if the sacrificial material cores 104 comprise TiN, then an etchant comprising ammonium hydroxide, hydrogen peroxide, and deionized water may be used. Alternatively, phosphoric acid may be used, since TiN has a much higher etch rate in phosphoric acid than silicon nitride or silicon oxide. Source cavities 109 are formed in volumes from which the sacrificial material cores 104 are removed.

Figure 23A:
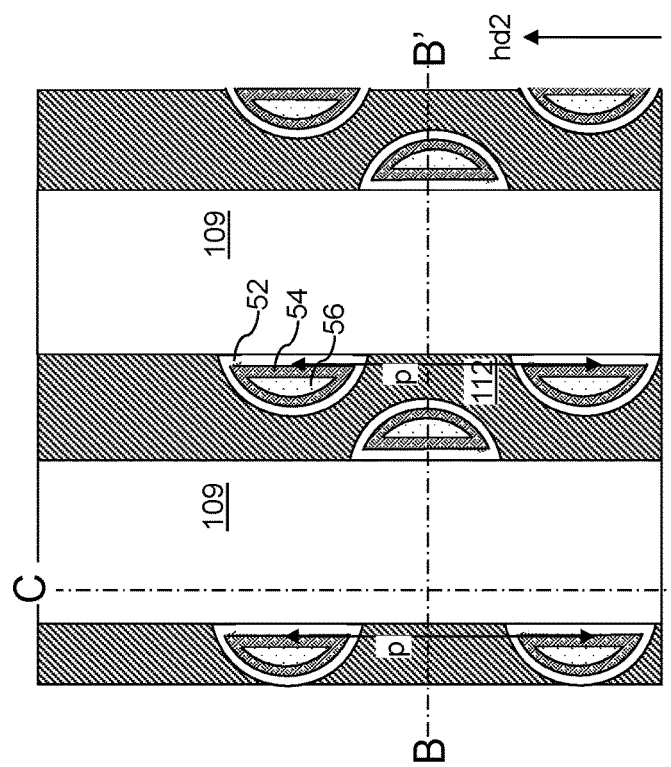
FIG. 23A is a top-down view of a region of the exemplary structure after removal of the lower sacrificial capping liners and upper sacrificial capping liners.
Figure 23C:
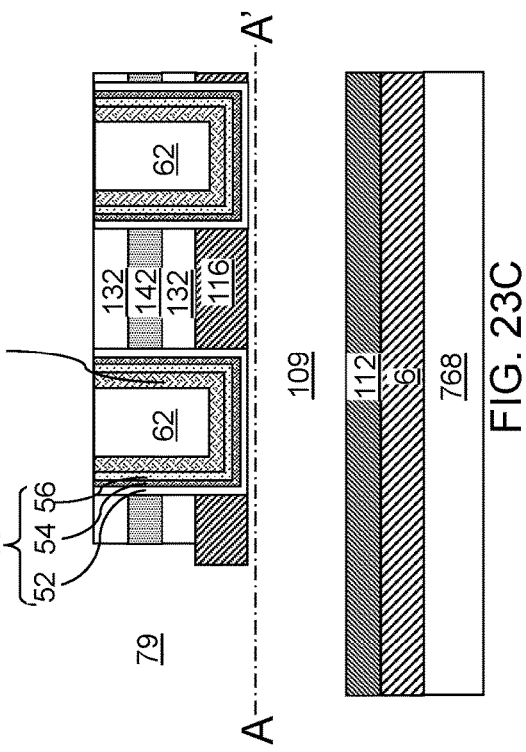
FIG. 23C is a vertical cross-sectional view along the vertical plane C-C' of FIG. 23A.
Figure 23B:
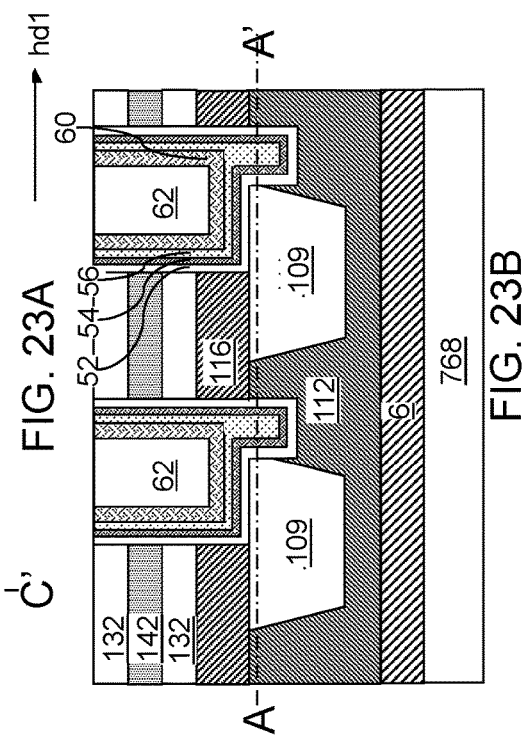
FIG. 23B is a vertical cross-sectional view along the vertical plane B-B' of FIG. 20A.

Referring to FIGS. 23A-23C, a third isotropic etch process can be performed to etch the upper sacrificial liners 105 and the lower sacrificial liners 103. For example, if the upper sacrificial liners 105 and the lower sacrificial liners 103 comprise silicon oxide, a wet etch process employing dilute hydrofluoric acid may be performed to remove the upper sacrificial liners 105 and the lower sacrificial liners 103 through the source cavities 109.

Generally, the sacrificial source-level rails (103, 104, 105) can be removed after formation of the memory opening fill structures 58 to form the source cavities 109. The sacrificial source-level rails (103, 104, 105) can be removed by performing at least one isotropic etch process. The etch process may widen the trenches 79 at the levels of the alternating stacks, which may cause the upper source-level semiconductor layer 116 to protrude into the trenches.

Figure 24A:
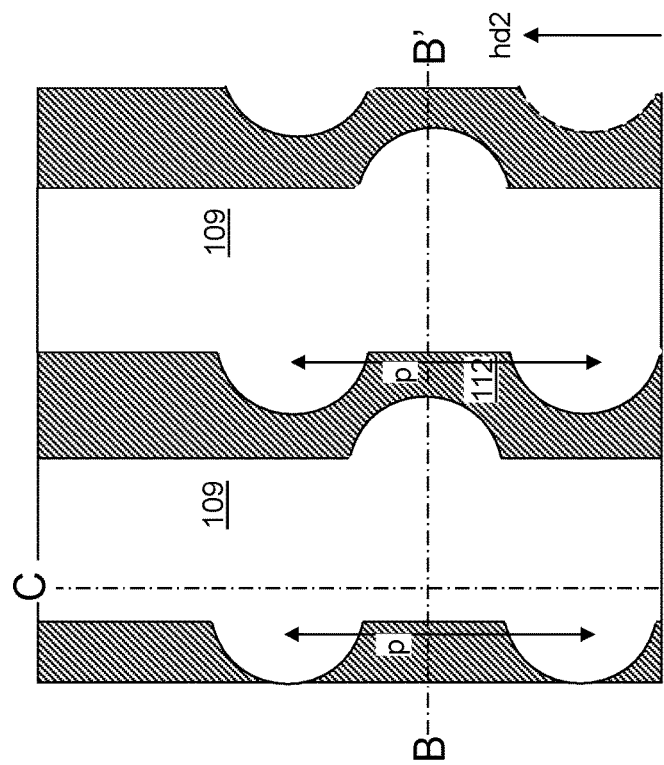
FIG. 24A is a top-down view of a region of the exemplary structure after removal of bottom portions of the memory films.
Figure 24B:
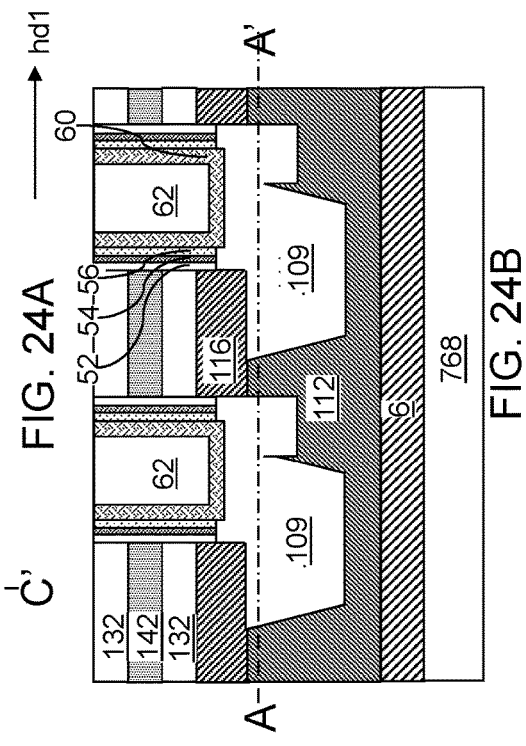
FIG. 24B is a vertical cross-sectional view along the vertical plane B-B' of FIG. 20A.
Figure 24C:
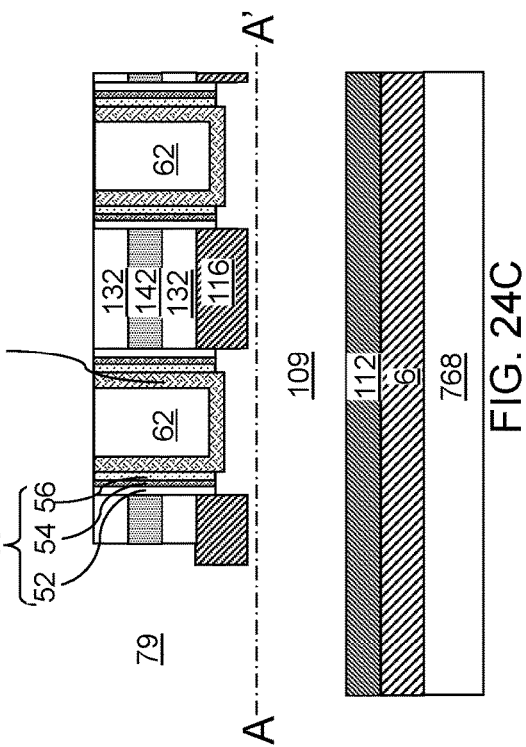
FIG. 24C is a vertical cross-sectional view along the vertical plane C-C' of FIG. 24A.

Referring to FIGS. 24A-24C, a sequence of additional isotropic etch processes can be performed to remove bottom portions of the various material layers within the memory films 50 from underneath bottom surfaces of the vertical semiconductor channels 60. For example, the sequence of additional isotropic etch processes may comprise an isotropic etch process that etches the material of the blocking dielectric layers 52, an isotropic etch process that etches the material of the charge storage layers 54, and an isotropic etch process that etches the material of the tunneling dielectric layers 56. Generally, the lower portion of each of the memory films 50 can be removed by performing at least one additional isotropic etch process that etches materials of the memory films 50 selective to the vertical semiconductor channels 60. A bottom surface of each of the vertical semiconductor channels 60 can be physically exposed to the source cavities 109.

Figure 25A:
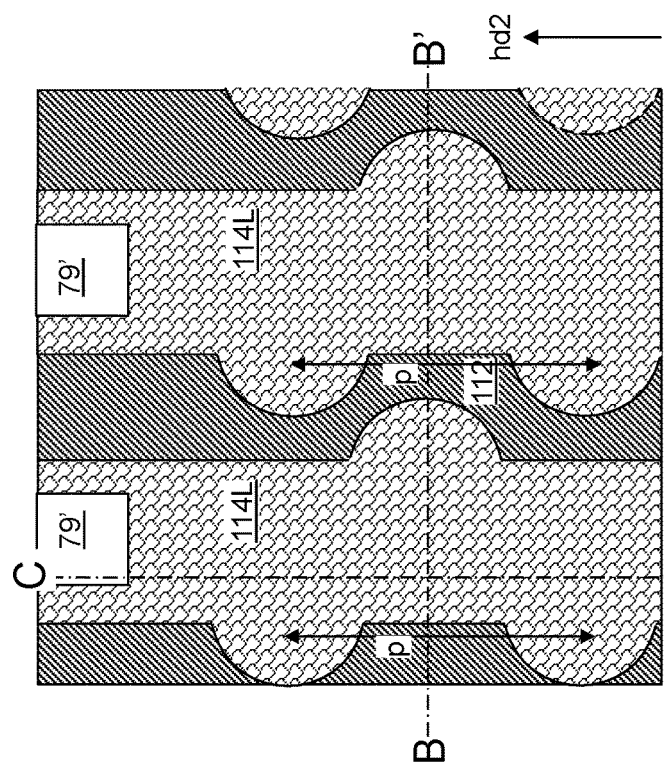
FIG. 25A is a top-down view of a region of the exemplary structure after formation of a doped semiconductor source material layer.
Figure 25B:
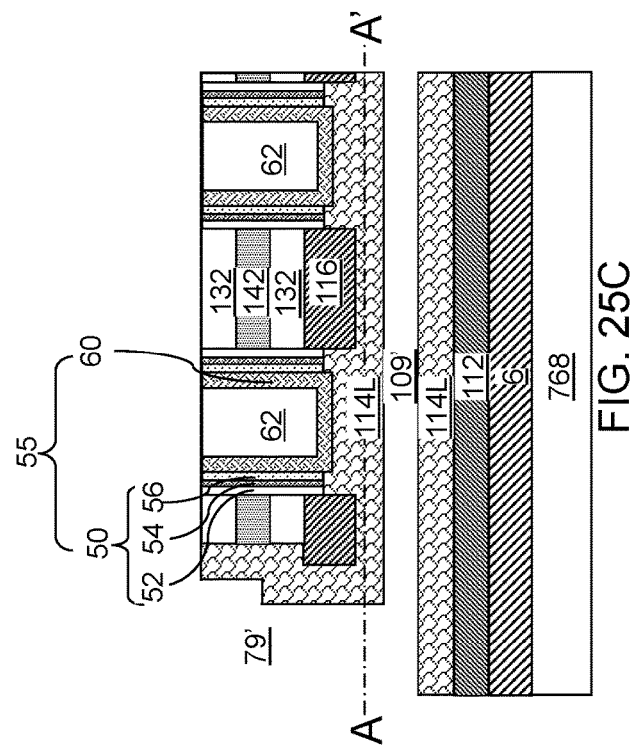
FIG. 25B is a vertical cross-sectional view along the vertical plane B-B' of FIG. 20A.
Figure 25C:
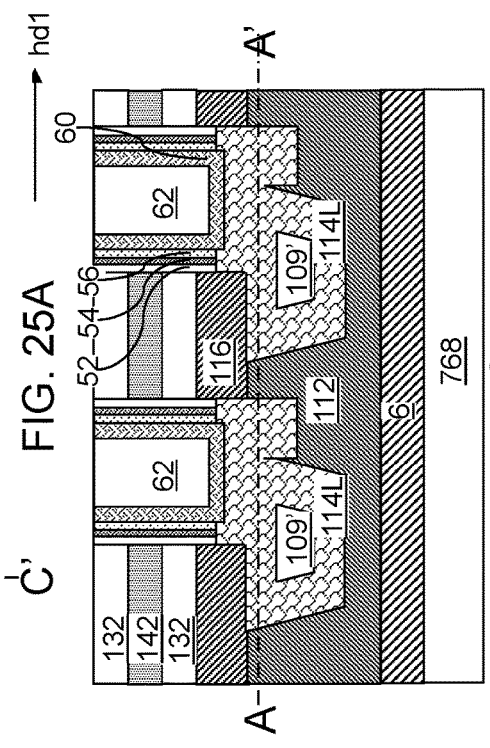
FIG. 25C is a vertical cross-sectional view along the vertical plane C-C' of FIG. 25A.
Figure 26A:
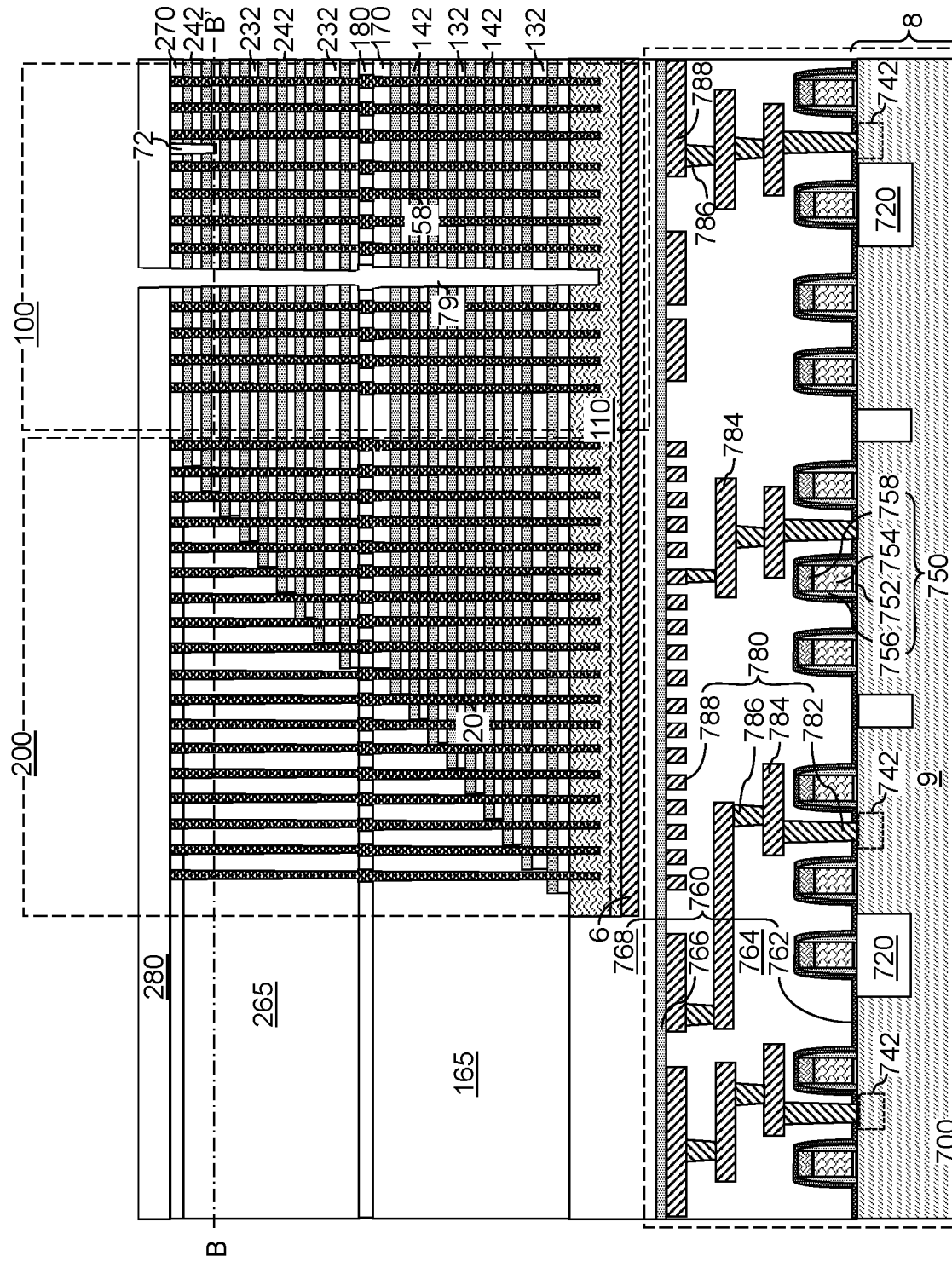
FIG. 26A is a vertical cross-sectional view of the exemplary structure after anisotropically recessing the doped semiconductor source material layer to form doped semiconductor source rails according to an embodiment of the present disclosure.

Referring to FIGS. 25A-25C, a semiconductor material having a doping of the second conductivity type may be deposited on the physically exposed surfaces around each source cavity 109 through the trenches 79. The physically exposed surfaces include bottom surfaces of the vertical semiconductor channels 60, annular bottom surfaces of the memory films 50, cylindrical sidewall segments and a horizontal bottom source of the upper source-level semiconductor layer 116, and sidewalls and recessed horizontal surfaces of the lower source-level semiconductor layer 112.

In one embodiment, the doped semiconductor material of the second conductivity type may be deposited on the physically exposed semiconductor surfaces around the source cavity 109 by a selective semiconductor deposition process. The deposited doped semiconductor material forms a doped semiconductor source material layer 114L that contacts the bottom surfaces of the vertical semiconductor channels 60, the cylindrical sidewall segments and the horizontal bottom source of the upper source-level semiconductor layer 116, and the sidewalls and the recessed horizontal surfaces of the lower source-level semiconductor layer 112. The atomic concentration of the dopants of the second conductivity type in the deposited semiconductor material may be in a range from $1.0 \times 10^{19}/cm^3$ to $2.0 \times 10^{21}/cm^3$, such as from $2.0 \times 10^{20}/cm^3$ to $8.0 \times 10^{20}/cm^3$. Optionally, one or more etch back processes may be used in combination with a plurality of selective or non-selective deposition processes to form the doped semiconductor source material layer 114L.

Generally, the doped semiconductor material can be deposited in the source cavities 119 by introducing a reactant for deposition of the doped semiconductor material through the backside trenches 79 and into the source cavities 109. The duration of the selective semiconductor deposition process may be selected such that a laterally-extending void 109' is present within at least one (e.g., one, a plurality or all) of the volumes of the source cavity 109. A backside cavity 79' including a volume that is not filled with the doped semiconductor source material layer 114L may be present within each backside trench 79.

Referring to FIGS. 26A-26E, an anisotropic etch process can be performed to remove the portions of the doped semiconductor source material layer 114L that overlie the first contact-level dielectric layer 280 and the portions of the doped semiconductor source material layer 114L located within the backside trenches 79. Remaining portions of the doped semiconductor source material layer 114L that remain in a respective one of the source cavities 109 constitutes doped semiconductor source rails 114.

Generally, a doped semiconductor material can be deposited in the source cavities 109 such that the doped semiconductor source rails 114 are formed directly on the bottom surfaces of the vertical semiconductor channels 60. The vertical semiconductor channels 60 comprise a first doped semiconductor material having a doping of a first conductivity type, and the doped semiconductor source rails 114 comprise a second doped semiconductor material having a doping of a second conductivity type. Each of the doped semiconductor source rails 114 contacts bottom surfaces of a respective subset of the vertical semiconductor channels 60 within the memory opening fill structures 58. P-n junctions can be formed at interfaces between the vertical semiconductor channels 60 and the doped semiconductor source rails 114. The doped semiconductor source rails 114 function as a combination of source lines and source regions of vertical NAND strings.

Each doped semiconductor source rail 114 contacts a respective subset of the vertical semiconductor channels 60 within the memory opening fill structures 58. In one embodiment, the respective subset of the vertical semiconductor channels 60 within the memory opening fill structures 58 comprises vertical semiconductor channels 60 within two rows of memory opening fill structures 58. In one embodiment, the memory opening fill structures 58 within each row of memory opening fill structures 58 may be arranged along the second horizontal direction hd2. The two rows of memory opening fill structures 58 can be laterally spaced from each other along the first horizontal direction hd1.

Referring to FIGS. 27A-27D, a dielectric fill material, such as undoped silicate glass, a doped silicate glass, or organosilicate glass can be deposited in the laterally-extending voids 109', which are volumes of the source cavities 109 that are not filled with the doped semiconductor source rails 114. An etch back process can be performed to remove portions of the dielectric fill material from inside the backside trenches 79 and from above the first contact-level dielectric layer 280. Each remaining portion of the deposited dielectric fill material constitutes a source-level dielectric fill bar 107 that laterally extend along the second horizontal direction hd2 and laterally surrounded by a respective doped semiconductor source rail 114.

The sacrificial source-level rails (103, 104, 105) and bottom portions of the memory opening fill structures 58 are replaced with material portions comprising the doped semiconductor source rails 114 and the source-level dielectric fill bars 107. The combination of the lower source-level semiconductor layer 112, the upper source-level semiconductor layer 116, the doped semiconductor source rails 114, and the source-level dielectric fill bars 107 constitutes a source-level structure 110. The source-level structure 110 comprises a plurality of source-level dielectric fill bars 107 laterally extending along the second horizontal direction hd2 and enclosed by a respective one of the doped semiconductor source rails 114. The in-process source-level structure 110' is replaced with the source-level structure 110.

In one embodiment, the vertical semiconductor channels 60 comprise a first doped semiconductor material having a doping of a first conductivity type, and the doped semiconductor source rails 114 comprise a second doped semiconductor material having a doping of a second conductivity type. Each of the doped semiconductor source rails 114 contacts bottom surfaces of a respective subset of the vertical semiconductor channels 60 within the memory opening fill structures 58. In one embodiment, the bottom surfaces of the vertical semiconductor channels 60 comprise horizontal surfaces located between a horizontal plane including a top surface of the upper source-level semiconductor layer 116 and a horizontal plane including a bottom surface of the upper source-level semiconductor layer 116.

Figures 27A, 27D:
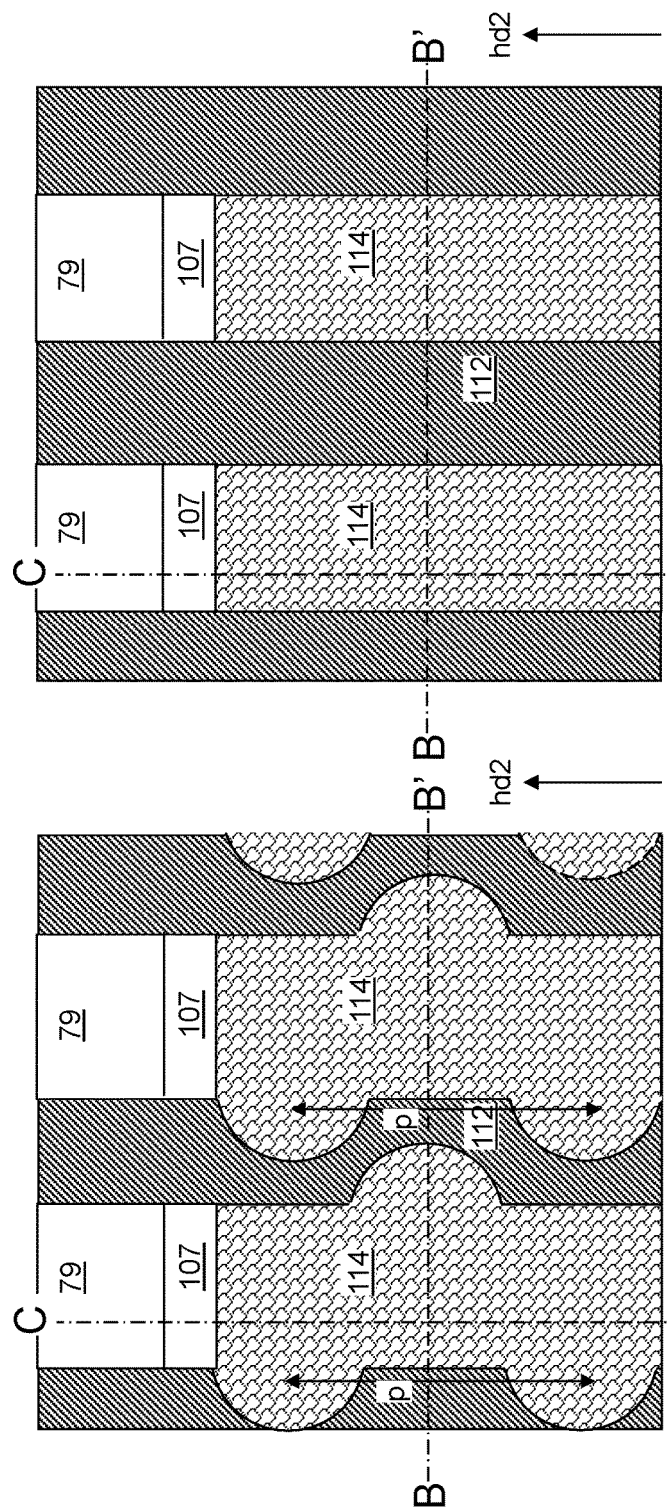
FIG. 27A is a horizontal cross-sectional view of a region of the exemplary structure after formation of a source-level dielectric fill bars.
FIG. 27D is a horizontal cross-sectional view along the horizontal plane D-D' of FIGS. 27B and 27C. The horizontal plane A-A' in FIGS. 27B and 27C is the plane of the horizontal cross-sectional view of FIG. 27A.
Figure 27B:
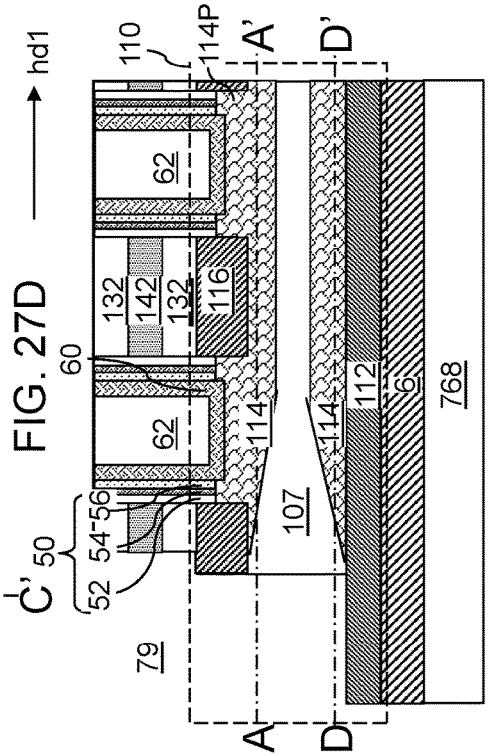
FIG. 27B is a vertical cross-sectional view along the vertical plane B-B' of FIG. 27A.
Figure 27C:
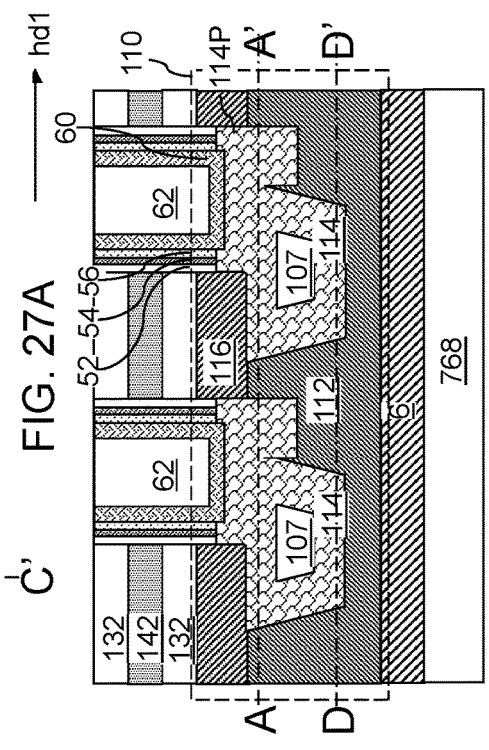
FIG. 27C is a vertical cross-sectional view along the vertical plane C-C' of FIG. 27A.

In one embodiment, an upper portion of each of the doped semiconductor source rails 114 may have a respective horizontal cross-sectional shape including a pair of lengthwise edges having lateral undulations (for example, as illustrated in FIG. 27A), and each of the lengthwise edges have a laterally alternating sequence of straight segments and convex segments that are periodically repeated with a periodicity of the uniform pitch p along the second horizontal direction hd2. In one embodiment, a lower portion of each of the doped semiconductor source rails 114 may have a respective horizontal cross-sectional shape including a pair of straight edges that extend underneath a respective row of memory opening fill structures 58. Each straight edge of the lower portion of each of the doped semiconductor source rails 114 may laterally extend along the second horizontal direction hd2 by a distance that exceeds the uniform pitch p.

In one embodiment, each of the doped semiconductor source rails 114 comprises two rows of upward-protruding pillar portions 114P (located within a volume of a respective memory opening 49), and each of the upward-protruding pillar portions 114P has a respective cylindrical sidewall that coincides with a bottom portion of a cylindrical sidewall of a respective one of the memory openings 49. In one embodiment, the annular bottom surfaces of the memory films 50 may be located above the horizontal plane including the bottom surfaces of the vertical semiconductor channels 60. In one embodiment, each of the upward-protruding pillar portions 114P comprises a contoured top surface that includes a central recessed surface segment in contact with a bottom surface of a respective one of the vertical semiconductor channels 60, a cylindrical sidewall surface segment having a bottom periphery that is adjoined to a periphery of the central recessed surface segment and contacting a bottom portion of a sidewall of the respective one of the vertical semiconductor channels 60, and an annular surface segment having an inner periphery that is adjoined to a top periphery of the cylindrical sidewall surface segment and having an outer periphery that is adjoined to a sidewall of a respective one of the memory openings 49.

In one embodiment, each of the vertical semiconductor channels 60 can be located entirely above a horizontal plane including the top of the lower source-level semiconductor layer 112. In one embodiment, each of the memory opening fill structures 58 comprises a dielectric core 62 that is laterally surrounded by the respective vertical semiconductor channel 60, and an entirety of each of the dielectric cores is located entirely above a horizontal plane including the top of the lower source-level semiconductor layer 112.

The source-level structure 110 can be located over a substrate 8, and can comprise a lower source-level semiconductor layer 112 including elongated grooves 111 in an upper portion thereof, doped semiconductor source rails 114 located within the elongated grooves 111, and an upper source-level semiconductor layer 116 that overlies the lower source-level semiconductor layer 112 and the doped semiconductor source rails 114. The doped semiconductor source rails 114 are laterally spaced apart from each other along the first horizontal direction (e.g., word line direction) hd1, and can laterally extend along the second horizontal direction (e.g., bit line direction) hd2.

Figure 28:
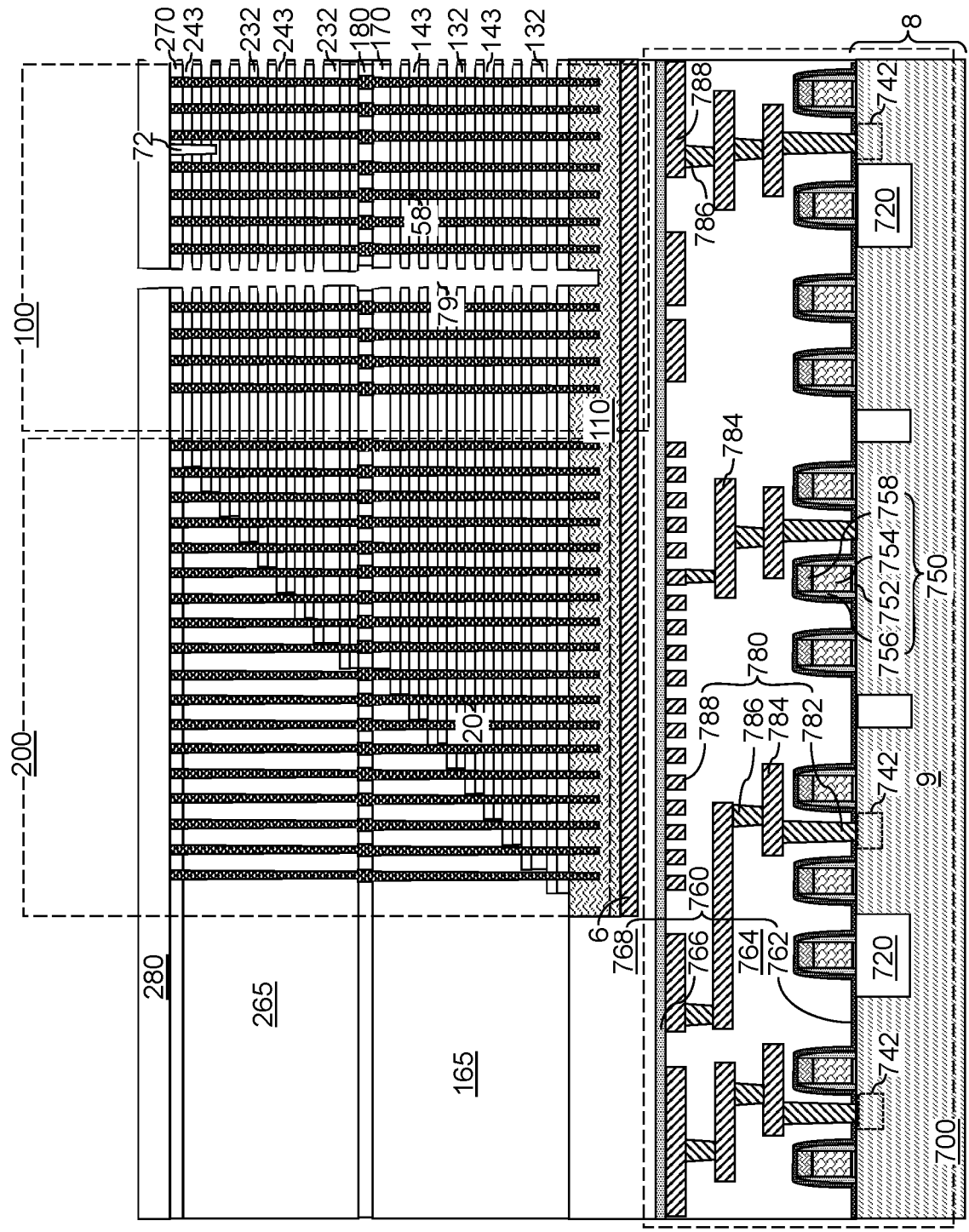
FIG. 28 is a vertical cross-sectional view of the exemplary structure after formation of backside recesses according to an embodiment of the present disclosure.

Referring to FIG. 28, the sacrificial material layers (142, 242) are removed selective to the insulating layers (132, 232), the first and second insulating cap layers (170, 270), the first contact-level dielectric layer 280, the source-level dielectric fill bars 107, the lower source-level semiconductor layer 112, the upper source-level semiconductor layer 116, and the outermost layer of each memory film 50. For example, an etchant that selectively etches the materials of the sacrificial material layers (142, 242) with respect to the materials of the insulating layers (132, 232), the first and second insulating cap layers (170, 270), the first contact-level dielectric layer 280, the source-level dielectric fill bars 107, the lower source-level semiconductor layer 112, the upper source-level semiconductor layer 116, and the outermost layer of each memory film 50 may be introduced into the backside trenches 79, for example, using an isotropic etch process. In one embodiment, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 29:
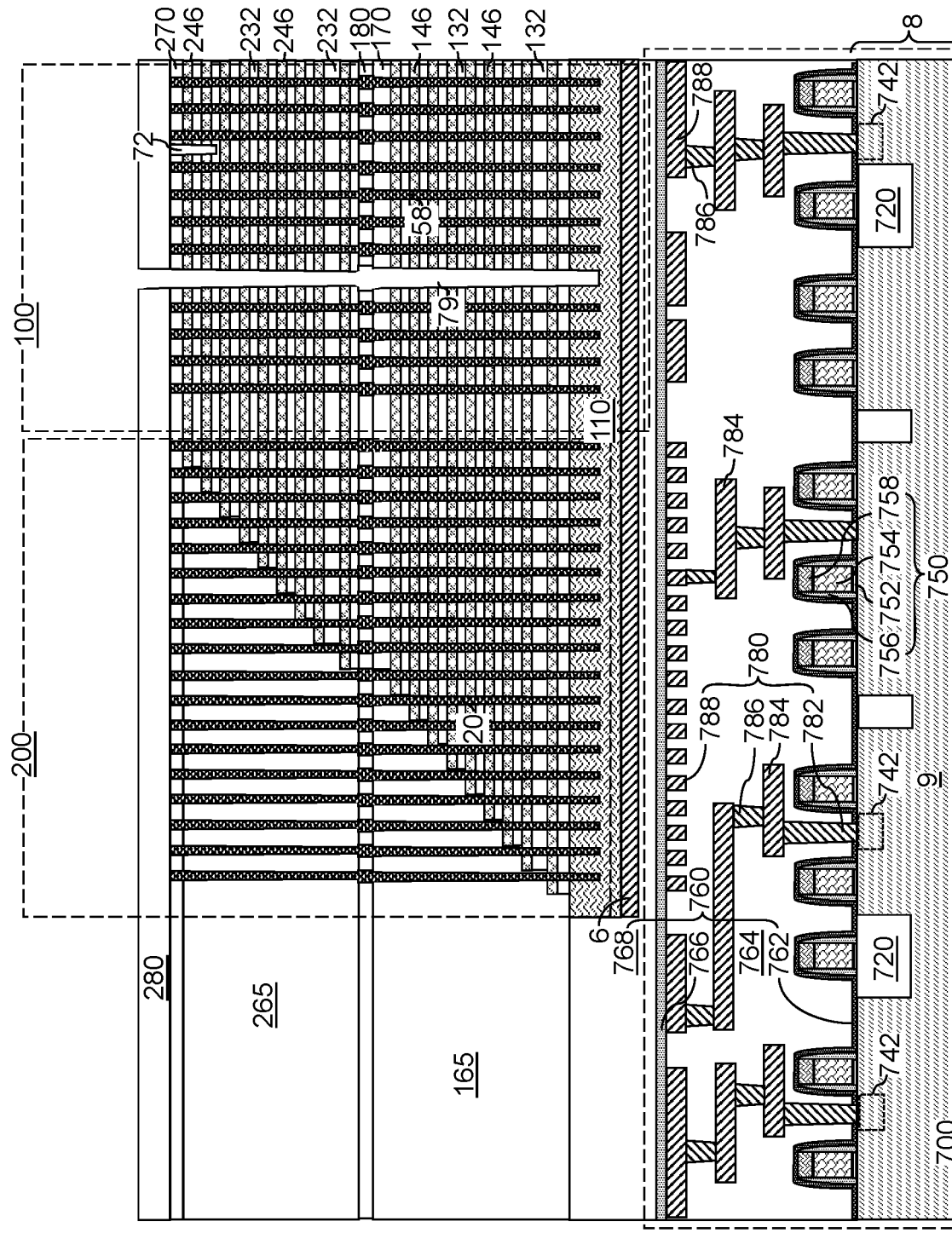
FIG. 29 is a vertical cross-sectional view of the exemplary structure after formation of electrically conductive layers according to an embodiment of the present disclosure.
Figure 30A:
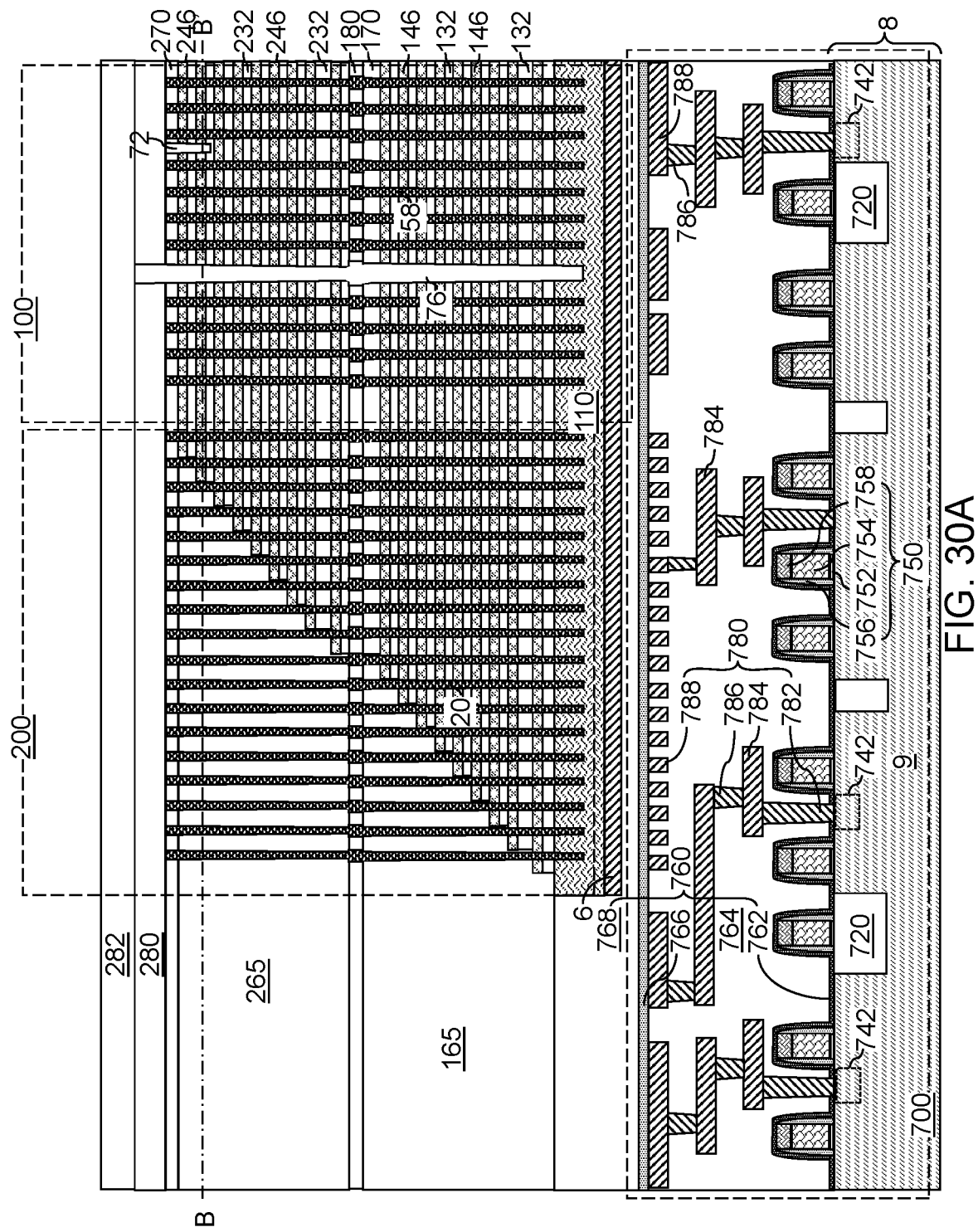
FIG. 30A is a vertical cross-sectional view of the exemplary structure after formation of backside fill structures in the backside openings according to an embodiment of the present disclosure.
Figure 30C:
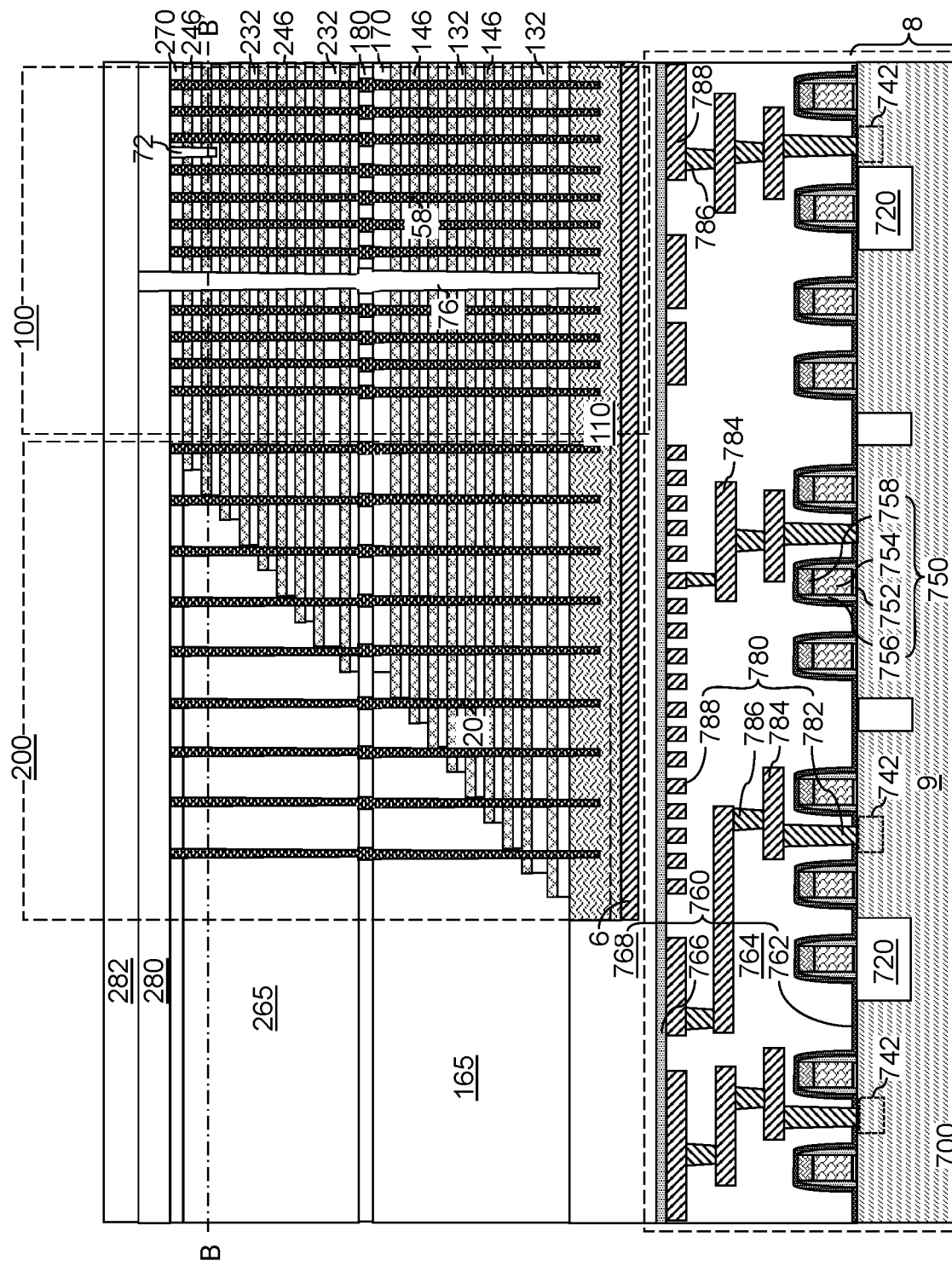
FIG. 30C is a vertical cross-sectional view of the exemplary structure along the vertical plane C-C' of FIG. 30B.
Figure 30D:
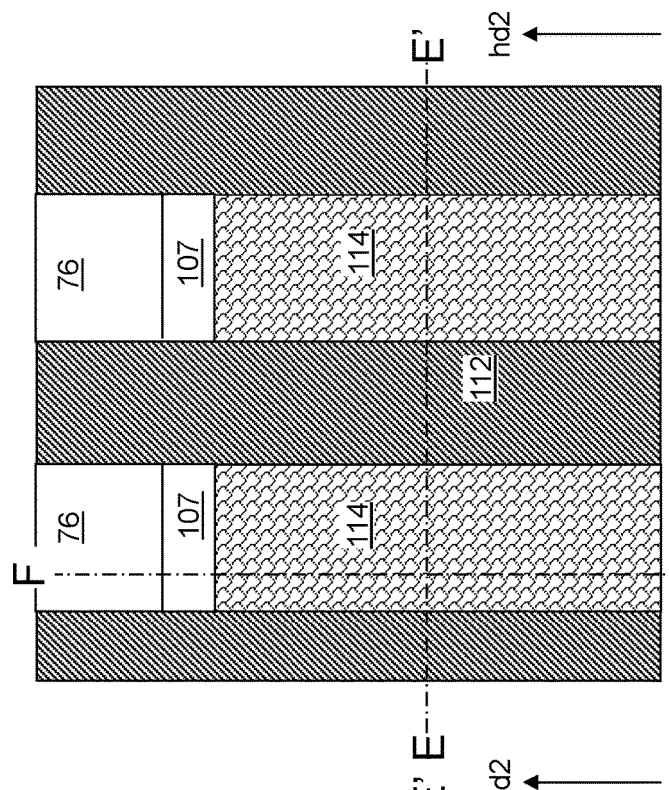
FIG. 30D is a horizontal cross-sectional view of a region of the exemplary structure at the processing steps of FIGS. 30A, 30B, and 30C.
Figure 30G:
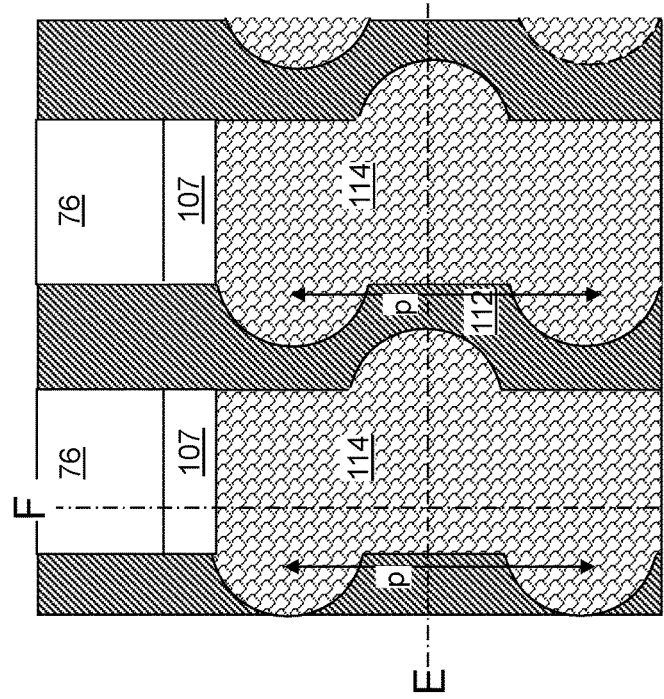
FIG. 30G is a horizontal cross-sectional view along the horizontal plane G-G' of FIGS. 30E and 30F. The horizontal plane D-D' in FIGS. 30E and 30F is the plane of the horizontal cross-sectional view of FIG. 30D.
Figure 30E:
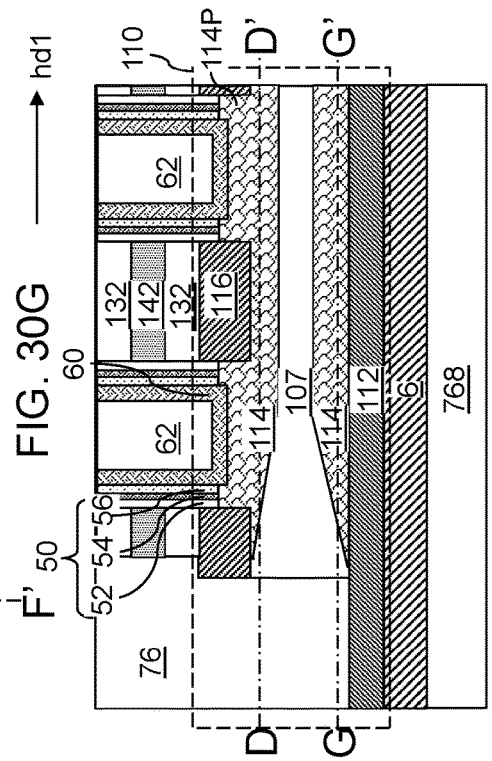
FIG. 30E is a vertical cross-sectional view along the vertical plane E-E' of FIG. 30D.
Figure 30F:
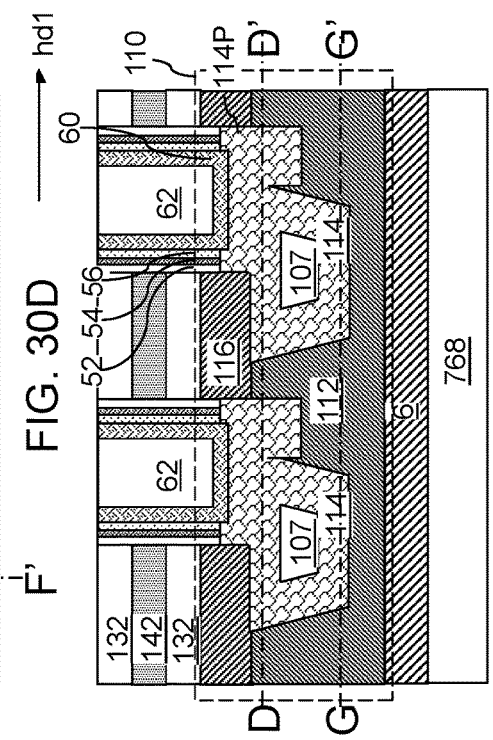
FIG. 30F is a vertical cross-sectional view along the vertical plane F-F' of FIG. 30D.

Referring to FIG. 29, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 30A-30G, a dielectric fill material may be conformally deposited in the backside trenches 79 and over the first contact-level dielectric layer 280 by a conformal deposition process. The dielectric fill material may include, for example, silicon oxide. Each vertically-extending portion of the dielectric fill material that fills a backside trench 79 comprises a backside trench fill structure 76. The horizontally-extending portion of the dielectric fill material that overlies the first contact-level dielectric layer 280 constitutes a second contact-level dielectric layer 282. The second contact-level dielectric layer 282 may have a thickness in a range from 100 nm to 600 nm, although lesser and greater thicknesses may also be used.

Figure 31A:
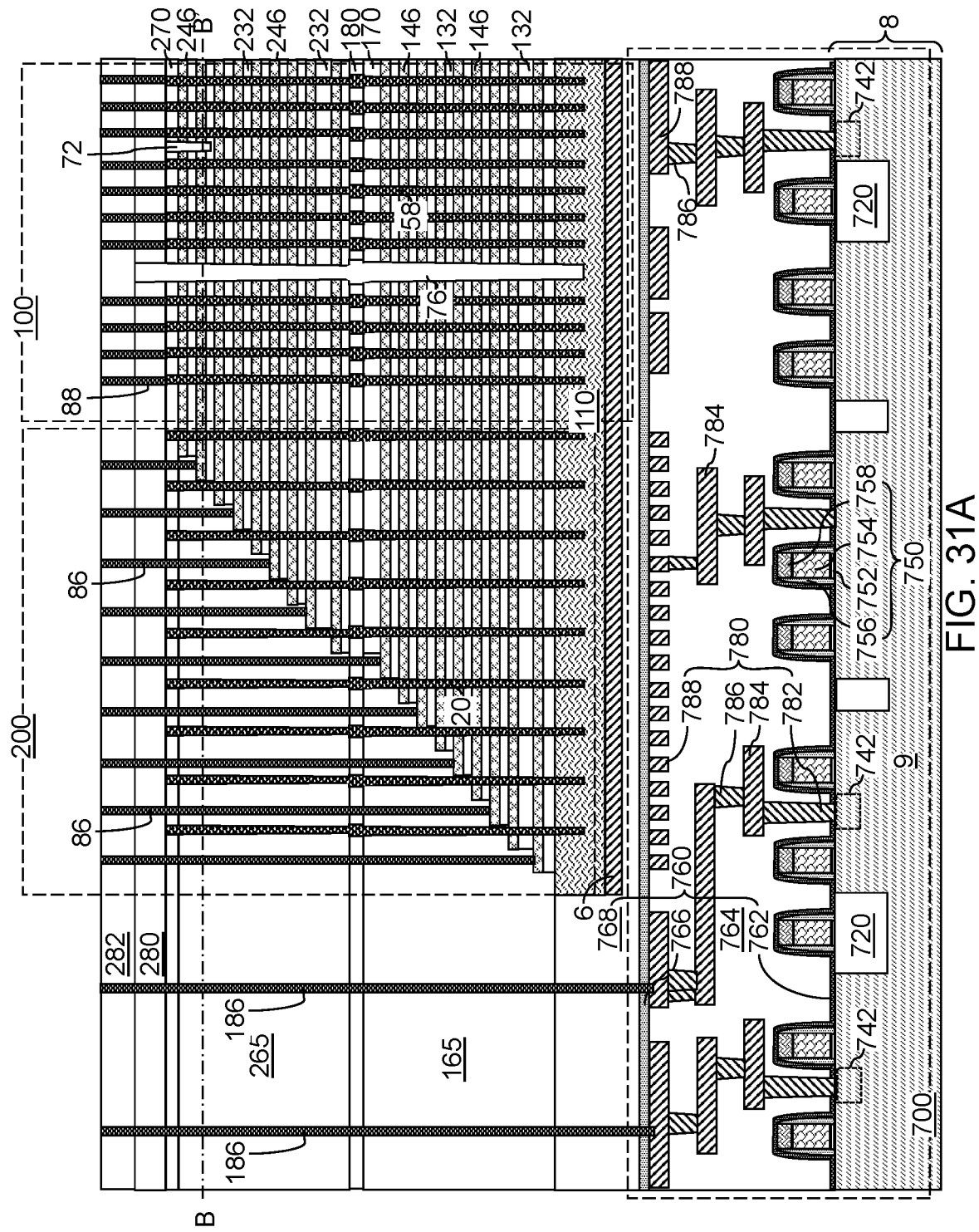
FIG. 31A is a vertical cross-sectional view of the exemplary structure after formation of a second contact-level dielectric layer and various contact via structures according to an embodiment of the present disclosure.
Figure 31B:
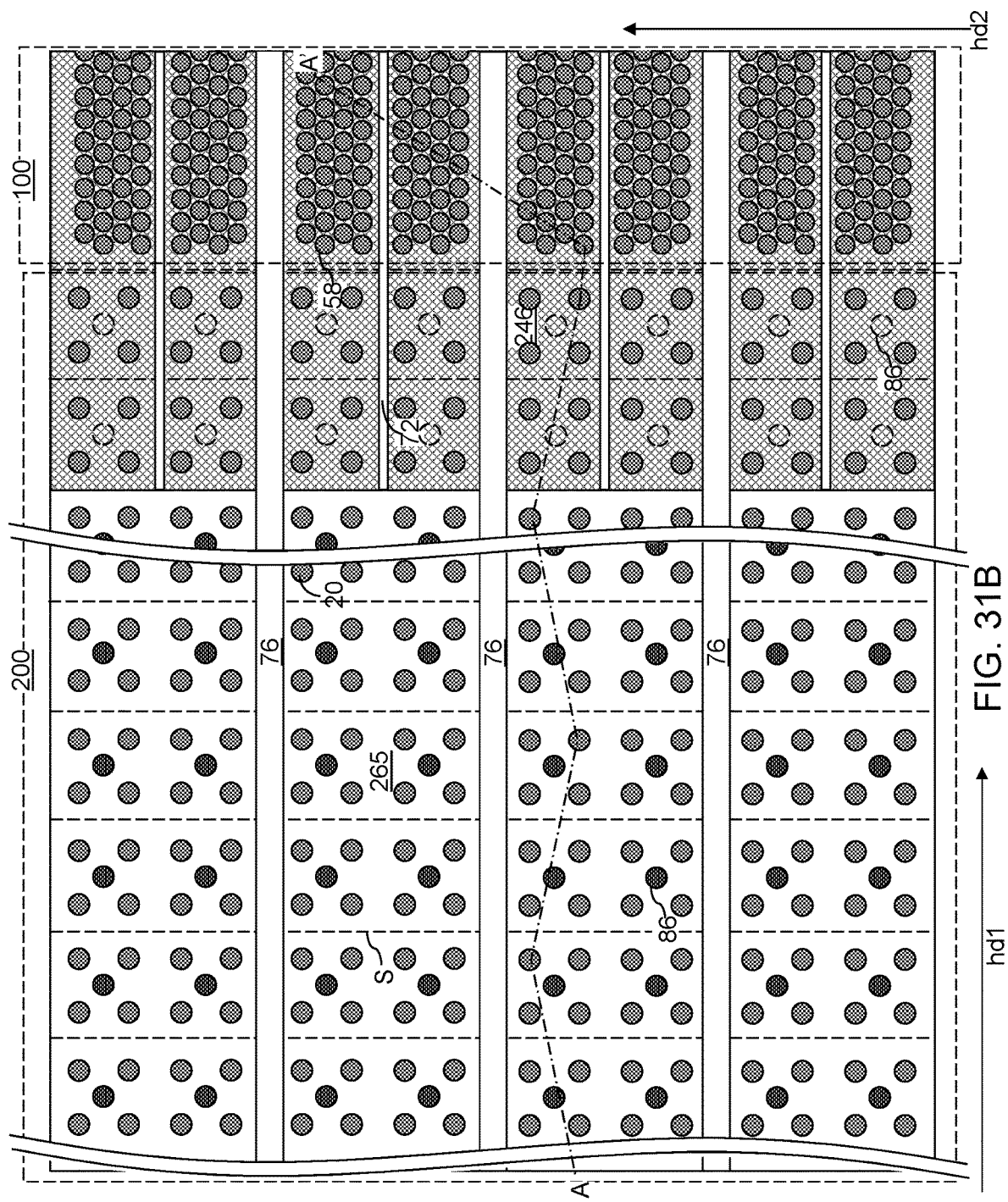
FIG. 31B is a horizontal cross-sectional view of the exemplary structure along the vertical plane B-B' of FIG. 31A. The hinged vertical plane A-A' corresponds to the plane of the vertical cross-sectional view of FIG. 31A.

Referring to FIGS. 31A and 31B, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Peripheral-region via cavities may be formed through the second and first contact-level dielectric layers (282, 280), the second and first retro-stepped dielectric material portions (265, 165), and the at least one second dielectric layer 768 to top surfaces of a first subset of the lower-level metal interconnect structure 780 in the peripheral device region 400. Through-memory-region via cavities may be formed through the interconnection region dielectric fill material portions 584 and the at least one second dielectric layer 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

Figure 32:
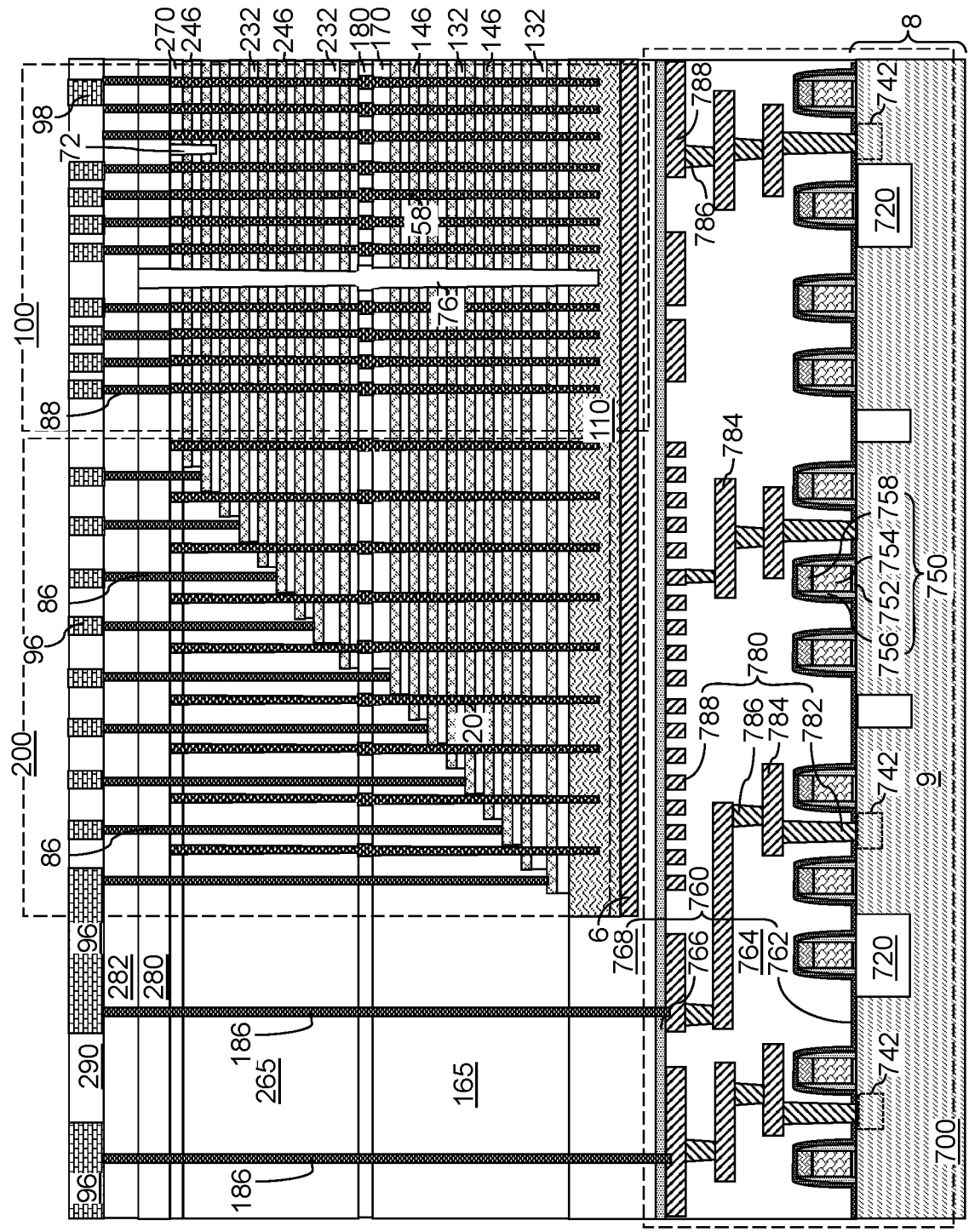
FIG. 32 is a vertical cross-sectional view of the exemplary structure after formation of through-memory-level via structures and upper metal line structures according to an embodiment of the present disclosure.

Referring to FIG. 32, at least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488. The bit lines 98 extend along the second horizontal direction (i.e., bit line direction) hd2 and are spaced apart along the first horizontal direct (i.e., word line direction) hd1.

Figure 33:
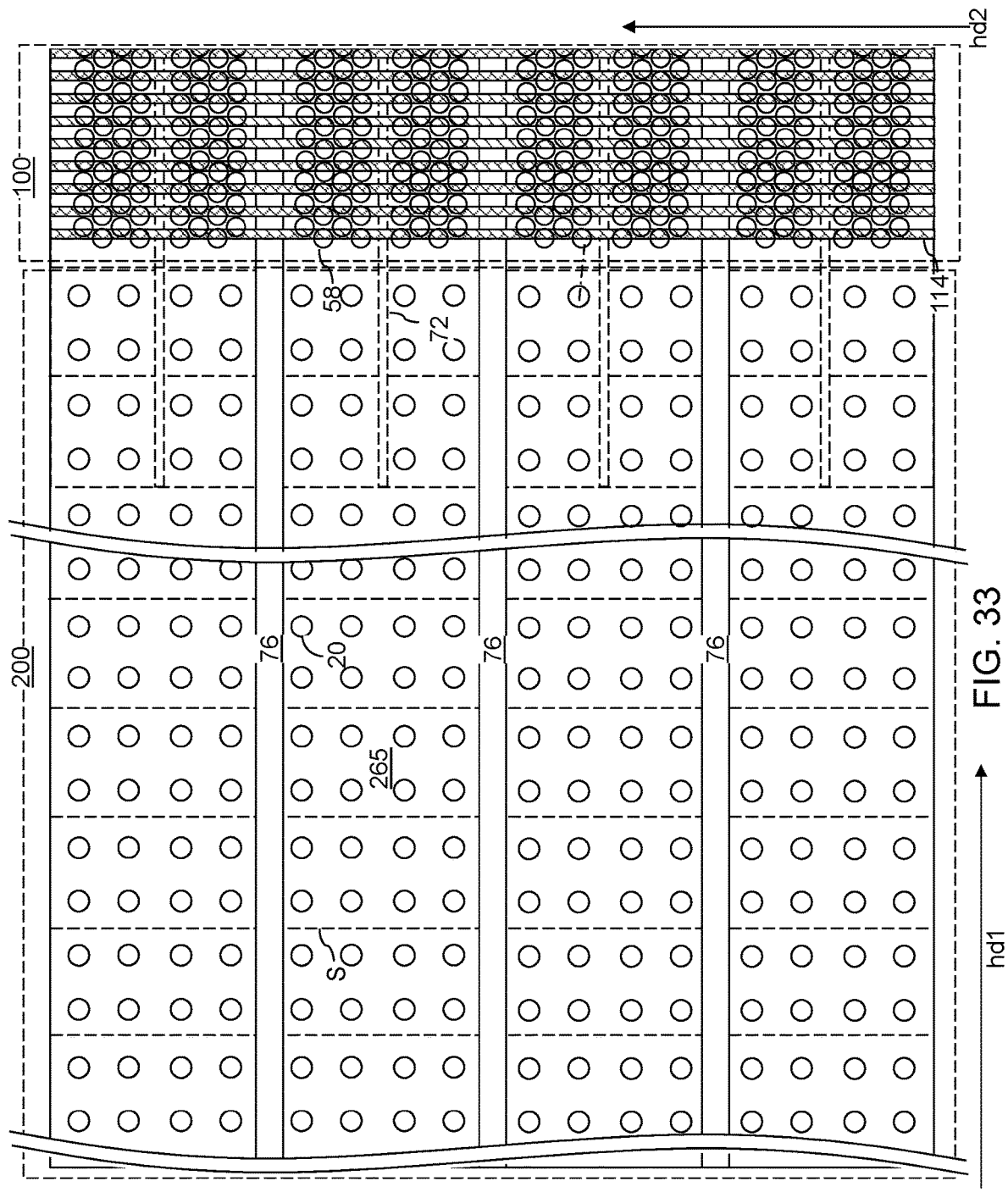
FIG. 33 is a schematic see-through plan view of the exemplary structure illustrating the configuration of the doped semiconductor source rails according to an embodiment of the present disclosure.

FIG. 33 schematically illustrates line shaped backside trench fill structures 76 within the exemplary structure illustrated in FIG. 32.

Figure 34:
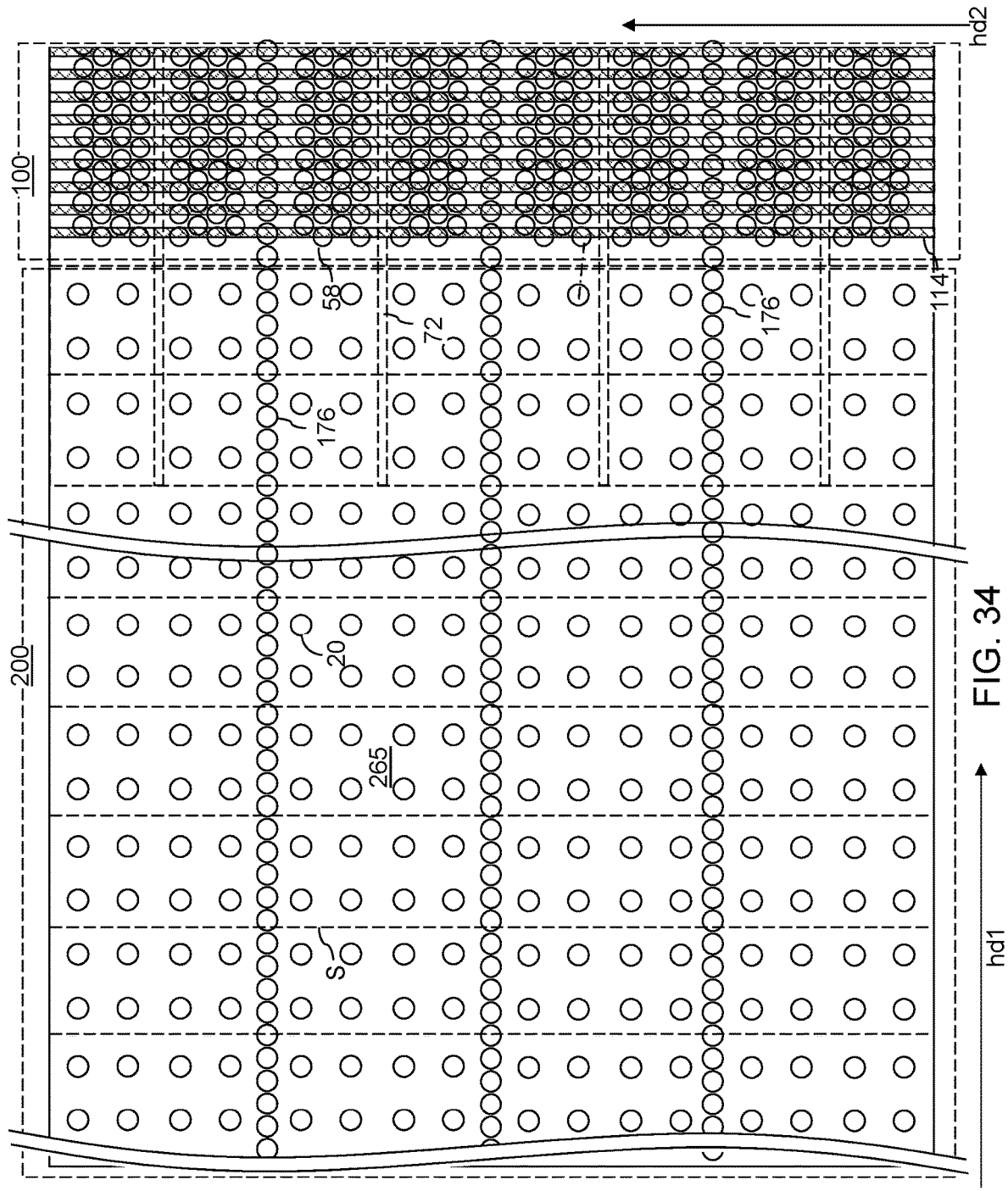
FIG. 34 is a schematic see-through plan view of a first alternative configuration of the exemplary structure according to a first alternative embodiment of the present disclosure.

In alternative embodiments, the shapes of the backside trenches 79 and the backside trench fill structures 76 may be modified as needed. For example, each of the line-shaped backside trenches 79 described above may be replaced with a respective row of discrete backside openings, such as cylindrical openings, that are arranged in rows along the first horizontal direction hd1. FIG. 34 schematically illustrates the shapes of dielectric backside opening structures 176 that are formed as rows of discrete cylindrical dielectric material portions that are formed within rows of cylindrical backside openings. The layout of the doped semiconductor source rails 114 is juxtaposed under the layout of the respective backside fill structures 76 and 176 in FIGS. 33 and 34.

Figure 35:
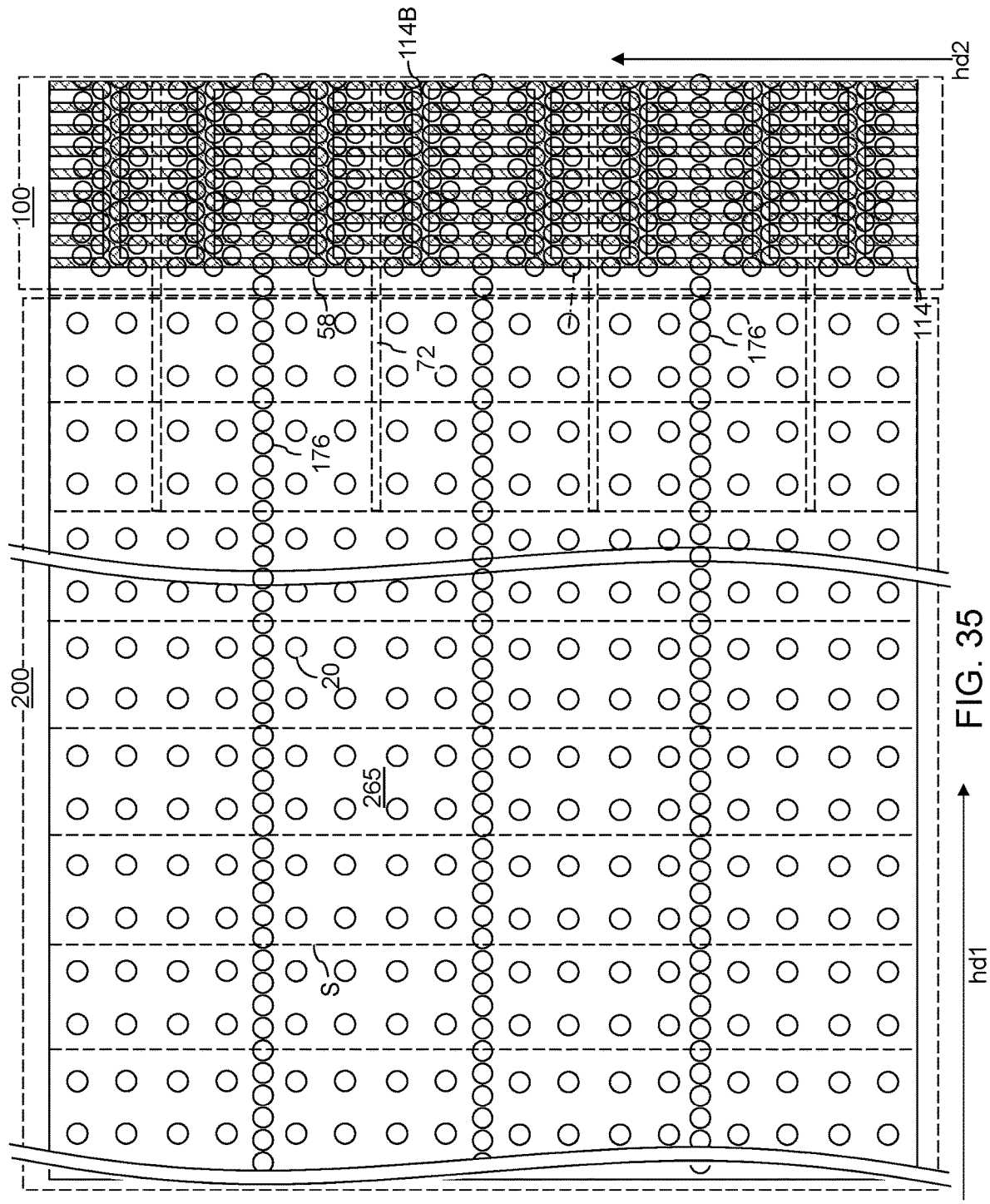
FIG. 35 is a schematic see-through plan view of a second alternative configuration of the exemplary structure according to a second alternative embodiment of the present disclosure.
Figure 36:
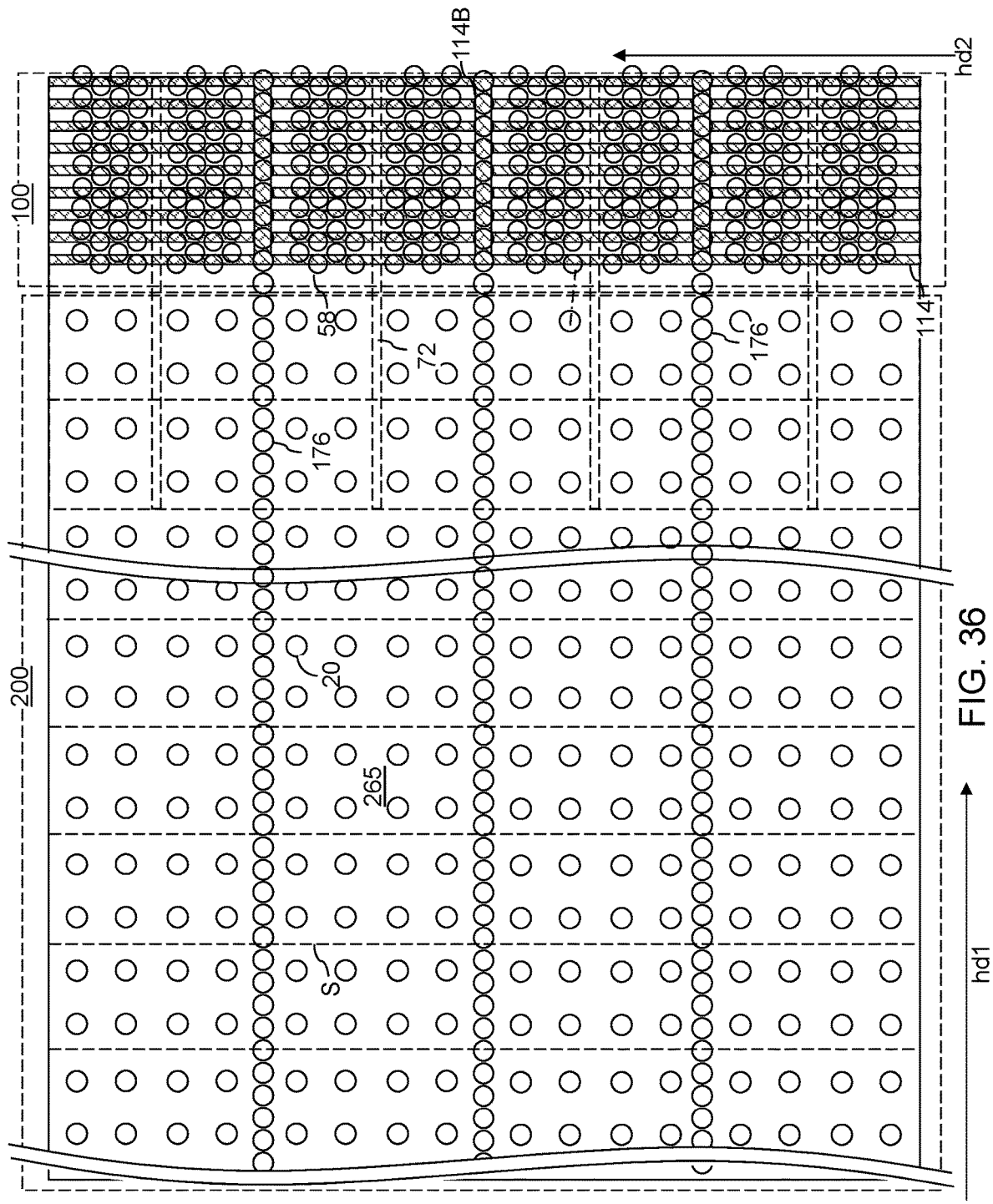
FIG. 36 is a schematic see-through plan view of a third alternative configuration of the exemplary structure according to a third alternative embodiment of the present disclosure.

Further, the doped semiconductor source rails 114 may be modified to add "bridge semiconductor source rails" 114B that laterally extend along the first horizontal direction hd1 that is perpendicular to the lengthwise directions of the doped semiconductor source rails 114 as described above. FIGS. 35 and 36 illustrate examples of such configurations. The bridge semiconductor source rails 114B are formed concurrently with formation of the doped semiconductor source rails 114 by altering the layout of the trenches at the processing steps of FIGS. 2A-2C to add additional trenches that laterally extend along the first horizontal direction hd1. The bridge semiconductor source rails 114B are formed in the additional trenches concurrently with formation of the doped semiconductor source rails 114. In the configuration illustrated in FIG. 35, the bridge semiconductor source rails 114B may be formed in areas that do not overlap with the backside fill structures (76, 176) in a plan view. In the configuration illustrated in FIG. 36, the bridge semiconductor source rails 114B may be formed in areas that overlap with the backside fill structures (76, 176) in the plan view.

In one embodiment, the three-dimensional memory device comprises a three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of three-dimensional NAND strings comprises a plurality of charge storage elements (comprising portions of the memory films 50), each charge storage element located adjacent to a respective one of the plurality of semiconductor channels 60.

Referring to all drawings and according to various embodiments of the present disclosure, a three-dimensional memory device is provided, which comprises: a source-level structure 110 located over a substrate 8 and comprising a lower source-level semiconductor layer 112 including elongated grooves 111 in an upper portion thereof, doped semiconductor source rails 114 located within the elongated grooves 111, and an upper source-level semiconductor layer 116 that overlies the lower source-level semiconductor layer 112 and the doped semiconductor source rails 114, wherein the doped semiconductor source rails 114 are laterally spaced apart from each other along a first horizontal direction hd1 and laterally extend along a second horizontal direction hd2; an alternating stack {(132, 146), (232, 246)} of insulating layers (132, 232) and electrically conductive layers (146, 246) located over the source-level structure 110; memory openings 49 vertically extending through the alternating stack {(132, 146), (232, 246)}; and memory opening fill structures 58 located in the memory openings 49 and comprising a respective vertical stack of memory elements and a respective vertical semiconductor channel 60 that contacts a respective one of the doped semiconductor source rails 114.

In one embodiment, each of the doped semiconductor source rails 114 contacts bottom surfaces of a respective subset of the vertical semiconductor channels 60 within the memory opening fill structures 58. In one embodiment, the respective subset of the vertical semiconductor channels 60 within the memory opening fill structures 58 comprises vertical semiconductor channels 60 within two rows of memory opening fill structures 58; memory opening fill structures 58 within each row of memory opening fill structures 58 are arranged along the second horizontal direction hd2; and the two rows of memory opening fill structures 58 are laterally spaced from each other along the first horizontal direction hd1. In one embodiment, the bottom surfaces of the respective subset of the vertical semiconductor channels 60 comprise horizontal surfaces located between a horizontal plane including a top surface of the upper source-level semiconductor layer 116 and a horizontal plane including a bottom surface of the upper source-level semiconductor layer 116.

In one embodiment, the memory opening fill structures 58 are arranged in multiple rows of memory opening fill structures 58; memory opening fill structures 58 within each row of memory opening fill structures 58 are arranged with a uniform pitch p along the second horizontal direction hd2; and the multiple rows are laterally spaced from each other along the first horizontal direction hd1. In one embodiment, an upper portion of each of the doped semiconductor source rails 114 has a respective horizontal cross-sectional shape including a pair of lengthwise edges having lateral undulations; and each of the lengthwise edges have a laterally alternating sequence of straight segments and convex segments that are periodically repeated with a periodicity of the uniform pitch p along the second horizontal direction hd2. In one embodiment, a lower portion of each of the doped semiconductor source rails 114 has a respective horizontal cross-sectional shape including a pair of straight edges that extend underneath a respective row of memory opening fill structures 58.

In one embodiment, each of the doped semiconductor source rails 114 comprises two rows of upward-protruding pillar portions; and each of the upward-protruding pillar portions has a respective cylindrical sidewall that coincides with a bottom portion of a cylindrical sidewall of a respective one of the memory openings 49. In one embodiment, each of the upward-protruding pillar portions comprises a contoured top surface that includes: a central recessed surface segment in contact with a bottom surface of a respective one of the vertical semiconductor channels 60; a cylindrical sidewall surface segment having a bottom periphery that is adjoined to a periphery of the central recessed surface segment and contacting a bottom portion of a sidewall of the respective one of the vertical semiconductor channels 60; and an annular surface segment having an inner periphery that is adjoined to a top periphery of the cylindrical sidewall surface segment and having an outer periphery that is adjoined to a sidewall of a respective one of the memory openings 49.

In one embodiment, each of the memory opening fill structures 58 comprises a dielectric core that is laterally surrounded by the respective vertical semiconductor channel 60; and an entirety of each of the dielectric cores is located entirely above a horizontal plane including a bottom surface of the upper source-level semiconductor layer 116.

In one embodiment, a plurality of bit lines 98 extend in the second horizontal direction hd2 and which electrically contact respective vertical semiconductor channels 60 through the drain regions 63 and the contact via structures 88. In one embodiment, the source-level structure 110 comprises a plurality of source-level dielectric fill bars 107 laterally extending along the second horizontal direction hd2 and enclosed by a respective one of the doped semiconductor source rails 114. In some embodiments shown in FIGS. 34-36, the three-dimensional memory device comprises rows of discrete dielectric backside fill structures 176 extending along the first horizontal direction hd1 and connected to the plurality of source-level dielectric fill bars 107. Each dielectric backside fill structures 176 contacts sidewalls of each of the insulating layers (132, 232) and each of the electrically conductive layers (146, 246) within the alternating stack {(132, 146), (232, 246)}.

In one embodiment, the three-dimensional memory device comprises: field effect transistors located on the substrate 8; and dielectric material layers (762, 764, 768) overlying the field effect transistors and embedding metal interconnect structures 780 that are electrically connected to the field effect transistors, wherein the electrically conductive layers (146, 246) are electrically connected to a subset of the field effect transistors through a subset of the metal interconnect structures 780.

The various embodiments of the present disclosure can be employed to provide self-aligned source lines that contact bottoms of vertical semiconductor channels in a three-dimensional memory device. The process may be self-aligned, use a sacrificial material as an etch stop, reduce the change of pattern collapse and use less process steps. The process reduces undesirable widening of the polysilicon layers 112, 116 during the various etching steps. The top surfaces of the staircase region 200 and the memory array region 100 may be co-planar during processing, which improves the accuracy of photolithography steps. The sequence of etching steps also reduces undesirable breakthrough etching through the support pillars 20.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   a source-level structure located over a substrate and comprising a lower source-level semiconductor layer including elongated grooves in an upper portion thereof, doped semiconductor source rails located within the elongated grooves, an upper source-level semiconductor layer that overlies the lower source-level semiconductor layer and the doped semiconductor source rails, wherein the doped semiconductor source rails are laterally spaced apart from each other along a first horizontal direction and laterally extend along a second horizontal direction, and a plurality of source-level dielectric fill bars laterally extending along the second horizontal direction and enclosed by a respective one of the doped semiconductor source rails;
   an alternating stack of insulating layers and electrically conductive layers located over the source-level structure;
   memory openings vertically extending through the alternating stack; and
   memory opening fill structures located in the memory openings and comprising a respective vertical stack of memory elements and a respective vertical semiconductor channel that contacts a respective one of the doped semiconductor source rails;
   a plurality of bit lines which extend in the second horizontal direction and which electrically contact respective vertical semiconductor channels; and
   a rows of discrete dielectric backside fill structures extending along the first horizontal direction and connected to the plurality of source-level dielectric fill bars, wherein each of the dielectric backside fill structures contacts sidewalls of each of the insulating layers and each of the electrically conductive layers within the alternating stack.

2. The three-dimensional memory device of claim 1, wherein each of the doped semiconductor source rails contacts bottom surfaces of a respective subset of the vertical semiconductor channels within the memory opening fill structures.

3. The three-dimensional memory device of claim 2, wherein:
   the respective subset of the vertical semiconductor channels within the memory opening fill structures comprises vertical semiconductor channels within two rows of memory opening fill structures;
   memory opening fill structures within each row of memory opening fill structures are arranged along the second horizontal direction; and
   the two rows of memory opening fill structures are laterally spaced from each other along the first horizontal direction.

4. The three-dimensional memory device of claim 2, wherein the bottom surfaces of the respective subset of the vertical semiconductor channels comprise horizontal surfaces located between a horizontal plane including a top surface of the upper source-level semiconductor layer and a horizontal plane including a bottom surface of the upper source-level semiconductor layer.

5. The three-dimensional memory device of claim 1, wherein:
   the memory opening fill structures are arranged in multiple rows of memory opening fill structures;
   memory opening fill structures within each row of memory opening fill structures are arranged with a uniform pitch along the second horizontal direction; and
   the multiple rows are laterally spaced apart from each other along the first horizontal direction.

6. The three-dimensional memory device of claim 5, wherein:
   an upper portion of each of the doped semiconductor source rails has a respective horizontal cross-sectional shape including a pair of lengthwise edges having lateral undulations; and
   each of the lengthwise edges have a laterally alternating sequence of straight segments and convex segments that are periodically repeated with a periodicity of the uniform pitch along the second horizontal direction.

7. The three-dimensional memory device of claim 5, wherein a lower portion of each of the doped semiconductor source rails has a respective horizontal cross-sectional shape including a pair of straight edges that extend underneath a respective row of memory opening fill structures.

8. The three-dimensional memory device of claim 1, wherein:
   each of the doped semiconductor source rails comprises two rows of upward-protruding pillar portions; and
   each of the upward-protruding pillar portions has a respective cylindrical sidewall that coincides with a bottom portion of a cylindrical sidewall of a respective one of the memory openings.

9. The three-dimensional memory device of claim 8, wherein each of the upward-protruding pillar portions comprises a contoured top surface that includes:
   a central recessed surface segment in contact with a bottom surface of a respective one of the vertical semiconductor channels;

a cylindrical sidewall surface segment having a bottom periphery that is adjoined to a periphery of the central recessed surface segment and contacting a bottom portion of a sidewall of the respective one of the vertical semiconductor channels; and an annular surface segment having an inner periphery that is adjoined to a top periphery of the cylindrical sidewall surface segment and having an outer periphery that is adjoined to a sidewall of a respective one of the memory openings.

10. The three-dimensional memory device of claim 1, wherein:

each of the memory opening fill structures comprises a dielectric core that is laterally surrounded by the respective vertical semiconductor channel; and an entirety of each of the dielectric cores is located entirely above a horizontal plane including a bottom surface of the upper source-level semiconductor layer.

11. The three-dimensional memory device of claim 1, further comprising:

field effect transistors located on the substrate; and dielectric material layers overlying the field effect transistors and embedding metal interconnect structures that are electrically connected to the field effect transistors, wherein the electrically conductive layers are electrically connected to a subset of the field effect transistors through a subset of the metal interconnect structures.

\* \* \* \* \*